US011661526B2

(12) United States Patent
Pousthomis et al.

(10) Patent No.: US 11,661,526 B2
(45) Date of Patent: May 30, 2023

(54) METHOD FOR OBTAINING ENCAPSULATED NANOPARTICLES

(71) Applicant: NEXDOT, Romainville (FR)

(72) Inventors: Marc Pousthomis, Deuil-la-Barre (FR); Michele D'Amico, Romainville (FR); Alexis Kuntzmann, Paris (FR); Yu-Pu Lin, Versailles (FR)

(73) Assignee: NEXDOT, Romainville (FR)

( * ) Notice: Subject to any disclaimer, the term of this patent is extended or adjusted under 35 U.S.C. 154(b) by 581 days.

(21) Appl. No.: 16/618,584

(22) PCT Filed: Jun. 1, 2018

(86) PCT No.: PCT/EP2018/064439
§ 371 (c)(1),
(2) Date: Dec. 2, 2019

(87) PCT Pub. No.: WO2018/220165
PCT Pub. Date: Dec. 6, 2018

(65) Prior Publication Data

US 2020/0131435 A1 Apr. 30, 2020

Related U.S. Application Data

(60) Provisional application No. 62/642,370, filed on Mar. 13, 2018, provisional application No. 62/710,298,
(Continued)

(30) Foreign Application Priority Data

| | | |
|---|---|---|
| Sep. 22, 2017 | (EP) | 17306241 |
| Sep. 22, 2017 | (EP) | 17306249 |
| Dec. 11, 2017 | (EP) | 17206479 |

(51) Int. Cl.
*C09D 11/50* (2014.01)
*C09K 11/88* (2006.01)
(Continued)

(52) U.S. Cl.
CPC ................. *C09D 11/50* (2013.01); *B01J 2/02* (2013.01); *B01J 2/04* (2013.01); *B01J 2/06* (2013.01);
(Continued)

(58) Field of Classification Search
CPC ......... B01J 2/02; B01J 2/04; B01J 2/06; B01J 13/043; C09K 11/025; C01P 2204/80; C01P 2204/90; C01P 2204/84
See application file for complete search history.

(56) References Cited

U.S. PATENT DOCUMENTS 5,160,664 A * 11/1992 Liu .......................... C09K 3/30 261/78.2
5,944,226 A * 8/1999 Schiltz ............. B05C 17/00559 222/326
(Continued)

FOREIGN PATENT DOCUMENTS

EP 2610212 A1 7/2013
KR 10-2013-0043442 * 4/2013
(Continued)

OTHER PUBLICATIONS

Kang et al, "Preparation of zinc oxide-dispersed silver particles by spray pyrolysis of colloidal solution", Mateials Letters 40 (1999), Aug. 1999, pp. 129-133.*
(Continued)

*Primary Examiner* — C Melissa Koslow
(74) *Attorney, Agent, or Firm* — Maier & Maier, PLLC

(57) ABSTRACT

A method for obtaining at least one particle, including: (a) preparing solution A including at least one precursor of at least one of Si, B, P, Ge, As, Al, Fe, Ti, Zr, Ni, Zn, Ca, Na, Ba, K, Mg, Pb, Ag, V, Te, Mn, Ir, Sc, Nb, Sn, Ce, Be, Ta, S, Se, N, F, and Cl; (b) preparing aqueous solution B; (c) forming droplets of solution A; (d) forming droplets of
(Continued)

solution B; (e) mixing droplets; (f) dispersing mixed droplets in a gas flow; (g) heating dispersed droplets to obtain the at least one particle; (h) cooling the at least one particle; and (i) separating and collecting the at least one particle. The aqueous solution is acidic, neutral, or basic. In step (a) and/or step (b) at least one colloidal suspension of a plurality of nanoparticles is mixed with the solution. Also, a device for implementing the method.

9 Claims, 11 Drawing Sheets

Related U.S. Application Data filed on Feb. 16, 2018, provisional application No. 62/609,932, filed on Dec. 22, 2017, provisional application No. 62/514,297, filed on Jun. 2, 2017, provisional application No. 62/514,601, filed on Jun. 2, 2017.

(51) Int. Cl.

| | |
|---|---|
| ***B01J 13/14*** | (2006.01) |
| ***B01J 13/18*** | (2006.01) |
| ***C09K 11/70*** | (2006.01) |
| ***C01B 19/00*** | (2006.01) |
| ***C01G 9/02*** | (2006.01) |
| ***C01G 11/00*** | (2006.01) |
| ***B01J 13/22*** | (2006.01) |
| ***C01F 7/30*** | (2022.01) |
| ***C09K 11/02*** | (2006.01) |
| ***B01J 13/04*** | (2006.01) |
| ***C09K 11/08*** | (2006.01) |
| ***B01J 2/06*** | (2006.01) |
| ***B01J 19/06*** | (2006.01) |
| ***B01J 2/04*** | (2006.01) |
| ***B01J 2/02*** | (2006.01) |
| ***C09D 11/033*** | (2014.01) |
| ***C09D 11/037*** | (2014.01) |
| ***C09D 11/322*** | (2014.01) |
| ***C09D 11/36*** | (2014.01) |
| ***C09K 11/06*** | (2006.01) |
| ***C09K 11/56*** | (2006.01) |
| *C01B 33/12* | (2006.01) |
| *B82Y 20/00* | (2011.01) |
| *B82Y 40/00* | (2011.01) |
| *H01L 33/50* | (2010.01) |

(52) U.S. Cl.

CPC ............ *B01J 13/043* (2013.01); *B01J 13/14* (2013.01); *B01J 13/18* (2013.01); *B01J 13/22* (2013.01); *B01J 19/06* (2013.01); *C01B 19/007* (2013.01); *C01F 7/30* (2013.01); *C01G 9/02* (2013.01); *C01G 11/006* (2013.01); *C09D 11/033* (2013.01); *C09D 11/037* (2013.01); *C09D 11/322* (2013.01); *C09D 11/36* (2013.01); *C09K 11/02* (2013.01); *C09K 11/025* (2013.01); *C09K 11/06* (2013.01); *C09K 11/0883* (2013.01); *C09K 11/565* (2013.01); *C09K 11/70* (2013.01); *C09K 11/703* (2013.01); *C09K 11/883* (2013.01); *B82Y 20/00* (2013.01); *B82Y 40/00* (2013.01); *C01B 33/12* (2013.01); *C01P 2004/04* (2013.01); *C01P 2004/24* (2013.01); *C01P 2004/32* (2013.01); *C01P 2004/80* (2013.01); *C01P 2004/84* (2013.01); *C01P 2004/90* (2013.01); *C09K 2211/10* (2013.01); *H01L 33/502* (2013.01); *H01L 2933/0041* (2013.01)

(56) References Cited

U.S. PATENT DOCUMENTS

| | | | | |
|---|---|---|---|---|
| 5,964,229 A * | 10/1999 | Brendel | B65F 7/005 | 134/52 |
| 6,270,566 B1 * | 8/2001 | Rademachers | C09C 1/24 | 106/434 |
| 8,852,644 B2 | 10/2014 | Baumstuemmler et al. | | |
| 2013/0075692 A1 | 3/2013 | Naasani et al. | | |

FOREIGN PATENT DOCUMENTS

| | | |
|---|---|---|
| KR | 2013-0043442 A | 4/2013 |
| WO | 2006/119653 A1 | 11/2006 |
| WO | 2011/116763 A1 | 9/2011 |

OTHER PUBLICATIONS

Translation for KR 10-2013-0043442.*

International Search Report dated Jul. 20, 2018 in corresponding International Application No. PCT/EP2018/064439; 6 pages.

Koole, Rolf et al., "On the Incorporation Mechanism of Hydrophobic Quantum Dots in Silica Spheres by a Reverse Microemulsion Method", Chem. Mater. 2008, 20, 2503-2512; Mar. 6, 2008; 10 pages.

Oshima, Kentaro et al., "Preparation of ZnO—TiO2 Composite Fine Particles Using the Ultrasonic Spray Pyrolysis Method and Their Characteristics on Ultraviolet Cutoff", Aerosol Science and Technology, vol. 19, No. 4, Jan. 1, 1993, pp. 468-477; 11 pages.

Kang, Y.C. et al., "Preparation of zinc oxide-dispersed silver particles by spray pyrolysis of colloidal solution", Materials Let, Elsevier, Amsterdam, NL, vol. 40, No. 3, Aug. 1, 1999, pp. 129-133, 5 pages.

* cited by examiner

METHOD FOR OBTAINING ENCAPSULATED NANOPARTICLES

FIELD

The present invention pertains to the field of particle synthesis. In particular, the invention relates to a method for obtaining particles comprising a plurality of nanoparticles encapsulated in an inorganic material.

BACKGROUND

Encapsulating nanoparticles in an inorganic material is required and can be essential in certain applications such as catalysis, drug-delivery, bio-imaging, displays, paints. Indeed, it is known that encapsulating nanoparticles, especially pigments or fluorescent nanoparticles, can be useful to retain the properties of said nanoparticles when used in an environment comprising deteriorating species such as water, oxygen, acids or bases, i.e. a high stability in time, temperature, humidity, etc. The inorganic material plays the role of a protective shell to prevent any deterioration of said nanoparticles and their properties.

Furthermore, coating nanoparticles with a layer of inorganic material allows for a fine control of the surface state of the resulting particle. Said inorganic material is chosen according to the aimed application for the better efficiency, dispersion (in a matrix or a solution), or functionalization of the resulting particle.

It is known to encapsulate nanoparticles in an inorganic material by a method in solution. For example, Koole et al. discloses the encapsulation of hydrophobic CdSe and CdTe quantum dots in silica using a water-in-oil reverse microemulsion method (Chem. Mater. 2008, 20, 2503-2512). In this method, QDs dispersed in chloroform, cyclohexane, or water are added to a solution of cyclohexane comprising a surfactant, typically NP-5. Then, a precursor of silica, typically tetraethyl orthosilicate, and ammonia are added. The mixture is then stirred for 1 min and stored in the dark at room temperature for 1 week. Finally, particles are purified by centrifugation and redispersed in ethanol. However, this microemulsion method may result in porous silica encapsulated quantum dots, and porous silica will not be able to act as an efficient protective layer. This method also results in the quenching of the photoluminescence of the quantum dots at every stage of the synthesis, leading to a particle with much poorer optical properties than the original quantum dots. Furthermore, this synthesis method requires a long time of reaction and is difficult to scale up. Lastly, surfactants are used in such a method, which makes the functionalization of the resulting particle difficult.

For example, U.S. Pat. No. 8,852,644 discloses a method for producing particles containing a target molecule by controlled precipitating a solvent which contains said target molecule, and a nonsolvent. The two parts are mixed as the two liquid jets collide each other in a microjet reactor. This method results in particles containing a target molecule with an average size controlled. However, this method cannot be implemented with a conventional microjet reactor and requires a complex microjet reactor. Said microjet reactor is designed such that the liquid jets collide at an angle other than 1800 or that the jets are mixed on a shared impinging surface. U.S. Pat. No. 8,852,644 does not disclose the encapsulation of nanoparticles as said nanoparticles would not be dispersed in the inorganic material using the disclosed method.

WO 2006/119653 discloses a flame spray method for producing particles with controlled mixedness. Said method comprises the steps of i) providing at least two spray nozzles, each spray nozzle being connected to at least one reservoir, each reservoir comprising a liquid precursor composition, ii) positioning said at least two spray nozzles at an angle and in a distance suitable for the spray to collide, iii) feeding said at least two liquid precursor compositions to their respective spray nozzle, iv) dispersing, igniting, combusting and mixing said at least two liquid precursor compositions, and v) collecting the nanopowder. $Pt/BaCO_3/Al_2O_3$ powders were produced using this method and device. However, this method does not result in $BaCO_3$ nanoparticles encapsulated in $Al_2O_3$ but results in a mixture of $BaCO_3$ and $Al_2O_3$ particles with some $BaCO_3$ nanoparticles deposited on the surface of said $Al_2O_3$ particles. This method does not allow for a fine control of the precipitation, thus a fine control of the particles size. Furthermore, the device disclosed in WO 2006/119653 is complex as the spray nozzles must be kept at a constant angle which need to be chosen finely for the two sprays to collide and efficiently mix.

Finally, known methods often have the following disadvantages: high energy input; low yield; upscaling issues; long reaction time; particle size difficult to control; constraining and complex devices. These factors limit the use of these methods for the commercial production of nanoparticles.

It is therefore an object of the present invention to provide a method for obtaining particles comprising a plurality of nanoparticles encapsulated in an inorganic material, whose particles show enhanced resistance to environment deterioration, enhanced stability over time, temperature, or environment variations. Said method having one or more of the following advantages: providing a controlled activation of the precursors of the inorganic material, providing a controlled precipitation of the precursors of the inorganic material, allowing a fine control of the particles size, allowing a fine control of the nanoparticles dispersion, easy and fast to operate, easy to scale up, with a reduced cost, and preventing the deterioration of the properties of the encapsulated nanoparticles.

SUMMARY

The present invention relates to a method for obtaining at least one particle comprising the following steps:

(a) preparing a solution A comprising at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

(b) preparing an aqueous solution B;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain the at least one particle;

(h) cooling of said at least one particle; and (i) separating and collecting said at least one particle;

wherein the aqueous solution may be acidic, neutral, or basic; and wherein at least one colloidal suspension comprising a plurality of nanoparticles is mixed with the solution A at step (a) and/or with the solution B at step (b).

In one embodiment, at least one precursor of at least one heteroelement selected from the group constituted by cadmium, sulfur, selenium, indium, tellurium, mercury, tin, copper, nitrogen, gallium, antimony, thallium, molybdenum, palladium, cerium, tungsten, cobalt, manganese, silicon, boron, phosphorus, germanium, arsenic, aluminium, iron, titanium, zirconium, nickel, zinc, calcium, sodium, barium, potassium, magnesium, lead, vanadium, silver, beryllium, iridium, scandium, niobium or tantalum is added to solution A at step (a) and/or to solution B at step (b).

In one embodiment, the droplets are formed by spray-drying or spray-pyrolysis.

In one embodiment, the droplets of solution A and solution B are simultaneously formed.

In one embodiment, the droplets of solution A are formed prior to or after the formation of droplets of solution B.

In one embodiment, the droplets of solution B or solution A are replaced by vapors of solution B or solution A respectively.

In one embodiment, the nanoparticles are luminescent, preferably the luminescent nanoparticles are semiconductor nanocrystals comprising a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystals comprise at least one shell comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystals are semiconductor nanoplatelets.

The present invention also relates to a particle obtained by the method of the invention, wherein said obtained particle comprises a plurality of nanoparticles encapsulated in an inorganic material.

The present invention also relates to a particle obtainable by the method of the invention, wherein said obtainable particle comprises a plurality of nanoparticles encapsulated in an inorganic material, wherein the plurality of nanoparticles is uniformly dispersed in said inorganic material.

The present invention also relates to a device for implementing the method of the invention, said device comprising:

at least one gas supply;

a first means for forming droplets of a first solution;

a second means for forming droplets of a second solution;

an optional means for forming reactive vapors of a third solution;

an optional means for releasing gas;

a tube;

means for heating the droplets to obtain at least one particle;

means for cooling the at least one particle;

means for separating and collecting the at least one particle; and a pumping device; and connecting means.

In one embodiment, the means for forming droplets are located and are working in a series or in parallel.

In one embodiment, the droplets of solution A and solution B are formed in two distinct connecting means of the device.

In one embodiment, the droplets of solution A and solution B are formed in the same connecting means of the device.

BRIEF DESCRIPTION OF THE DRAWINGS

FIG. 5A illustrates a core nanoparticle 33 without a shell.

FIG. 5B illustrates a core 33/shell 34 nanoparticle 3 with one shell 34.

FIG. 5C illustrates a core 33/shell (34, 35) nanoparticle 3 with two different shells (34, 35).

FIG. 5D illustrates a core 33/shell (34, 35, 36) nanoparticle 3 with two different shells (34, 35) surrounded by an oxide insulator shell 36.

FIG. 5E illustrates a core 33/crown 37 2D nanoparticle 32.

FIG. 5F illustrates a core 33/shell 34 2D nanoparticle 32 with one shell 34.

FIG. 5G illustrates a core 33/shell (34, 35) 2D nanoparticle 32 with two different shells (34, 35).

FIG. 5H illustrates a core 33/shell (34, 35, 36) 2D nanoparticle 32 with two different shells (34, 35) surrounded by an oxide insulator shell 36.

FIG. 9A illustrates a first means for forming droplets 42 of a first solution and a second means for forming droplets 43 of a second solution working in series.

FIG. 9B illustrates a first means for forming droplets 42 of a first solution and a second means for forming droplets 43 of a second solution working in parallel.

FIG. 9C illustrates a first means for forming droplets 42 of a first solution and a container 49 comprising a solution capable of producing reactive vapors working in series.

FIG. 9D illustrates a first means for forming droplets 42 of a first solution and a container 49 comprising a solution capable of producing reactive vapors working in parallel.

FIG. 11A is a TEM image showing CdSe/CdZnS nanoplatelets (dark contrast) uniformly dispersed in $SiO_2$ (bright contrast—@$SiO_2$).

FIG. 11B is a TEM image showing CdSe/CdZnS nanoplatelets (dark contrast) uniformly dispersed in $SiO_2$ (bright contrast—@$SiO_2$).

FIG. 11C is a TEM image showing CdSe/CdZnS nanoplatelets (dark contrast) uniformly dispersed in $Al_2O_3$ (bright contrast—@$Al_2O_3$).

FIG. 11D is a TEM image showing obtained particles 1 comprising nanoparticles (dark contrast) uniformly dispersed in an inorganic material (bright contrast) produced by using water vapor.

FIG. 11E is a TEM image showing $Fe_3O_4$ nanoparticles (dark contrast) uniformly dispersed in $Al_2O_3$ (bright contrast—@$Al_2O_3$).

FIGS. 13A-B show InP/ZnS@$SiO_2$ prepared by reverse microemulsion.

FIGS. 13C-D show CdSe/CdS/ZnS@$SiO_2$ prepared as detailed in Example 26.

FIG. 14A shows the $N_2$ adsorption isotherm of composite particles 1 CdSe/CdZnS@$SiO_2$ prepared from a basic aqueous solution and from an acidic solution.

FIG. 14B shows the $N_2$ adsorption isotherm of composite particles 1 CdSe/CdZnS@$Al_2O_3$ obtained by heating droplets at 150° C., 300° C. and 550° C.

DETAILED DESCRIPTION

Figure 1:
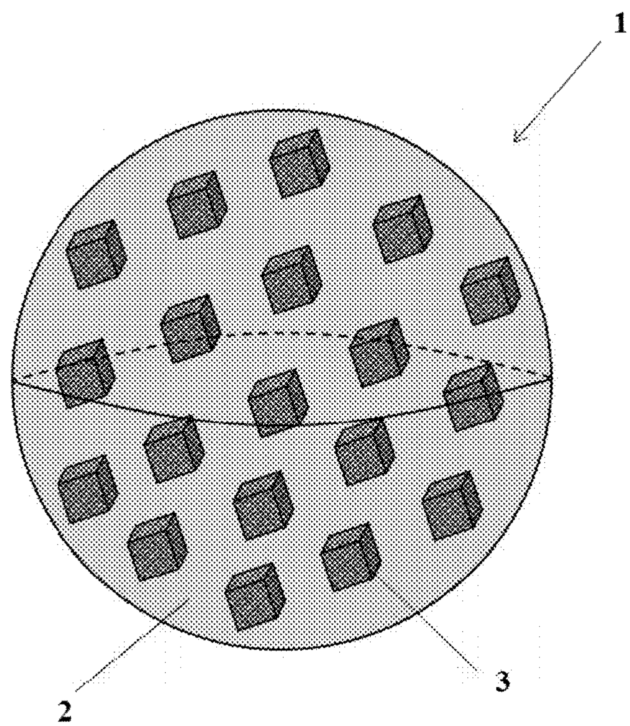
FIG. 1 illustrates a particle 1 comprising a plurality of nanoparticles 3 encapsulated in an inorganic material 2.

In the present invention, the following terms have the following meanings:

- "Activation" refers to the process allowing to a molecule to react efficiently in a chemical reaction, and may need energy and/or the presence of other reagents to occur. For example, the activation of an alkoxide precursor may be performed by adding water and by heating.
- "Core" refers to the innermost space within a particle.
- "Shell" refers to at least one monolayer of material coating partially or totally a core.
- "Encapsulate" refers to a material that coats, surrounds, embeds, contains, comprises, wraps, packs, or encloses a plurality of nanoparticles.
- "Uniformly dispersed" refers to particles that are not aggregated, do not touch, are not in contact, are separated by an inorganic material. Each nanoparticle is spaced from their adjacent nanoparticles by an average minimal distance.
- "Colloidal" refers to a substance in which particles are dispersed, suspended and do not settle or would take a very long time to settle appreciably, but are not soluble in said substance.
- "Colloidal particles" refers to particles that may be dispersed, suspended and which would not settle or would take a very long time to settle appreciably in another substance, typically in an aqueous or organic solvent, and which are not soluble in said substance. "Colloidal particles" does not refer to particles grown on substrate.
- "Impermeable" refers to a material that limits or prevents the diffusion of outer molecular species or fluids (liquid or gas) into said material.
- "Permeable" refers to a material that allows the diffusion of outer molecular species or fluids (liquid or gas) into said material.
- "Outer molecular species or fluids (liquid or gas)" refers to molecular species or fluids (liquid or gas) coming from outside a material or a particle.
- "Adjacent nanoparticle" refers to neighbouring nanoparticles in a space or a volume, without any other nanoparticle between said adjacent nanoparticles.
- "Packing fraction" refers to the volume ratio between the volume filled by an ensemble of objects into a space and the volume of said space. The terms packing fraction, packing density and packing factor are interchangeable in the present invention.
- "Loading charge" refers to the mass ratio between the mass of an ensemble of objects comprised in a space and the mass of said space.

"Statistical set" refers to a collection of at least 2, 3, 4, 5, 6, 7, 8, 9, 10, 11, 12, 13, 14, 15, 16, 17, 18, 19, 20, 30, 40, 50, 60, 70, 80, 90, 100, 150, 200, 250, 300, 350, 400, 450, 500, 550, 600, 650, 700, 750, 800, 850, 900, 950, or 1000 objects obtained by the strict same process. Such statistical set of objects allows determining average characteristics of said objects, for example their average size, their average size distribution or the average distance between them.

"Surfactant-free" refers to a particle that does not comprise any surfactant and was not synthesized by a method comprising the use of surfactants.

"Optically transparent" refers to a material that absorbs less than 10%, 5%, 2.5%, 1%, 0.99%, 0.98%, 0.97%, 0.96%, 0.95%, 0.94%, 0.93%, 0.92%, 0.91%, 0.9%, 0.89%, 0.88%, 0.87%, 0.86%, 0.85%, 0.84%, 0.83%, 0.82%, 0.81%, 0.8%, 0.79%, 0.78%, 0.77%, 0.76%, 0.75%, 0.74%, 0.73%, 0.72%, 0.71%, 0.7%, 0.69%, 0.68%, 0.67%, 0.66%, 0.65%, 0.64%, 0.63%, 0.62%, 0.61%, 0.6%, 0.59%, 0.58%, 0.57%, 0.56%, 0.55%, 0.54%, 0.53%, 0.52%, 0.51%, 0.5%, 0.49%, 0.48%, 0.47%, 0.46%, 0.45%, 0.44%, 0.43%, 0.42%, 0.41%, 0.4%, 0.39%, 0.38%, 0.37%, 0.36%, 0.35%, 0.34%, 0.33%, 0.32%, 0.31%, 0.3%, 0.29%, 0.28%, 0.27%, 0.26%, 0.25%, 0.24%, 0.23%, 0.22%, 0.21%, 0.2%, 0.19%, 0.18%, 0.17%, 0.16%, 0.15%, 0.14%, 0.13%, 0.12%, 0.11%, 0.1%, 0.09%, 0.08%, 0.07%, 0.06%, 0.05%, 0.04%, 0.03%, 0.02%, 0.01%, 0.009%, 0.008%, 0.007%, 0.006%, 0.005%, 0.004%, 0.003%, 0.002%, 0.001%, 0.0009%, 0.0008%, 0.0007%, 0.0006%, 0.0005%, 0.0004%, 0.0003%, 0.0002%, 0.0001%, or 0% of light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

"Roughness" refers to a surface state of a particle. Surface irregularities can be present at the surface of particles and are defined as peaks or cavities depending on their relative position respect to the average particle surface. All said irregularities constitute the particle roughness. Said roughness is defined as the height difference between the highest peak and the deepest cavity on the surface. The surface of a particle is smooth if they are no irregularities on said surface, i.e. the roughness is equal to 0%, 0.5%, 1%, 1.5%, 2%, 2.5% 3%, 3.5%, 4%, 4.5%, 5% of the largest dimension of said particle.

"Polydisperse" refers to particles or droplets of varied sizes, wherein the size difference is superior or equal to 20%.

"Monodisperse" refers to particles or droplets, wherein the size difference is inferior than 20%, 15%, 10%, preferably 5%.

"Narrow size distribution" refers to a size distribution of a statistical set of particles less than 1%, 2%, 3%, 4%, 5%, 6%, 7%, 8%, 9%, 10%, 15%, 20%, 25%, 30%, 35%, or 40% of the average size.

"Partially" means incomplete. In the case of a ligand exchange, partially means that 5%, 10%, 15%, 20%, 25%, 30%, 35%, 40%, 45%, 50%, 55%, 60%, 65%, 70%, 75%, 80%, 85%, 90%, 95% of the ligands at the surface of a particle have been successfully exchanged.

"Nanoplatelet" refers to a 2D shaped nanoparticle, wherein the smallest dimension of said nanoplatelet is smaller than the largest dimension of said nanoplatelet by a factor (aspect ratio) of at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5 or at least 10.

"Free of oxygen" refers to a formulation, a solution, a film, or a composition that is free of molecular oxygen, $O_2$, i.e. wherein molecular oxygen may be present in said formulation, solution, film, or composition in an amount of less than about 10 ppm, 5 ppm, 4 ppm, 3 ppm, 2 ppm, 1 ppm, 500 ppb, 300 ppb or in an amount of less than about 100 ppb in weight.

"Free of water" refers to a formulation, a solution, a film, or a composition that is free of molecular water, $H_2O$, i.e. wherein molecular water may be present in said formulation, solution, film, or composition in an amount of less than about 100 ppm, 50 ppm, 10 ppm, 5 ppm, 4 ppm, 3 ppm, 2 ppm, 1 ppm, 500 ppb, 300 ppb or in an amount of less than about 100 ppb in weight.

"ROHS compliant" refers to a material compliant with Directive 2011/65/EU of the European Parliament and of the Council of 8 Jun. 2011 on the restriction of the use of certain hazardous substances in electrical and electronic equipment.

"Vapor" refers to a substance in a gaseous state, while said substance is in a liquid or a solid state in standard conditions of pressure and temperature.

"Reactive vapor" refers to a substance in a gaseous state, while said substance is in a liquid or a solid state in standard conditions of pressure and temperature, and with which a chemical reaction may occur in presence of another chemical species.

"Gas" refers to a substance in a gaseous state in standard conditions of pressure and temperature.

"Curvature" refers to the reciprocal of the radius.

"Standard conditions" refers to the standard conditions of temperature and pressure, i.e. 273.15 K and 105 Pa respectively.

"Aqueous solvent" is defined as a unique-phase solvent wherein water is the main chemical species in terms of molar ratio and/or in terms of mass and/or in terms of volume in respect to the other chemical species contained in said aqueous solvent. The aqueous solvent includes but is not limited to: water, water mixed with an organic solvent miscible with water such as for example methanol, ethanol, acetone, tetrahydrofuran, n-methylformamide, n,n-dimethylformamide, dimethylsulfoxide or a mixture thereof.

"Display apparatus" refers to an apparatus or a device that displays an image signal. Display devices or display apparatus include all devices that display an image, a succession of pictures or a video such as, non-limitatively, a LCD display device, a television, a projector, a computer monitor, a personal digital assistant, a mobile phone, a laptop computer, a tablet PC, an MP3 player, a CD player, a DVD player, a Blu-Ray player, a head mounted display, glasses, a helmet, a headgear, a headwear, a smart watch, a watch phone or a smart device.

"Alkyl" refers to any saturated linear or branched hydrocarbon chain, with 1 to 12 carbon atoms, preferably 1 to 6 carbon atoms, and more preferably methyl, ethyl, propyl, isopropyl, n-butyl, sec-butyl, isobutyl and tert-butyl. The alkyl group may be substituted by a saturated or unsaturated aryl group.

When the suffix "ene" ("alkylene") is used in conjunction with an alkyl group, this is intended to mean the alkyl group as defined herein having two single bonds as points of attachment to other groups. The term "alkylene" includes methylene, ethylene, methylmethylene, propylene, ethylethylene, and 1,2-dimethylethylene.

"Alkenyl" refers to any linear or branched hydrocarbon chain having at least one double bond, of 2 to 12 carbon atoms, and preferably 2 to 6 carbon atoms. The alkenyl group may be substituted. Examples of alkenyl groups are ethenyl, 2-propenyl, 2-butenyl, 3-butenyl, 2-pentenyl and its isomers, 2-hexenyl and its isomers, 2,4-pentadienyl and the like. The alkenyl group may be substituted by a saturated or unsaturated aryl group.

"Alkynyl", refers to any linear or branched hydrocarbon chain having at least one triple bond, of 2 to 12 carbon atoms, and preferably 2 to 6 carbon atoms.

The terms "Alkenylene" means an alkenyl group as defined above having two single bonds as points of attachment to other groups.

"Aryl" refers to a mono- or polycyclic system of 5 to 20, and preferably 6 to 12, carbon atoms having one or more aromatic rings (when there are two rings, it is called a biaryl) among which it is possible to cite the phenyl group, the biphenyl group, the 1-naphthyl group, the 2-naphthyl group, the tetrahydronaphthyl group, the indanyl group and the binaphthyl group. The term aryl also means any aromatic ring including at least one heteroatom chosen from an oxygen, nitrogen or sulfur atom. The aryl group can be substituted by 1 to 3 substituents chosen independently of one another, among a hydroxyl group, a linear or branched alkyl group comprising 1, 2, 3, 4, 5 or 6 carbon atoms, in particular methyl, ethyl, propyl, butyl, an alkoxy group or a halogen atom, in particular bromine, chlorine and iodine, a nitro group, a cyano group, an azido group, an aldehyde group, a boronato group, a phenyl, $CF_3$, methylenedioxy, ethylenedioxy, $SO_2NRR'$, NRR', COOR (where R and R' are each independently selected from the group consisting of H and alkyl), an second aryl group which may be substituted as above. Non-limiting examples of aryl comprise phenyl, biphenylyl, biphenylenyl, 5- or 6-tetralinyl, naphthalen-1- or -2-yl, 4-, 5-, 6 or 7-indenyl, 1-2-, 3-, 4- or 5-acenaphthylenyl, 3-, 4- or 5-acenaphthenyl, 1- or 2-pentalenyl, 4- or 5-indanyl, 5-, 6-, 7- or 8-tetrahydronaphthyl, 1,2,3,4-tetrahydronaphthyl, 1,4-dihydronaphthyl, 1-, 2-, 3-, 4- or 5-pyrenyl.

The term "Arylene" as used herein is intended to include divalent carbocyclic aromatic ring systems such as phenylene, biphenylylene, naphthylene, indenylene, pentalenylene, azulenylene and the like.

"Cycle" refers to a saturated, partially unsaturated or unsaturated cyclic group.

"Heterocycle" refers to a saturated, partially unsaturated or unsaturated cyclic group comprising at least on heteroatom.

"Halogen" means fluoro, chloro, bromo, or iodo. Preferred halo groups are fluoro and chloro.

"Alkoxy" refers to any O-alkyl group, preferably an O-alkyl group wherein the alkyl group has 1 to 6 carbon atoms.

"Aryloxy" refers to any O-aryl group.

"Arylalkyl" refers to an alkyl group substituted by an aryl group, such as for example the phenyl-methyl group.

"Arylalkoxy" refers to an alkoxy group substituted by an aryl group.

"Amine" refers to any group derived from ammoniac $NH_3$ by substitution of one or more hydrogen atoms with an organic radical.

"Azido" refers to —$N_3$ group.

"Acidic function" refers to —COOH group.

"Activated acidic function" refers to an acidic function wherein the —OH is replaced by a better leaving group.

"Activated alcoholic function" refers to an alcoholic function modified to be a better leaving group.

The following detailed description will be better understood when read in conjunction with the drawings. For the purpose of illustrating, the device is shown in the preferred embodiments. It should be understood, however that the application is not limited to the precise arrangements, structures, features, embodiments, and aspect shown. The drawings are not drawn to scale and are not intended to limit the scope of the claims to the embodiments depicted. Accordingly, it should be understood that where features mentioned in the appended claims are followed by reference signs, such signs are included solely for the purpose of enhancing the intelligibility of the claims and are in no way limiting on the scope of the claims.

This invention relates to a method for obtaining at least one particle 1.

The method comprises the following steps:

(a) preparing a solution A comprising at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

(b) preparing an aqueous solution B;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain the at least one particle 1;

(h) cooling of said at least one particle 1; and (i) separating and collecting said at least one particle 1;

wherein the aqueous solution may be acidic, neutral, or basic; and wherein at least one colloidal suspension comprising a plurality of nanoparticles 3 is mixed with the solution A at step (a), and/or with the solution B at step (b).

The activation of the at least one precursor comprised in solution A is controlled by the amount of solution B used during the method. The at least one precursor comprised in solution A can be activated with solution B without mixing the two solutions beforehand. This is particularly advantageous when solutions A and B are not miscible. In particular, the amount of water in solution B is decisive and has to be calculated before step (b) in order to provide the best activation of said at least one precursor.

According to one embodiment, the method comprises the following steps:

(a) preparing a solution A;

(b) preparing an aqueous solution B comprising at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain the at least one particle 1;

(h) cooling of said at least one particle 1; and (i) separating and collecting said at least one particle 1;

wherein the aqueous solution may be acidic, neutral, or basic; and wherein at least one colloidal suspension comprising a plurality of nanoparticles 3 is mixed with the solution A at step (a), and/or with the solution B at step (b).

The "at least one precursor of at least one element" refers to the precursor of an inorganic material 2 as described herein According to one embodiment, the method of the invention may comprise steps involving methods such as for example reverse micellar (or emulsion) method, micellar (or emulsion) method, Stöber method.

According to one embodiment, the method of the invention does not comprise steps involving methods such as for example reverse micellar (or emulsion) method, micellar (or emulsion) method, Stöber method.

According to one embodiment, the method of the invention does not comprise ALD steps (Atomic Layer Deposition).

According to one embodiment, at least one precursor of at least one heteroelement selected from the group constituted by cadmium, sulfur, selenium, indium, tellurium, mercury, tin, copper, nitrogen, gallium, antimony, thallium, molybdenum, palladium, cerium, tungsten, cobalt, manganese, silicon, boron, phosphorus, germanium, arsenic, aluminium, iron, titanium, zirconium, nickel, zinc, calcium, sodium, barium, potassium, magnesium, lead, vanadium, silver, beryllium, iridium, scandium, niobium or tantalum is added to solution A at step (a), and/or to solution B at step (b). In this embodiment, heteroelements can diffuse in the at least one particle 1 during heating step and form nanoclusters in situ inside the at least one particle 1 or are incorporated into the atomic network of the particle 1. These elements can drain away the heat if it is a good thermal conductor, and/or evacuate electrical charges.

According to one embodiment, the at least one precursor of at least one heteroelement is added in small amounts of 0 mole %, 1 mole %, 5 mole %, 10 mole %, 15 mole %, 20 mole %, 25 mole %, 30 mole %, 35 mole %, 40 mole %, 45 mole %, or 50 mole % compared to the precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine.

According to one embodiment, the at least one precursor of at least one heteroelement selected from the group described above includes but is not limited to: carboxylates, carbonates, thiolates, alkoxides, oxides, sulfates, phosphates, nitrates, acetates, chlorides, bromides, acetylacetonate or a mixture thereof.

According to one embodiment, the at least one precursor of cadmium includes but is not limited to: cadmium oxide CdO, cadmium carboxylates $Cd(R—COO)_2$, wherein R is a linear alkyl chain comprising a range of 1 to 25 carbon atoms; cadmium sulfate $Cd(SO_4)$; cadmium nitrate $Cd(NO_3)_2 \cdot 4H_2O$; cadmium acetate $(CH_3COO)_2Cd \cdot 2H_2O$; cadmium chloride $CdCl_2 \cdot 2.5H_2O$; dimethylcadmium; dineopentylcadmium; bis(3-diethylaminopropyl)cadmium; (2,2'-bipyridine)dimethylcadmium; cadmium ethylxanthate; or a mixture thereof.

According to one embodiment, the at least one precursor of selenium includes but is not limited to: solid selenium; tri-n-alkylphosphine selenide such as for example tri-n-butylphosphine selenide or tri-n-octylphosphine selenide; selenium oxide $SeO_2$; hydrogen selenide $H_2Se$; diethylselenide; methylallylselenide; salts such as for example magnesium selenide, calcium selenide, sodium selenide, potassium selenide; or a mixture thereof.

According to one embodiment, the at least one precursor of zinc includes but is not limited to: zinc carboxylates $Zn(R—COO)_2$, wherein R is a linear alkyl chain comprising a range of 1 to 25 carbon atoms; zinc oxide ZnO; zinc sulfate $Zn(SO_4) \cdot xH_2O$ where x is from 1 to 7; zinc nitrate $Zn(NO_3)_2 \cdot xH_2O$ where x is from 1 to 4; zinc acetate $(CH_3COO)_2Zn \cdot 2H_2O$; zinc chloride $ZnCl_2$; diethylzinc $(Et_2Zn)$; chloro(ethoxycarbonylmethyl)zinc; zinc alkoxides such as for example zinc tert-butoxide, zinc methoxide, zinc isopropxide; or a mixture thereof.

According to one embodiment, the at least one precursor of sulfur includes but is not limited to: solid sulfur; sulfur oxides; tri-n-alkylphosphine sulfide such as for example tri-n-butylphosphine sulfide or tri-n-octylphosphine sulfide; hydrogen sulfide $H_2S$; thiols such as for example n-butanethiol, n-octanethiol or n-dodecanethiol; diethylsulfide; methylallylsulfide; salts such as for example magnesium sulfide, calcium sulfide, sodium sulfide, potassium sulfide; or a mixture thereof.

According to one embodiment, the method comprises the following steps:

(a) preparing a solution A comprising at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

(b) preparing an aqueous solution B;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain the at least one particle 1;

(h) cooling of said at least one particle 1; and (i) separating and collecting said at least one particle 1;

wherein the aqueous solution may be acidic, neutral, or basic;

wherein at least one colloidal suspension comprising a plurality of nanoparticles 3 is mixed with the solution A at step (a), and/or with the solution B at step (b); and wherein at least one precursor of at least one heteroelement selected from the group constituted by cadmium, sulfur, selenium, indium, tellurium, mercury, tin, copper, nitrogen, gallium, antimony, thallium, molybdenum, palladium, cerium, tungsten, cobalt, manganese, silicon, boron, phosphorus, germanium, arsenic, aluminium, iron, titanium, zirconium, nickel, zinc, calcium, sodium, barium, potassium, magnesium, lead, vanadium, silver, beryllium, iridium, scandium, niobium or tantalum is optionally added to solution A at step (a), and/or to solution B at step (b).

According to one embodiment, the method comprises the following steps:

(a) preparing a solution A;

(b) preparing an aqueous solution B comprising at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain the at least one particle 1;

(h) cooling of said at least one particle 1; and (i) separating and collecting said at least one particle 1;

wherein the aqueous solution may be acidic, neutral, or basic;

wherein at least one colloidal suspension comprising a plurality of nanoparticles 3 is mixed with the solution A at step (a), and/or with the solution B at step (b); and wherein at least one precursor of at least one heteroelement selected from the group constituted by cadmium, sulfur, selenium, indium, tellurium, mercury, tin, copper, nitrogen, gallium, antimony, thallium, molybdenum, palladium, cerium, tungsten, cobalt, manganese, silicon, boron, phosphorus, germanium, arsenic, aluminium, iron, titanium, zirconium, nickel, zinc, calcium, sodium, barium, potassium, magnesium, lead, vanadium, silver, beryllium, iridium, scandium, niobium or tantalum is optionally added to solution A at step (a), and/or to solution B at step (b).

In one embodiment, the method comprises the following steps:

(a) preparing a solution A by mixing:

at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

optionally, at least one precursor of at least one heteroelement selected from the group constituted by cadmium, sulfur, selenium, indium, tellurium, mercury, tin, copper, nitrogen, gallium, antimony, thallium, molybdenum, palladium, cerium, tungsten, cobalt, manganese, silicon, boron, phosphorus, germanium, arsenic, aluminium, iron, titanium, zirconium, nickel, zinc, calcium, sodium, barium, potassium, magnesium, lead, vanadium, silver, beryllium, iridium, scandium, niobium, or tantalum;

(b) optionally subjecting to hydrolysis solution A;

(c) transferring a colloidal suspension comprising a plurality of nanoparticles 3 in an aqueous solution;

(d) mixing the solution A with the solution from step (c);

(e) forming droplets of said mixing solution by means for forming droplets;

(f) dispersing said droplets in a gas flow;

(g) heating said dispersed droplets at a temperature sufficient to obtain the particles 1;

(h) cooling of said particles 1; and (i) separating and collecting said particles 1;

wherein the aqueous solution may be acidic, neutral, or basic; and wherein the hydrolysis is performed at acidic, neutral, or basic pH.

According to one embodiment, at least one solution comprising additional nanoparticles selected in the group of $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, $Y_2O_3$ or a mixture thereof, is added in solution A in step (a) or in solution B in step (b). These additional nanoparticles can drain away the heat if it is a good thermal conductor, and/or evacuate electrical charges, and/or scatter an incident light.

According to one embodiment, additional nanoparticles are added in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500000 ppm in weight compared to the particle 1.

According to one embodiment, the method for obtaining the at least one particle 1 of the invention is not surfactant-free. In this embodiment, the nanoparticles may be better stabilized in solution during the method, allowing to limit or prevent any degradation of their chemical or physical properties during the method. Furthermore, the colloidal stability of particles 1 may be enhanced, especially it may be easier to disperse the particles 1 in solution at the end of the method.

According to one embodiment, the method for obtaining the at least one particle 1 of the invention is surfactant-free. In this embodiment, the surface of the at least one particle 1 will be easier to functionalize after synthesis as said surface will not be blocked by any surfactant molecule.

According to one embodiment, solution A comprises at least one organic solvent and/or at least one aqueous solvent.

According to one embodiment, solution A comprises at least one surfactant.

According to one embodiment, solution A does not comprise a surfactant.

According to one embodiment, solution B comprises at least one aqueous solvent.

According to one embodiment, solution B comprises at least one surfactant.

According to one embodiment, solution B does not comprise a surfactant.

According to one embodiment, solution A comprises at least one reactive species.

According to one embodiment, solution B comprises at least one reactive species.

According to one embodiment, solution A and solution B are miscible.

According to one embodiment, solution A and solution B are not miscible.

According to one embodiment, solution A and solution B are immiscible.

According to one embodiment, the droplets of solution B are replaced by vapors of solution B. In this embodiment, said means for forming droplets do not form droplets but uses the vapors of the solution comprised in a container.

According to one embodiment, the droplets of solution B are replaced by a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the droplets of solution A are replaced by vapors of solution A. In this embodiment, said means for forming droplets do not form droplets but uses the vapors of the solution comprised in a container.

According to one embodiment, the droplets of solution A are replaced by a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, vapors of a solution are obtained by heating said solution with an external heating system.

According to one embodiment, examples for the solution capable of producing reactive vapors include but are not limited to water, a volatile acid such as for example HCl or $HNO_3$, a base such as for example ammonia, ammonium hydroxide, or tetramethylammonium hydroxide, or a metal alkoxide such as for example an alkoxide of silicon or aluminium such as for example tetramethyl orthosilicate or tetraethyl orthosilicate.

According to one embodiment, the aqueous solution comprises at least one aqueous solvent.

According to one embodiment, the organic solvent includes but is not limited to: pentane, hexane, heptane, 1,2-hexanediol, 1,5-pentanediol, octane, decane, dodecane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol, alkoxy alcohol, alkyl alcohol, alkyl benzene, alkyl benzoate, alkyl naphthalene, amyl octanoate, anisole, aryl alcohol, benzyl alcohol, butyl benzene, butyrophenon, cis-decalin, dipropylene glycol methyl ether, dodecyl benzene, mesitylene, methoxy propanol, methylbenzoate, methyl naphthalene, methyl pyrrolidinone, phenoxy ethanol, 1,3-propanediol, pyrrolidinone, trans-decalin, valerophenone, or a mixture thereof.

The term "the at least one precursor of at least one element" refers to the at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine;

According to one embodiment, the at least one precursor of at least one element selected from the group described hereabove is an alkoxide precursor of formula $XM_a(OR)_b$, wherein:

M is said element;

R is a linear alkyl chain comprising a range of 1 to 25 carbon atoms, R includes but is not limited to: methyl, ethyl, isopropyl, n-butyl, or octyl;

X is optional and is a linear alkyl chain that can comprise an alcohol group, a thiol group, an amino group, or a carboxylic group, comprising a range of 1 to 25 carbon atoms; and a and b are independently a decimal number from 0 to 5.

According to one embodiment, the alkoxide precursor of formula $XM_a(OR)_b$ includes but is not limited to: tetramethyl orthosilicate, tetraethyl orthosilicate, polydiethyoxysilane, n-alkyltrimethoxylsilanes such as for example n-butyltrimethoxysilane, n-octyltrimethoxylsilane, n-dodecyltrimethoxysilane, n-octadecyltrimethoxysilane, 3-mercaptopropyltrimethoxysilane, 11-mercaptoundecyltrimethoxysilane, 3-aminopropyltrimethoxysilane, 11-aminoundecyltrimethoxysilane, 3-(2-(2-aminoethylamino)ethylamino)propyltrimethoxysilane, 3-(trimethoxysilyl)propyl methacrylate, 3-(aminopropyl)trimethoxysilane, aluminium tri-sec butoxide, aluminium isopropxide, aluminium ethoxide, aluminium tert-butoxide, titanium butoxide, aluminium ethoxide, aluminium tert-butoxide, titanium isopropxide, zinc tert-butoxide, zinc methoxide, zinc isopropxide, tin tert-butoxide, tin isopropxide, magnesium di-tert-butoxide, magnesium isopropxide or a mixture thereof.

According to one embodiment, the at least one precursor of at least one element selected from the group described hereabove is an inorganic halide precursor.

According to one embodiment, the at least one precursor of at least one element selected from the group described hereabove is a solid precursor.

According to one embodiment, the halide precursor includes but is not limited to: halide silicates such as for example ammonium fluorosilicate, sodium fluorosilicate, or a mixture thereof.

According to one embodiment, the at least one precursor of at least one element selected from the group described hereabove is an inorganic oxide precursor.

According to one embodiment, the at least one precursor of at least one element selected from the group described hereabove is an inorganic hydroxide precursor.

According to one embodiment, the at least one precursor of at least one element selected from the group described hereabove is an inorganic salt.

According to one embodiment, the at least one precursor of at least one element selected from the group described hereabove is an inorganic complex.

According to one embodiment, the at least one precursor of at least one element selected from the group described hereabove is an inorganic cluster.

According to one embodiment, the at least one precursor of at least one element selected from the group described hereabove is an organometallic compound $M_a(Y_cR_b)_d$, wherein:

M is said element;

Y is an halogenide, or an amide;

R is an alkyl chain or alkenyl chain or alkinyl chain comprising a range of 1 to 25 carbon atoms, R includes but is not limited to: methyl, ethyl, isopropyl, n-butyl, or octyl;

a, b, c and d are independently a decimal number from 0 to 5.

According to one embodiment, examples of the organometallic compound $Ma(Y_cR_b)_d$ include but are not limited to: Grignard reagents; metallocenes; metal amidinates; metal alkyl halides; metal alkyls such as for example dimethylzinc, diethylzinc, dimethylcadmium, diethylcadmium, dimethylindium or diethylindium; metal and metalloid amides such as $Al[N(SiMe_3)_2]_3$, $Cd[N(SiMe_3)_2]_2$, $Hf[NMe_2]_4$, $In[N(SiMe_3)_2]_3$, $Sn(NMe_2)_2$, $Sn[N(SiMe_3)_2]_2$, $Zn[N(SiMe_3)_2]_2$ or $Zn[(NiBu_2)_2]_2$, dineopentylcadmium, zinc diethylthiocarbamate, bis(3-diethylaminopropyl)cadmium, (2,2'-bipyridine)dimethylcadmium, cadmium ethylxanthate; trimethyl aluminium, triisobutylaluminum, trioctylaluminum, triphenylaluminum, dimethyl aluminium, trimethyl zinc, dimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), $Hf[C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[(CH_2CH_3)_2N]_4Hf$, $[(CH_3)_2N]_4Hf$, $[(CH_3)_2N]_4Hf$, $[(CH_3)(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_8H_{15}O_2)_4$, $Zr(OCC(CH_3)_3CHCOC(CH_3)_3)_4$, $Mg(C_5H_5)_2$, $C_{20}H_{30}Mg$; or a mixture thereof.

According to one embodiment, molecular oxygen and/or molecular water are removed from the aqueous solvent prior to step (a).

According to one embodiment, molecular oxygen and/or molecular water are removed from the organic solvent prior to step (a).

According to one embodiment, methods to remove molecular oxygen and/or molecular water known to those of skill in the art may be used to remove molecular oxygen and/or molecular water from solvents, such as for example distilling or degassing said solvent.

In one embodiment, water, at least one acid, at least one base, at least one organic solvent, at least one aqueous solvent, or at least one surfactant is added in step (a) and/or step (b).

According to one embodiment, nanoparticles 3 are not synthetized in particle 1 in situ during the method.

According to one embodiment, the nanoparticles 3 are encapsulated into the inorganic material 2 during the formation of said inorganic material 2. For example, said nanoparticles 3 are not inserted in nor put in contact with the inorganic material 2 which have been previously obtained.

According to one embodiment, the nanoparticles 3 are not encapsulated in the particle 1 via physical entrapment. In this embodiment, the particle 1 is not a preformed particle in which nanoparticles 3 are inserted via physical entrapment.

According to one embodiment, examples of the surfactant include but are not limited to: carboxylic acids such as for example oleic acid, acetic acid, octanoic acid; thiols such as octanethiol, hexanethiol, butanethiol; 4-mercaptobenzoic acid; amines such as for example oleylamine, 1,6-hexanediamine, octylamine; phosphonic acids; antibodies; or a mixture thereof.

According to one embodiment, the neutral aqueous solution has a pH of 7.

According to one embodiment, the neutral pH is 7.

According to one embodiment, the basic aqueous solution has a pH higher than 7.

According to one embodiment, the basic pH is higher than 7.

According to one embodiment, the basic aqueous solution has a pH of at least 7.1, 7.2, 7.3, 7.4, 7.5, 7.6, 7.7, 7.8, 7.9, 8, 8.1, 8.2, 8.3, 8.4, 8.5, 8.6, 8.7, 8.8, 8.9, 9, 9.1, 9.2, 9.3, 9.4, 9.5, 9.6, 9.7, 9.8, 9.9, 10, 10.1, 10.2, 10.3, 10.4, 10.5, 10.6, 10.7, 10.8, 10.9, 11, 11.1, 11.2, 11.3, 11.4, 11.5, 11.6, 11.7, 11.8, 11.9, 12, 12.1, 12.2, 12.3, 12.4, 12.5, 12.6, 12.7, 12.8, 12.9, 13, 13.1, 13.2, 13.3, 13.4, 13.5, 13.6, 13.7, 13.8, 13.9, or 14.

According to one embodiment, the basic pH is at least 7.1, 7.2, 7.3, 7.4, 7.5, 7.6, 7.7, 7.8, 7.9, 8, 8.1, 8.2, 8.3, 8.4, 8.5, 8.6, 8.7, 8.8, 8.9, 9, 9.1, 9.2, 9.3, 9.4, 9.5, 9.6, 9.7, 9.8, 9.9, 10, 10.1, 10.2, 10.3, 10.4, 10.5, 10.6, 10.7, 10.8, 10.9, 11, 11.1, 11.2, 11.3, 11.4, 11.5, 11.6, 11.7, 11.8, 11.9, 12, 12.1, 12.2, 12.3, 12.4, 12.5, 12.6, 12.7, 12.8, 12.9, 13, 13.1, 13.2, 13.3, 13.4, 13.5, 13.6, 13.7, 13.8, 13.9, or 14.

According to one embodiment, the base includes but is not limited to: sodium hydroxide, potassium hydroxide, ammonium hydroxide, sodium tetraborate decahydrated, sodium ethoxide, lithium hydroxide, rubidium hydroxide, cesium hydroxide, magnesium hydroxide, calcium hydroxide, strontium hydroxide, barium hydroxide, imidazole, methylamine, potassium tert-butoxide, ammonium pyridine, a tetra-alkylammonium hydroxide such as for example tetramethylammonium hydroxide, tetraethylammonium hydroxide, tetrapropylammonium hydroxide and tetrabutylammonium hydroxide, or a mixture thereof.

According to one embodiment, the acidic aqueous solution has a pH lower than 7.

According to one embodiment, the acidic pH is lower than 7.

According to one embodiment, the acidic aqueous solution has a pH of at least 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5, 6.6, 6.7, 6.8, or 6.9.

According to one embodiment, the acidic pH is at least 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5, 6.6, 6.7, 6.8, or 6.9.

According to one embodiment, the acid includes but is not limited to: acetic acid, hydrochloric acid, hydrobromic acid, hydroiodic acid, hydrofluoric acid, sulfuric acid, nitric acid, boric acid, oxalic acid, maleic acid, lipoic acid, urocanic acid, 3-mercaptopropionic acid, phosphonic acid such as for example butylphosphonic acid, octylphosphonic acid and dodecylphosphonic acid, or a mixture thereof.

According to one embodiment, the nanoparticles 3 may be aligned under a magnetic field or an electrical field prior or during the method of the invention. In this embodiment, the nanoparticles 3 can act as magnets if said nanoparticles are ferromagnetic; or the resulting particles 1 can emit a polarized light if the nanoparticles 3 are luminescent.

According to one embodiment, the at least one precursor comprised in solution A is subjected to hydrolysis in an acidic, basic or neutral solution.

According to one embodiment, the optional hydrolysis is controlled to the extent that the quantity of water present in the reaction medium is solely due to the addition of water which is introduced voluntarily.

According to one embodiment, the optional hydrolysis is partial or complete.

According to one embodiment, the optional hydrolysis is performed in a humid atmosphere.

According to one embodiment, the optional hydrolysis is performed in an anhydrous atmosphere. In this embodiment, the atmosphere of optional hydrolysis comprises no humidity.

According to one embodiment, the temperature of optional hydrolysis is at least −50° C., −40° C., −30° C., −20° C., −10° C., 0° C., 10° C., 20° C., 30° C., 40° C., 50° C., 60° C., 70° C., 80° C., 90° C., 100° C., 110° C., 120° C., 130° C., 140° C., 150° C., 160° C., 170° C., 180° C., 190° C., or 200° C.

According to one embodiment, the time of optional hydrolysis is at least 1 sec, 2 sec, 3 sec, 4 sec, 5 sec, 6 sec, 7 sec, 8 sec, 9 sec, 10 sec, 15 sec, 20 sec, 25 sec, 30 sec, 35 sec, 40 sec, 45 sec, 50 sec, 55 sec, 60 sec, 1.5 min, 2 min, 2.5 min, 3 min, 3.5 min, 4 min, 4.5 min, 5 min, 5.5 min, 6 min, 6.5 min, 7 min, 7.5 min, 8 min, 8.5 min, 9 min, 9.5 min, 10 min, 11 min, 12 min, 13 min, 14 min, 15 min, 16 min, 17 min, 18 min, 19 min, 20 min, 21 min, 22 min, 23 min, 24 min, 25 min, 26 min, 27 min, 28 min, 29 min, 30 min, 31 min, 32 min, 33 min, 34 min, 35 min, 36 min, 37 min, 38 min, 39 min, 40 min, 41 min, 42 min, 43 min, 44 min, 45 min, 46 min, 47 min, 48 min, 49 min, 50 min, 51 min, 52 min, 53 min, 54 min, 55 min, 56 min, 57 min, 58 min, 59 min, 1 h, 6 h, 12 h, 18 h, 24 h, 30 h, 36 h, 42 h, 48 h, 54 h, 60 h, 66 h, 72 h, 78 h, 84 h, 90 h, 96 h, 102 h, 108 h, 114 h, 120 h, 126 h, 132 h, 138 h, 144 h, 150 h, 156 h, 162 h, 168 h, 8 days, 9 days, 10 days, 11 days, 12 days, 13 days, 14 days, 15 days, 16 days, 17 days, 18 days, 19 days, 20 days, 21 days, 22 days, 23 days, 24 days, 25 days, 26 days, 27 days, 28 days, 29 days, or 30 days.

According to one embodiment, the means for forming droplets is a droplets former.

According to one embodiment, the means for forming droplets is configured to produce droplets as described hereabove.

According to one embodiment, the means for forming droplets comprises an atomizer.

According to one embodiment, the means for forming droplets is spray-drying or spray-pyrolysis.

According to one embodiment, the means for forming droplets comprises an ultrasound dispenser, or a drop by drop delivering system using gravity, centrifuge force or static electricity.

According to one embodiment, the means for forming droplets comprises a tube or a cylinder.

Figure 9:
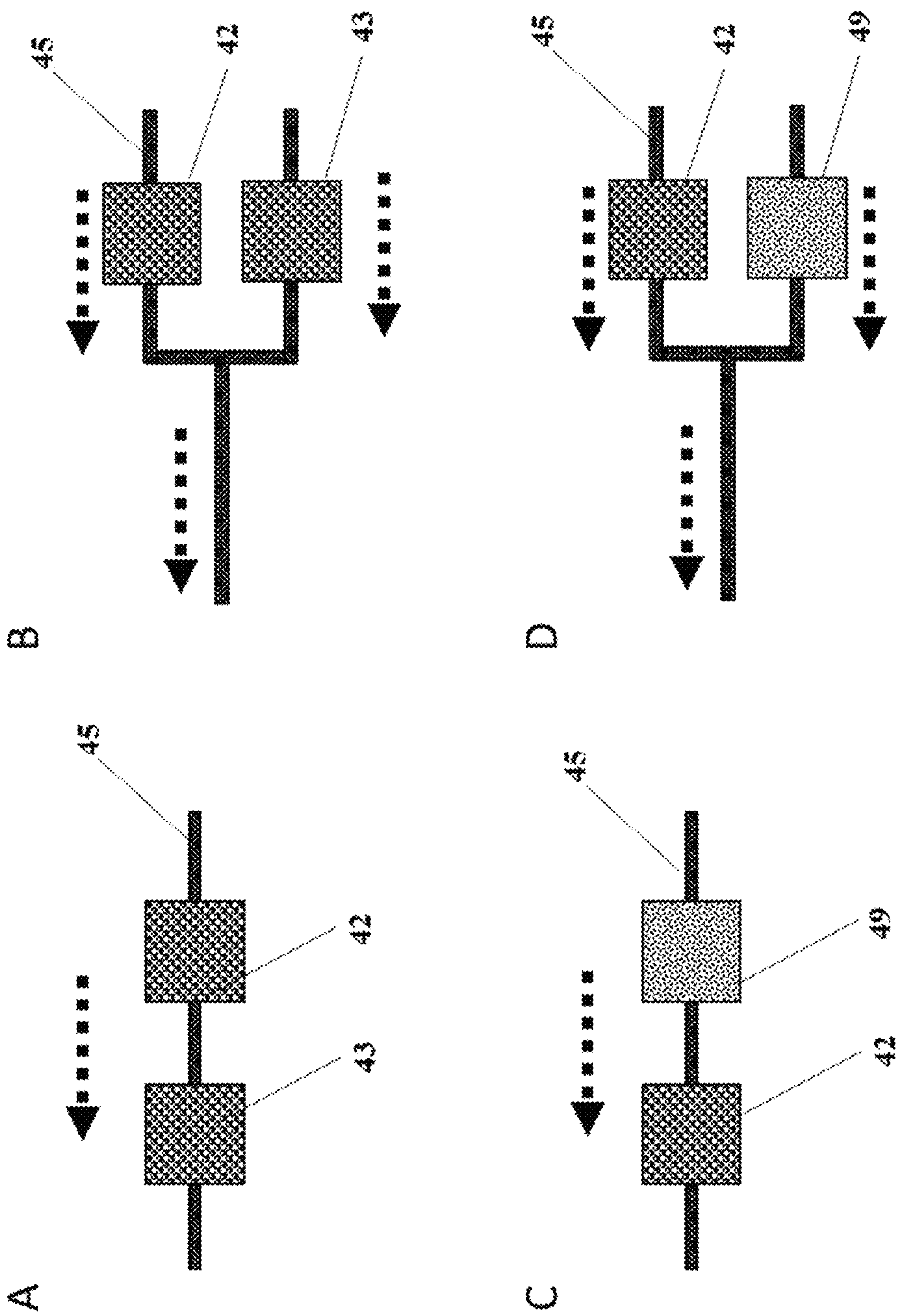
FIG. 9 illustrates a first means for forming droplets 42 of a first solution and a second means for forming droplets 43 of a second solution.

According to one embodiment, illustrated in FIG. 9A, the means for forming droplets (42, 43) are located and are working in a series.

According to one embodiment, illustrated in FIG. 9B, the means for forming droplets (42, 43) are located and are working in parallel.

According to one embodiment, the means for forming droplets (42, 43) do not face each other.

According to one embodiment, the means for forming droplets (42, 43) are not arranged coaxially oppositely.

According to one embodiment, the droplets of solution A and solution B are formed simultaneously.

According to one embodiment, the droplets of solution A are formed prior to the formation of droplets of solution B.

According to one embodiment, the droplets of solution A are formed prior to or after the formation of droplets of solution B.

According to one embodiment, the droplets of solution B are formed prior to the formation of droplets of solution A.

According to one embodiment, the droplets of solution A and the droplets of solution B are formed in the same connecting means.

According to one embodiment, the droplets of solution A and the droplets of solution B are dispersed in a gas flow in the same connecting means.

According to one embodiment, the droplets of solution A and the droplets of solution B are formed in two distinct connecting means.

According to one embodiment, the droplets of solution A and the droplets of solution B are dispersed in a gas flow in two distinct connecting means.

According to one embodiment, the droplets are spherical.

According to one embodiment, the droplets are polydisperse.

According to one embodiment, the droplets are monodisperse.

According to one embodiment, the size of the particles 1 is correlated to the diameter of the droplets. The smaller the size of the droplets, the smaller the size of the resulting particles 1.

According to one embodiment, the size of the particles 1 is smaller than the diameter of the droplets.

According to one embodiment, the droplets have a diameter of at least 10 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 50 μm, 100 μm, 150 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.5 cm, or 2 cm.

According to one embodiment, the droplets are dispersed in a gas flow, wherein the gas includes but is not limited to: air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the gas flow has a rate ranging from 0.01 to $1\times10^{10}$ $cm^3/s$.

According to one embodiment, the gas flow has a rate of at least 0.01 $cm^3$/s, 0.02 $cm^3$/s, 0.03 $cm^3$/s, 0.04 $cm^3$/s, 0.05 $cm^3$/s, 0.06 $cm^3$/s, 0.07 $cm^3$/s, 0.08 $cm^3$/s, 0.09 $cm^3$/s, 0.1 $cm^3$/s, 0.15 $cm^3$/s, 0.25 $cm^3$/s, 0.3 $cm^3$/s, 0.35 $cm^3$/s, 0.4 $cm^3$/s, 0.45 $cm^3$/s, 0.5 $cm^3$/s, 0.55 $cm^3$/s, 0.6 $cm^3$/s, 0.65 $cm^3$/s, 0.7 $cm^3$/s, 0.75 $cm^3$/s, 0.8 $cm^3$/s, 0.85 $cm^3$/s, 0.9 $cm^3$/s, 0.95 $cm^3$/s, 1 $cm^3$/s, 1.5 $cm^3$/s, 2 $cm^3$/s, 2.5 $cm^3$/s, 3 $cm^3$/s, 3.5 $cm^3$/s, 4 $cm^3$/s, 4.5 $cm^3$/s, 5 $cm^3$/s, 5.5 $cm^3$/s, 6 $cm^3$/s, 6.5 $cm^3$/s, 7 $cm^3$/s, 7.5 $cm^3$/s, 8 $cm^3$/s, 8.5 $cm^3$/s, 9 $cm^3$/s, 9.5 $cm^3$/s, 10 $cm^3$/s, 15 $cm^3$/s, 20 $cm^3$/s, 25 $cm^3$/s, 30 $cm^3$/s, 35 $cm^3$/s, 40 $cm^3$/s, 45 $cm^3$/s, 50 $cm^3$/s, 55 $cm^3$/s, 60 $cm^3$/s, 65 $cm^3$/s, 70 $cm^3$/s, 75 $cm^3$/s, 80 $cm^3$/s, 85 $cm^3$/s, 90 $cm^3$/s, 95 $cm^3$/s, 100 $cm^3$/s, $5\times10^2$ $cm^3$/s, $1\times10^3$ $cm^3$/s, $5\times10^3$ $cm^3$/s, $1\times10^4$ $cm^3$/s, $5\times10^4$ $cm^3$/s, $1\times10^5$ $cm^3$/s, $5\times10^5$ $cm^3$/s, or $1\times10^6$ $cm^3$/s.

According to one embodiment, the gas inlet pressure is at least 0, 0.5, 1, 1.5, 2, 2.5, 3, 3.5, 4, 4.5, 5, 5.5, 6, 6.5, 7, 7.5, 8, 8.5, 9, 9.5, or 10 bar.

According to one embodiment, the droplets are heated at a temperature sufficient to evaporate the solvent from the said droplets.

According to one embodiment, the droplets are heated at least at 0° C., 10° C., 15° C., 20° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are heated at less than 0° C., 10° C., 15° C., 20° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C. 1200° C. 1250° C. 1300° C. 1350° C., or 1400° C.

According to one embodiment, the droplets are dried at least at 0° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are dried at less than 0° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are not heated.

According to one embodiment, the time of heating step is at least 0.001 seconds, 0.002 seconds, 0.003 seconds, 0.004 seconds, 0.005 seconds, 0.006 seconds, 0.007 seconds, 0.008 seconds, 0.009 seconds, 0.01 second, 0.02 seconds, 0.03 seconds, 0.04 seconds, 0.05 seconds, 0.06 seconds, 0.07 seconds, 0.08 seconds, 0.09 seconds, 0.1 seconds, 0.2 seconds, 0.3 seconds, 0.4 seconds, 0.5 seconds, 1 second, 1.5 seconds, 2 seconds, 2.5 seconds, 3 seconds, 3.5 seconds, 4 seconds, 4.5 seconds, 5 seconds, 5.5 seconds, 6 seconds, 6.5 seconds, 7 seconds, 7.5 seconds, 8 seconds, 8.5 seconds, 9 seconds, 9.5 seconds, 10 seconds, 10.5 seconds, 11 seconds, 11.5 seconds, 12 seconds, 12.5 seconds, 13 seconds, 13.5 seconds, 14 seconds, 14.5 seconds, 15 seconds, 15.5 seconds, 16 seconds, 16.5 seconds, 17 seconds, 17.5 seconds, 18 seconds, 18.5 seconds, 19 seconds, 19.5 seconds, 20 seconds, 21 seconds, 22 seconds, 23 seconds, 24 seconds, 25 seconds, 26 seconds, 27 seconds, 28 seconds, 29 seconds, 30 seconds, 31 seconds, 32 seconds, 33 seconds, 34 seconds, 35 seconds, 36 seconds, 37 seconds, 38 seconds, 39 seconds, 40 seconds, 41 seconds, 42 seconds, 43 seconds, 44 seconds, 45 seconds, 46 seconds, 47 seconds, 48 seconds, 49 seconds, 50 seconds, 51 seconds, 52 seconds, 53 seconds, 54 seconds, 55 seconds, 56 seconds, 57 seconds, 58 seconds, 59 seconds, or 60 seconds.

According to one embodiment, the droplets are heated using a flame.

According to one embodiment, the droplets are heated using a heat gun.

According to one embodiment, the heating step takes place in a tubular furnace.

According to one embodiment, the particles 1 are cooled down at a temperature inferior to the heating temperature.

According to one embodiment, the particles 1 are cooled down at a temperature of at least −200° C., −180° C., −160° C., −140° C., −120° C., −100° C., −80° C., −60° C., −40° C., −20° C., 0° C., 20° C., 40° C., 60° C., 80° C., or 100° C.

According to one embodiment, the cooling step is fact and the time of cooling step is at least 0.1° C./s, 1° C./s, 10° C./sec, 50° C./sec, 100° C./sec, 150° C./sec, 200° C./sec, 250° C./sec, 300° C./sec, 350° C./sec, 400° C./sec, 450° C./sec, 500° C./sec, 550° C./sec, 600° C./sec, 650° C./sec, 700° C./sec, 750° C./sec, 800° C./sec, 850° C./sec, 900° C./sec, 950° C./sec, or 1000° C./sec.

According to one embodiment, the particles 1 are not separated depending on their size and are collected using a unique membrane filter with a pore size ranging from 1 nm to 300 μm.

According to one embodiment, the particles 1 are not separated depending on their size and are collected using at least two membrane filters with a pore size ranging from 1 nm to 300 μm.

According to one embodiment, the particles 1 are separated and collected depending on their size using at least two successive membrane filters with different pore sizes ranging from 1 nm to 300 μm.

According to one embodiment, the membrane filter includes but is not limited to: hydrophobic polytetrafluoroethylene, hydrophilic polytetrafluoroethylene, polyethersulfone, nylon, cellulose, glass fibers, polycarbonate, polypropylene, polyvinyl chloride, polyvinylidene fluoride, silver, polyolefin, polypropylene prefilter, or a mixture thereof.

According to one embodiment, the particles 1 are collected as powder from the membrane filter by scrubbing the membrane filter.

According to one embodiment, the particles 1 are collected as powder on a conveyor belt used as membrane filter. In this embodiment, said conveyor belt is activated to collect the powder continuously during the method by scrubbing said conveyor belt.

According to one embodiment, the conveyor belt used as membrane filter has a pore size ranging from 1 nm to 300 μm.

According to one embodiment, the particles 1 are collected from the membrane filter by sonicating said membrane filter in an organic solvent.

According to one embodiment, the particles 1 are collected from the membrane filter by sonicating said membrane filter in an aqueous solvent.

According to one embodiment, the particles 1 are collected from the membrane filter by sonicating said membrane filter in a polar solvent.

According to one embodiment, the particles 1 are collected from the membrane filter by sonicating said membrane filter in an apolar solvent.

According to one embodiment, the particles 1 are separated and collected depending on their size.

According to one embodiment, the particles 1 are separated and collected depending on their loading charge.

According to one embodiment, the particles 1 are separated and collected depending on their packing fraction.

According to one embodiment, the particles 1 are separated and collected depending on their chemical composition.

According to one embodiment, the particles 1 are separated and collected depending on their specific property.

According to one embodiment, the particles 1 are separated and collected depending on their size using a temperature induced separation, or magnetic induced separation.

According to one embodiment, the particles 1 are separated and collected depending on their size using an electrostatic precipitator.

According to one embodiment, the particles 1 are separated and collected depending on their size using a sonic or gravitational dust collector.

According to one embodiment, the particles 1 are separated depending on their size by using a cyclonic separation.

According to one embodiment, the particles 1 are collected in a spiral-shaped tube. In this embodiment, the particles 1 will deposit on the inner walls of said tube, then the particles 1 can be recovered by the introduction of an organic or aqueous solvent into said tube.

According to one embodiment, the particles 1 are collected in an aqueous solution containing potassium ions.

According to one embodiment, the particles 1 are collected in an aqueous solution.

According to one embodiment, the particles 1 are collected in an organic solution.

According to one embodiment, the particles 1 are collected in a polar solvent.

According to one embodiment, the particles 1 are collected in an apolar solvent.

According to one embodiment, the particles 1 are collected onto a support comprising a material such as for example silica, quartz, silicon, gold, copper, $Al_2O_3$, ZnO, $SnO_2$, MgO, GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, or boron nitride.

In one embodiment, the support is reflective.

In one embodiment, the support comprises a material allowing to reflect the light such as for example a metal like aluminium or silver, a glass, a polymer.

In one embodiment, the support is thermally conductive.

According to one embodiment, the support has a thermal conductivity at standard conditions ranging from 0.5 to 450 W/(m·K), preferably from 1 to 200 W/(m·K), more preferably from 10 to 150 W/(m·K).

According to one embodiment, the support has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the substrate comprises Au, Ag, Pt, Ru, Ni, Co, Cr, Cu, Sn, Rh Pd, Mn, Ti or a mixture thereof.

According to one embodiment, the substrate comprises silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

In one embodiment, the support can be a substrate, a LED, a LED array, a vessel, a tube or a container. Preferably the support is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the particles 1 are suspended in an inert gas such as He, Ne, Ar, Kr, Xe or $N_2$.

According to one embodiment, the particles 1 are collected onto a functionalized support.

According to one embodiment, the functionalized support is functionalized with a specific-binding component, wherein said specific-binding component includes but is not limited to: antigens, steroids, vitamins, drugs, haptens, metabolites, toxins, environmental pollutants, amino acids, peptides, proteins, antibodies, polysaccharides, nucleotides, nucleosides, oligonucleotides, psoralens, hormones, nucleic acids, nucleic acid polymers, carbohydrates, lipids, phospholipids, lipoproteins, lipopolysaccharides, liposomes, lipophilic polymers, synthetic polymers, polymeric microparticles, biological cells, virus and combinations thereof. Preferred peptides include, but are not limited to: neuropeptides, cytokines, toxins, protease substrates, and protein kinase substrates. Preferred protein conjugates include enzymes, antibodies, lectins, glycoproteins, histones, albumins, lipoproteins, avidin, streptavidin, protein A, protein G, phycobiliproteins and other fluorescent proteins, hormones, toxins and growth factors. Preferred nucleic acid polymers are single- or multi-stranded, natural or synthetic DNA or RNA oligonucleotides, or DNA/RNA hybrids, or incorporating an unusual linker such as morpholine derivatized phosphides, or peptide nucleic acids such as N-(2-aminoethyl)glycine units, where the nucleic acid contains fewer than 50 nucleotides, more typically fewer than 25 nucleotides. The functionalization of the functionalized support can be made using techniques known in the art.

According to one embodiment, the particles 1 are dispersed in water.

According to one embodiment, the particles 1 are dispersed in an organic solvent, wherein said organic solvent includes but is not limited to: pentane, hexane, heptane, octane, decane, dodecane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol or a mixture thereof.

According to one embodiment, the particles 1 are sonicated in a solution. This embodiment allows dispersion of said particles 1 in solution.

According to one embodiment, the particles 1 are dispersed in a solution comprising at least one surfactant as described hereabove. This embodiment prevents the aggregation of said particles 1 in solution.

According to one embodiment, the at least one colloidal suspension comprising a plurality of nanoparticles 3 has a concentration in said nanoparticles 3 of at least 0.001%, 0.002%, 0.003%, 0.004%, 0.005%, 0.006%, 0.007%, 0.008%, 0.009%, 0.01%, 0.02%, 0.03%, 0.04%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95% by weight.

According to one embodiment, nanoparticles 3 are not synthetized in a particle 1 in situ during the method.

According to one embodiment, the particle 1 comprises a plurality of nanoparticles 3 encapsulated in an inorganic material 2 (as illustrated in FIG. 1).

According to one embodiment, the at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine is a precursor for the inorganic material 2.

According to one embodiment, the inorganic material 2 is physically and chemically stable under various conditions. In this embodiment, the inorganic material 2 is sufficiently robust to withstand the conditions to which the particle 1 will be subjected.

According to one embodiment, the inorganic material 2 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the particle 1 will be subjected.

According to one embodiment, the inorganic material 2 is physically and chemically stable under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the particle 1 will be subjected.

According to one embodiment, the inorganic material 2 is physically and chemically stable under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the particle 1 will be subjected.

According to one embodiment, the inorganic material 2 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the particle 1 will be subjected.

According to one embodiment, the inorganic material 2 is physically and chemically stable under 0%, 10%, 20%, 30%, 40%, 50%, 55%, 60%, 65%, 70%, 75%, 80%, 85%, 90%, 95%, or 99% of humidity and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the particle 1 will be subjected.

According to one embodiment, the inorganic material 2 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the particle 1 will be subjected.

According to one embodiment, the inorganic material 2 acts as a barrier against oxidation of the nanoparticles 3.

According to one embodiment, the inorganic material 2 is stable under acidic conditions, i.e. at pH inferior or equal to 7. In this embodiment, the inorganic material 2 is sufficiently robust to withstand acidic conditions, meaning that the properties of the particle 1 are preserved under said conditions.

According to one embodiment, the inorganic material 2 is stable under basic conditions, i.e. at pH superior to 7. In this embodiment, the inorganic material 2 is sufficiently robust to withstand basic conditions, meaning that the properties of the particle 1 are preserved under said conditions.

According to one embodiment, the inorganic material 2 is thermally conductive.

According to one embodiment, the inorganic material 2 has a thermal conductivity at standard conditions ranging from 0.1 to 450 W/(m·K), preferably from 1 to 200 W/(m·K), more preferably from 10 to 150 W/(m·K).

According to one embodiment, the inorganic material 2 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5

W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the inorganic material 2 may be measured for example by steady-state methods or transient methods.

According to one embodiment, the inorganic material 2 is not thermally conductive.

According to one embodiment, the inorganic material 2 comprises a refractory material.

According to one embodiment, the inorganic material 2 does not comprise a refractory material.

According to one embodiment, the inorganic material 2 is electrically insulator. In this embodiment, the quenching of fluorescent properties for fluorescent nanoparticles encapsulated in the inorganic material 2 is prevented when it is due to electron transport. In this embodiment, the particle 1 may be used as an electrical insulator material exhibiting the same properties as the nanoparticles 3 encapsulated in the inorganic material 2.

According to one embodiment, the inorganic material 2 is electrically conductive. This embodiment is particularly advantageous for an application of the particle 1 in photovoltaics or LEDs.

According to one embodiment, the inorganic material 2 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the inorganic material 2 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the inorganic material 2 may be measured for example with an impedance spectrometer.

According to one embodiment, the inorganic material 2 has a bandgap superior or equal to 3 eV.

Having a bandgap superior or equal to 3 eV, the inorganic material 2 is optically transparent to UV and blue light.

According to one embodiment, the inorganic material 2 have a bandgap of at least 3.0 eV, 3.1 eV, 3.2 eV, 3.3 eV, 3.4 eV, 3.5 eV, 3.6 eV, 3.7 eV, 3.8 eV, 3.9 eV, 4.0 eV, 4.1 eV, 4.2 eV, 4.3 eV, 4.4 eV, 4.5 eV, 4.6 eV, 4.7 eV, 4.8 eV, 4.9 eV, 5.0 eV, 5.1 eV, 5.2 eV, 5.3 eV, 5.4 eV or 5.5 eV.

According to one embodiment, the inorganic material 2 has an extinction coefficient less or equal to $15\times10^{-5}$ at 460 nm.

In one embodiment, the extinction coefficient is measured by an absorbance measuring technique such as absorbance spectroscopy or any other method known in the art.

In one embodiment, the extinction coefficient is measured by an absorbance measurement divided by the length of the path light passing through the sample.

According to one embodiment, the inorganic material 2 is amorphous.

According to one embodiment, the inorganic material 2 is crystalline.

According to one embodiment, the inorganic material 2 is totally crystalline.

According to one embodiment, the inorganic material 2 is partially crystalline.

According to one embodiment, the inorganic material 2 is monocrystalline.

According to one embodiment, the inorganic material 2 is polycrystalline. In this embodiment, the inorganic material 2 comprises at least one grain boundary.

According to one embodiment, the inorganic material 2 is hydrophobic.

According to one embodiment, the inorganic material 2 is hydrophilic.

According to one embodiment, the inorganic material 2 is porous.

According to one embodiment, the inorganic material 2 is considered porous when the quantity adsorbed by the particles 1 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the inorganic material 2 can be hexagonal, vermicular or cubic.

According to one embodiment, the organized porosity of the inorganic material 2 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the inorganic material 2 is not porous.

According to one embodiment, the inorganic material 2 is considered non-porous when the quantity adsorbed by the particles 1 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the inorganic material 2 does not comprise pores or cavities.

According to one embodiment, the inorganic material 2 is permeable. In this embodiment, permeation of outer molecular species, gas or liquid in the inorganic material 2 is possible.

According to one embodiment, the permeable inorganic material 2 has an intrinsic permeability to fluids higher or equal to $10^{-20}$ cm$^2$, $10^{-19}$ cm$^2$, $10^{-18}$ cm$^2$, $10^{-17}$ cm$^2$, $10^{-16}$ cm$^2$, $10^{-15}$ cm$^2$, $10^{-14}$ cm$^2$, $10^{-13}$ cm$^2$, $10^{-12}$ cm$^2$, $10^{-11}$ cm$^2$, $10^{-10}$ cm$^2$, $10^{-9}$ cm$^2$, $10^{-8}$ cm$^2$, $10^{-7}$ cm$^2$, $10^{-6}$ cm$^2$, $10^{-5}$ cm$^2$, $10^{-4}$ cm$^2$, or $10^{-3}$ cm$^2$.

According to one embodiment, the inorganic material 2 is impermeable to outer molecular species, gas or liquid. In this embodiment, the inorganic material 2 limits or prevents the degradation of the chemical and physical properties of the nanoparticles 3 from molecular oxygen, ozone, water and/or high temperature.

According to one embodiment, the impermeable inorganic material 2 has an intrinsic permeability to fluids less or equal to $10^{-11}$ cm$^2$, $10^{-12}$ cm$^2$, $10^{-13}$ cm$^2$, $10^{-14}$ cm$^2$, $10^{-15}$ cm$^2$, $10^{-16}$ cm$^2$, $10^{-17}$ cm$^2$, $10^{-18}$ cm$^2$, $10^{-19}$ cm$^2$, or $10^{-20}$ cm$^2$.

According to one embodiment, the inorganic material 2 limits or prevents the diffusion of outer molecular species or fluids (liquid or gas) into said inorganic material 2.

According to one embodiment, the specific property of the nanoparticles 3 is preserved after encapsulation in the particle 1.

According to one embodiment, the photoluminescence of the nanoparticles 3 is preserved after encapsulation in the particle 1.

According to one embodiment, the inorganic material 2 has a density ranging from 1 to 10, preferably the inorganic material 2 has a density ranging from 3 to 10 g/cm$^3$.

According to one embodiment, the inorganic material 2 is optically transparent, i.e. the inorganic material 2 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the inorganic material 2 does not absorb all incident light allowing the nanoparticles 3 to absorb all the incident light, and/or the inorganic material 2 does not absorb the light emitted by the nanoparticles 3 allowing to said light emitted to be transmitted through the inorganic material 2.

According to one embodiment, the inorganic material 2 is not optically transparent, i.e. the inorganic material 2 absorbs light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the inorganic material 2 absorbs part of the incident light allowing the nanoparticles 3 to absorb only a part of the incident light, and/or the inorganic material 2 absorbs part of the light emitted by the nanoparticles 3 allowing said light emitted to be partially transmitted through the inorganic material 2.

According to one embodiment, the inorganic material 2 transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the inorganic material 2 transmits a part of the incident light and emits at least one secondary light. In this embodiment, the resulting light is a combination of the remaining transmitted incident light.

According to one embodiment, the inorganic material 2 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the inorganic material 2 absorbs the incident light with wavelength lower than 460 nm.

According to one embodiment, the inorganic material 2 has an extinction coefficient less or equal to 1×10–$^5$, $1.1\times10^{-5}$, $1.2\times10^{-5}$, $1.3\times10^{-5}$, $1.4\times10^{-5}$, $1.5\times10^{-5}$, $1.6\times10^{-5}$, $1.7\times10^{-5}$, $1.8\times10^{-5}$, $1.9\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, $10\times10^{-5}$, $11\times10^{-5}$, $12\times10^{-5}$, $13\times10^{-5}$, $14\times10^{-5}$, $15\times10^{-5}$, $16\times10^{-5}$, $17\times10^{-5}$, $18\times10^{-5}$, $19\times10^{-5}$, $20\times10^{-5}$, $21\times10^{-5}$, $22\times10^{-5}$, $23\times10^{-5}$, $24\times10^{-5}$, or $25\times10^{-5}$ at 460 nm.

According to one embodiment, the inorganic material 2 has an attenuation coefficient less or equal to $1\times10^{-2}$ cm$^{-1}$, $1\times10^{-1}$ cm$^{-1}$, $0.5\times10^{-1}$ cm$^{-1}$, 0.1 cm$^{-1}$, 0.2 cm$^{-1}$, 0.3 cm$^{-1}$, 0.4 cm$^{-1}$, 0.5 cm$^{-1}$, 0.6 cm$^{-1}$, 0.7 cm$^{-1}$, 0.8 cm$^{-1}$, 0.9 cm$^{-1}$, 1 cm$^{-1}$, 1.1 cm$^{-1}$, 1.2 cm$^{-1}$, 1.3 cm$^{-1}$, 1.4 cm$^{-1}$, 1.5 cm$^{-1}$, 1.6 cm$^{-1}$, 1.7 cm$^{-1}$, 1.8 cm$^{-1}$, 1.9 cm$^{-1}$, 2.0 cm$^{-1}$, 2.5 cm$^{-1}$, 3.0 cm$^{-1}$, 3.5 cm$^{-1}$, 4.0 cm$^{-1}$, 4.5 cm$^{-1}$, 5.0 cm$^{-1}$, 5.5 cm$^{-1}$, 6.0 cm$^{-1}$, 6.5 cm$^{-1}$, 7.0 cm$^{-1}$, 7.5 cm$^{-1}$, 8.0 cm$^{-1}$, 8.5 cm$^{-1}$, 9.0 cm$^{-1}$, 9.5 cm$^{-1}$, 10 cm$^{-1}$, 15 cm$^{-1}$, 20 cm$^{-1}$, 25 cm$^{-1}$, or 30 cm$^{-1}$ at 460 nm.

According to one embodiment, the inorganic material 2 has an attenuation coefficient less or equal to $1\times10^{-2}$ cm$^{-1}$, $1\times10^{-1}$ cm$^{-1}$, $0.5\times10^{-1}$ cm$^{-1}$, 0.1 cm$^{-1}$, 0.2 cm$^{-1}$, 0.3 cm$^{-1}$, 0.4 cm$^{-1}$, 0.5 cm$^{-1}$, 0.6 cm$^{-1}$, 0.7 cm$^{-1}$, 0.8 cm$^{-1}$, 0.9 cm$^{-1}$, 1 cm$^{-1}$, 1.1 cm$^{-1}$, 1.2 cm$^{-1}$, 1.3 cm$^{-1}$, 1.4 cm$^{-1}$, 1.5 cm$^{-1}$, 1.6 cm$^{-1}$, 1.7 cm$^{-1}$, 1.8 cm$^{-1}$, 1.9 cm$^{-1}$, 2.0 cm$^{-1}$, 2.5 cm$^{-1}$, 3.0 cm$^{-1}$, 3.5 cm$^{-1}$, 4.0 cm$^{-1}$, 4.5 cm$^{-1}$, 5.0 cm$^{-1}$, 5.5 cm$^{-1}$, 6.0 cm$^{-1}$, 6.5 cm$^{-1}$, 7.0 cm$^{-1}$, 7.5 cm$^{-1}$, 8.0 cm$^{-1}$, 8.5 cm$^{-1}$, 9.0 cm$^{-1}$, 9.5 cm$^{-1}$, 10 cm$^{-1}$, 15 cm$^{-1}$, 20 cm$^{-1}$, 25 cm$^{-1}$, or 30 cm$^{-1}$ at 450 nm.

According to one embodiment, the inorganic material 2 has an optical absorption cross section less or equal to $1.10^{-35}$ cm$^2$, $1.10^{-34}$ cm$^2$, $1.10^{-33}$ cm$^2$, $1.10^{-32}$ cm$^2$, $1.10^{-31}$ cm$^2$, $1.10^{-30}$ cm$^2$, $1.10^{-29}$ cm$^2$ $1.10^{-28}$ cm$^2$, $1.10^{-27}$ cm$^2$, $1.10^{-26}$ cm$^2$, $1.10^{-25}$ cm$^2$, $1.10^{-24}$ cm$^2$, $1.10^{-23}$ cm$^2$ $1.10^{-22}$ cm$^2$ $1.10^{-21}$ cm$^2$, $1.10^{-20}$ cm$^2$, $1.10^{-19}$ cm$^2$, $1.10^{-18}$ cm$^2$, $1.10^{-17}$ cm$^2$, $1.10^{-16}$ cm$^2$, $1.10^{-15}$ cm$^2$ $1.10^{-14}$ cm$^2$, $1.10^{-13}$ cm$^2$, $1.10^{-12}$ cm$^2$, $1.10^{-11}$ cm$^2$, $1.10^{-10}$ cm$^2$, $1.10^{-9}$ cm$^2$, $1.10^{-8}$ cm$^2$, $1.10^{-7}$ cm$^2$, $1.10^{-6}$ cm$^2$, $1.10^{-5}$ cm$^2$, $1.10^{-4}$ cm$^2$, $1.10^{-3}$ cm$^2$, $1.10^{-2}$ cm$^2$ or $1.10^{-1}$ cm$^2$ at 460 nm.

According to one embodiment, the inorganic material 2 does not comprise organic molecules, organic groups or polymer chains.

According to one embodiment, the inorganic material 2 does not comprise polymers.

According to one embodiment, the inorganic material 2 comprises inorganic polymers.

According to one embodiment, the inorganic material 2 is composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said inorganic material 2 is prepared using protocols known to the person skilled in the art.

According to one embodiment, the inorganic material 2 is composed of a material selected in the group of metals, halides, chalcogenides, phosphides, sulfides, metalloids, metallic alloys, ceramics such as for example oxides, carbides, nitrides, enamels, ceramics, stones, precious stones, pigments, and/or cements. Said inorganic material 2 is prepared using protocols known to the person skilled in the art.

According to one embodiment, the inorganic material 2 is selected from the group consisting of oxide materials, semiconductor materials, wide-bandgap semiconductor materials or a mixture thereof.

According to one embodiment, examples of semiconductor materials include but are not limited to: III-V semiconductors, II-VI semiconductors, or a mixture thereof.

According to one embodiment, examples of wide-bandgap semiconductor materials include but are not limited to: silicon carbide SiC, aluminium nitride AlN, gallium nitride GaN, boron nitride BN, or a mixture thereof.

According to one embodiment, the inorganic material 2 comprises or consists of a $ZrO_2/SiO_2$ mixture: $Si_xZr_{1-x}O_2$, wherein $0 \leq x \leq 1$. In this embodiment, the first inorganic material 2 is able to resist to any pH in a range from 0 to 14. This allows for a better protection of the nanoparticles 3.

According to one embodiment, the inorganic material 2 comprises or consists of $Si_{0.8}Zr_{0.2}O_2$.

According to one embodiment, the inorganic material 2 comprises or consists of mixture: $Si_xZr_{1-x}O_z$, wherein $0<x \leq 1$ and $0<z \leq 3$.

According to one embodiment, the inorganic material 2 comprises or consists of a $HfO_2/SiO_2$ mixture: $Si_xHf_{1-x}O_2$, wherein $0<x \leq 1$ and $0<z \leq 3$.

According to one embodiment, the inorganic material 2 comprises or consists of $Si_{0.8}Hf_{0.2}O_2$.

According to one embodiment, a chalcogenide is a chemical compound consisting of at least one chalcogen anion selected in the group of O, S, Se, Te, Po, and at least one or more electropositive element.

According to one embodiment, the metallic inorganic material 2 is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide inorganic material 2 include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide inorganic material 2 include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Th_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide inorganic material 2 include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride inorganic material 2 include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide inorganic material 2 include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide inorganic material 2 include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide inorganic material 2 include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $CO_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide inorganic material 2 include but are not limited to: InP, $Cd_3P_2$, $Zn_3P_2$, AlP, GaP, TlP, or a mixture thereof.

According to one embodiment, examples of metalloid inorganic material 2 include but are not limited to: Si, B, Ge, As, Sb, Te, or a mixture thereof.

According to one embodiment, examples of metallic alloy inorganic material 2 include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the inorganic material 2 comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the ceramic is crystalline or non-crystalline ceramics. According to one embodiment, the ceramic is selected from oxide ceramics and/or non-oxides ceramics, According to one embodiment, the ceramic is selected from pottery, bricks, tiles, cements and/glasses.

According to one embodiment, the stone is selected from agate, aquamarine, amazonite, amber, amethyst, ametrine, angelite, apatite, aragonite, silver, astrophylite, aventurine, azurite, beryk, silicified wood, bronzite, chalcedony, calcite, celestine, chakras, charoite, chiastolite, chrysocolla, chrysoprase, citrine, coral, cornalite, rock crystal, native copper, cyanite, damburite, diamond, dioptase, dolomite, dumordrite, emerald, fluorite, foliage, galene, garnet, heliotrope; hematite, hemimorphite, howlite, hypersthene, iolite, jades, jet, jasper, kunzite, labradorite, lazuli lazuli, larimar, lava, lepidolite, magnetist, magnetite, alachite, marcasite, meteorite, mokaite, moldavite, morganite, mother-of-pearl, obsidian, eye hawk, iron eye, bull's eye, tiger eye, onyx tree, black onyx, opal, gold, peridot, moonstone, star stone, sun stone, pietersite, prehnite, pyrite, blue quartz, smoky quartz, quartz, quatz hematoide, milky quartz, rose quartz, rutile quartz, rhodochrosite, rhodonite, rhyolite, ruby, sapphire, rock salt, selenite, seraphinite, serpentine, shattukite, shiva lingam, shungite, flint, smithsonite, sodalite, stealite, straumatolite, sugilite, tanzanite, topaz, tourmaline watermelon, black tourmaline, turquoise, ulexite, unakite, variscite, zoizite.

According to one embodiment, the inorganic material 2 comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and $x \neq 0$.

According to one embodiment, the inorganic material 2 comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the inorganic material 2 comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the inorganic material 2 comprises a material including but not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof, garnets such as for example $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the inorganic material 2 comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said inorganic material 2.

According to one embodiment, the inorganic material 2 does not comprise inorganic polymers.

According to one embodiment, the inorganic material 2 does not comprise $SiO_2$.

According to one embodiment, the inorganic material 2 does not consist of pure $SiO_2$, i.e. 100% $SiO_2$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, examples of precursors of $SiO_2$ include but are not limited to: tetramethyl orthosilicate, tetraethyl orthosilicate, polydiethyoxysilane, n-alkyltrimethoxylsilanes such as for example n-butyltrimethoxysilane, n-octyltrimethoxylsilane, n-dodecyltrimethoxysilane, n-octadecyltrimethoxysilane, 3-mercaptopropyltrimethoxysilane, 11-mercaptoundecyltrimethoxysilane, 3-aminopropyltrimethoxysilane, 11-aminoundecyltrimethoxysilane, 3-(2-(2-aminoethylamino)ethylamino)propyltrimethoxysilane, 3-(trimethoxysilyl)propyl methacrylate, 3-(aminopropyl)trimethoxysilane, or a mixture thereof.

According to one embodiment, the inorganic material 2 does not consist of pure $Al_2O_3$, i.e. 100% $Al_2O_3$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the inorganic material 2 does not comprise $TiO_2$.

According to one embodiment, the inorganic material 2 does not consist of pure $TiO_2$, i.e. 100% $TiO_2$.

According to one embodiment, the inorganic material 2 does not comprise zeolite.

According to one embodiment, the inorganic material 2 does not consist of pure zeolite, i.e. 100% zeolite.

According to one embodiment, the inorganic material 2 does not comprise glass.

According to one embodiment, the inorganic material 2 does not comprise vitrified glass.

According to one embodiment, the inorganic material 2 comprises an inorganic polymer.

According to one embodiment, the inorganic polymer is a polymer not containing carbon. According to one embodiment, the inorganic polymer is selected from polysilanes, polysiloxanes (or silicones), polythiazyles, polyaluminosilicates, polygermanes, polystannanes, polyborazylenes, polyphosphazenes, polydichlorophosphazenes, polysulfides, polysulfur and/or nitrides. According to one embodiment, the inorganic polymer is a liquid crystal polymer.

According to one embodiment, the inorganic polymer is a natural or synthetic polymer. According to one embodiment, the inorganic polymer is synthetized by inorganic reaction, radical polymerization, polycondensation, polyaddition, or ring opening polymerization (ROP). According to one embodiment, the inorganic polymer is a homopolymer or a copolymer. According to one embodiment, the inorganic polymer is linear, branched, and/or cross-linked. According to one embodiment, the inorganic polymer is amorphous, semi-crystalline or crystalline.

According to one embodiment, the inorganic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the inorganic material 2 comprises additional heteroelements, wherein said additional heteroelements include but are not limited to: Cd, S, Se, Zn, In, Te, Hg, Sn, Cu, N, Ga, Sb, Tl, Mo, Pd, Ce, W, Co, Mn, Si, Ge, B, P, Al, As, Fe, Ti, Zr, Ni, Ca, Na, Ba, K, Mg, Pb, Ag, V, Be, Ir, Sc, Nb, Ta or a mixture thereof. In this embodiment, heteroelements can diffuse in the particle 1 during heating step. They may form nanoclusters inside the particle 1. These elements can limit the degradation of the specific property of said particle 1 during the heating step, and/or drain away the heat if it is a good thermal conductor, and/or evacuate electrical charges.

According to one embodiment, the inorganic material 2 comprises additional heteroelements in small amounts of 0 mole %, 1 mole %, 5 mole %, 10 mole %, 15 mole %, 20 mole %, 25 mole %, 30 mole %, 35 mole %, 40 mole %, 45 mole %, 50 mole % relative to the majority element of said inorganic material 2.

According to one embodiment, the inorganic material 2 comprises $Al_2O_3$, $SiO_2$, $MgO$, $ZnO$, $ZrO_2$, $TiO_2$, $IrO_2$, $SnO_2$, $BaO$, $BaSO_4$, $BeO$, $CaO$, $CeO_2$, $CuO$, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, or $Y_2O_3$ additional nanoparticles. These additional nanoparticles can drain away the heat if it is a good thermal conductor, and/or evacuate electrical charges, and/or scatter an incident light.

According to one embodiment, the inorganic material 2 comprises additional nanoparticles in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight compared to the particle 1.

According to one embodiment, the nanoparticles 3 absorb the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the inorganic material 2 has a refractive index ranging from 1.0 to 3.0, from 1.2 to 2.6, from 1.4 to 2.0 at 450 nm.

According to one embodiment, the inorganic material 2 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 450 nm.

According to one embodiment, the nanoparticles 3 are luminescent nanoparticles.

According to one embodiment, the luminescent nanoparticles are fluorescent nanoparticles.

According to one embodiment, the luminescent nanoparticles are phosphorescent nanoparticles.

According to one embodiment, the luminescent nanoparticles are chemiluminescent nanoparticles.

According to one embodiment, the luminescent nanoparticles are triboluminescent nanoparticles.

According to one embodiment, the luminescent nanoparticles exhibit an emission spectrum with at least one emission peak, wherein said emission peak has a maximum emission wavelength ranging from 400 nm to 50 μm.

According to one embodiment, the luminescent nanoparticles exhibit an emission spectrum with at least one emission peak, wherein said emission peak has a maximum emission wavelength ranging from 400 nm to 500 nm. In this embodiment, the luminescent nanoparticles emit blue light.

According to one embodiment, the luminescent nanoparticles exhibit an emission spectrum with at least one emission peak, wherein said emission peak has a maximum emission wavelength ranging from 500 nm to 560 nm, more preferably ranging from 515 nm to 545 nm. In this embodiment, the luminescent nanoparticles emit green light.

According to one embodiment, the luminescent nanoparticles exhibit an emission spectrum with at least one emission peak, wherein said emission peak has a maximum emission wavelength ranging from 560 nm to 590 nm. In this embodiment, the luminescent nanoparticles emit yellow light.

According to one embodiment, the luminescent nanoparticles exhibit an emission spectrum with at least one emission peak, wherein said emission peak has a maximum emission wavelength ranging from 590 nm to 750 nm, more preferably ranging from 610 nm to 650 nm. In this embodiment, the luminescent nanoparticles emit red light.

According to one embodiment, the luminescent nanoparticles exhibit an emission spectrum with at least one emission peak, wherein said emission peak has a maximum emission wavelength ranging from 750 nm to 50 μm. In this embodiment, the luminescent nanoparticles emit near infrared, mid-infra-red, or infra-red light.

According to one embodiment, the luminescent nanoparticles exhibit emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticles exhibit emission spectra with at least one emission peak having a full width half maximum strictly lower than 90 nm, 80 nm, 70 nm, 60 nm, 50 nm, 40 nm, 30 nm, 25 nm, 20 nm, 15 nm, or 10 nm.

According to one embodiment, the luminescent nanoparticles exhibit emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticles exhibit emission spectra with at least one emission peak having a full width at quarter maximum strictly lower than 90 nm, 80 nm, 70 nm, 60 nm, 50 nm, 40 nm, 30 nm, 25 nm, 20 nm, 15 nm, or 10 nm.

According to one embodiment, the luminescent nanoparticles have a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99%, or 100%.

According to one embodiment, the luminescent nanoparticles have an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

According to one embodiment, the luminescent nanoparticles are semiconductor nanoparticles.

According to one embodiment, the luminescent nanoparticles are semiconductor nanocrystals.

According to one embodiment, the nanoparticles 3 are plasmonic nanoparticles.

According to one embodiment, the nanoparticles 3 are magnetic nanoparticles.

According to one embodiment, the nanoparticles 3 are ferromagnetic nanoparticles.

According to one embodiment, the nanoparticles 3 are paramagnetic nanoparticles.

According to one embodiment, the nanoparticles 3 are superparamagnetic nanoparticles.

According to one embodiment, the nanoparticles 3 are diamagnetic nanoparticles.

According to one embodiment, the nanoparticles 3 are catalytic nanoparticles.

According to one embodiment, the nanoparticles 3 have photovoltaic properties.

According to one embodiment, the nanoparticles 3 are pyro-electric nanoparticles.

According to one embodiment, the nanoparticles 3 are ferro-electric nanoparticles.

According to one embodiment, the nanoparticles 3 are light scattering nanoparticles.

According to one embodiment, the nanoparticles 3 are electrically insulating.

According to one embodiment, the nanoparticles 3 are electrically conductive.

According to one embodiment, the nanoparticles 3 have an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the nanoparticles 3 have an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the nanoparticles 3 may be measured for example with an impedance spectrometer.

According to one embodiment, the nanoparticles 3 are thermally conductive.

According to one embodiment, the nanoparticles 3 have a thermal conductivity at standard conditions ranging from 0.1 to 450 W/(m·K), preferably from 1 to 200 W/(m·K), more preferably from 10 to 150 W/(m·K).

According to one embodiment, the nanoparticles 3 have a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the nanoparticles 3 may be measured by steady-state methods or transient methods.

According to one embodiment, the nanoparticles 3 are thermally insulating.

According to one embodiment, the nanoparticles 3 are local high temperature heating systems.

According to one embodiment, the nanoparticles 3 are dielectric nanoparticles.

According to one embodiment, the nanoparticles 3 are piezoelectric nanoparticles.

According to one embodiment, the ligands attached to the surface of a nanoparticle 3 is in contact with the inorganic material 2. In this embodiment, said nanoparticle 3 is linked to the inorganic material 2 and the electrical charges from said nanoparticle 3 can be evacuated. This prevents reactions at the surface of the nanoparticles 3 that can be due to electrical charges.

According to one embodiment, the nanoparticles 3 are hydrophobic.

According to one embodiment, the nanoparticles 3 are hydrophilic.

According to one embodiment, the nanoparticles 3 are dispersible in aqueous solvents, organic solvents and/or mixture thereof.

According to one embodiment, the nanoparticles 3 have an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the largest dimension of the nanoparticles 3 is at least 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the nanoparticles 3 is at least 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5

μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the nanoparticles 3 is smaller than the largest dimension of said nanoparticle 3 by a factor (aspect ratio) of at least 1.5; at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the nanoparticles 3 are polydisperse.

According to one embodiment, the nanoparticles 3 are monodisperse.

According to one embodiment, the nanoparticles 3 have a narrow size distribution.

According to one embodiment, the size distribution for the smallest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said smallest dimension.

According to one embodiment, the size distribution for the largest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said largest dimension.

According to one embodiment, the nanoparticles 3 are hollow.

According to one embodiment, the nanoparticles 3 are not hollow.

According to one embodiment, the nanoparticles 3 are isotropic.

Figure 2:
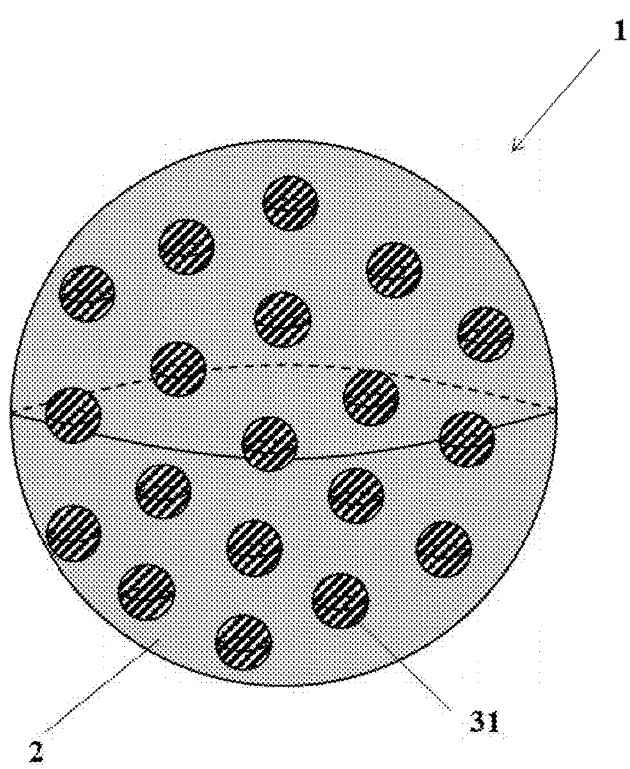
FIG. 2 illustrates a particle 1 comprising a plurality of spherical nanoparticles 31 encapsulated in an inorganic material 2.

According to one embodiment, examples of shape of isotropic nanoparticles 3 include but are not limited to: sphere 31 (as illustrated in FIG. 2), faceted sphere, prism, polyhedron, or cubic shape.

According to one embodiment, the nanoparticles 3 are not spherical.

According to one embodiment, the nanoparticles 3 are anisotropic.

According to one embodiment, examples of shape of anisotropic nanoparticles 3 include but are not limited to: rod, wire, needle, bar, belt, cone, or polyhedron shape.

According to one embodiment, examples of branched shape of anisotropic nanoparticles 3 include but are not limited to: monopod, bipod, tripod, tetrapod, star, or octopod shape.

According to one embodiment, examples of complex shape of anisotropic nanoparticles 3 include but are not limited to: snowflake, flower, thorn, hemisphere, cone, urchin, filamentous particle, biconcave discoid, worm, tree, dendrite, necklace, or chain.

Figure 3:
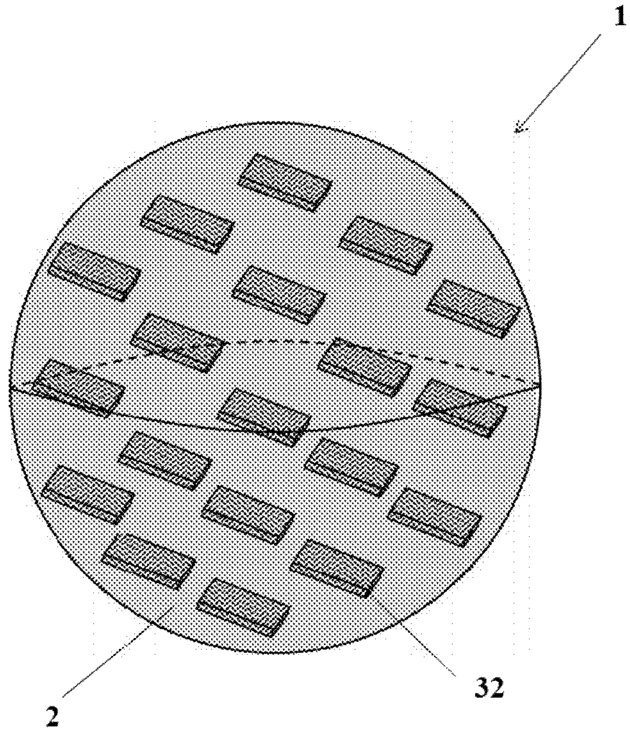
FIG. 3 illustrates a particle 1 comprising a plurality of 2D nanoparticles 32 encapsulated in an inorganic material 2.

According to one embodiment, as illustrated in FIG. 3, the nanoparticles 3 have a 2D shape 32.

According to one embodiment, examples of shape of 2D nanoparticles 32 include but are not limited to: sheet, platelet, plate, ribbon, wall, plate triangle, square, pentagon, hexagon, disk or ring.

According to one embodiment, a nanoplatelet is different from a nanodisk.

According to one embodiment, a nanoplatelet is different from a disk or a nanodisk.

According to one embodiment, nanosheets and nanoplatelets are not disks or nanodisks. In this embodiment, the section along the other dimensions than the thickness (width, length) of said nanosheets or nanoplatelets is square or rectangular, while it is circular or ovoidal for disks or nanodisks.

According to one embodiment, nanosheets and nanoplatelets are not disks or nanodisks. In this embodiment, none of the dimensions of said nanosheets and nanoplatelets can be defined as a diameter nor the size of a semi-major axis and a semi-minor axis contrarily to disks or nanodisks.

According to one embodiment, nanosheets and nanoplatelets are not disks or nanodisks. In this embodiment, the curvature at all points along the other dimensions than the thickness (length, width) of said nanosheets or nanoplatelets is below 10 $\mu m^{-1}$, while the curvature for disks or nanodisks is superior on at least one point.

According to one embodiment, nanosheets and nanoplatelets are not disks or nanodisks. In this embodiment, the curvature at at least one point along the other dimensions than the thickness (length, width) of said nanosheets or nanoplatelets is below 10 $\mu m^{-1}$, while the curvature for disks or nanodisks is superior than 10 $\mu m^{-1}$ at all points.

According to one embodiment, a nanoplatelet is different from a quantum dot, or a spherical nanocrystal. A quantum dot is spherical, thus is has a 3D shape and allow confinement of excitons in all three spatial dimensions, whereas the nanoplatelet has a 2D shape and allow confinement of excitons in one dimension and allow free propagation in the other two dimensions. This results in distinct electronic and optical properties, for example the typical photoluminescence decay time of semiconductor platelets is 1 order of magnitude faster than for spherical quantum dots, and the semiconductor platelets also show an exceptionally narrow optical feature with full width at half maximum (FWHM) much lower than for spherical quantum dots.

According to one embodiment, a nanoplatelet is different from a nanorod or nanowire. A nanorod (or nanowire) has a 1D shape and allow confinement of excitons two spatial dimensions, whereas the nanoplatelet has a 2D shape and allow confinement of excitons in one dimension and allow free propagation in the other two dimensions. This results in distinct electronic and optical properties.

According to one embodiment, to obtain a ROHS compliant particle 1, said particle 1 rather comprises semiconductor nanoplatelets than semiconductor quantum dots. Indeed, a same emission peak position is obtained for semiconductor quantum dots with a diameter d, and semiconductor nanoplatelets with a thickness d/2; thus for the same emission peak position, a semiconductor nanoplatelet comprises less cadmium in weight than a semiconductor quantum dot. Furthermore, if a CdS core is comprised in a core/shell quantum dot or a core/shell (or core/crown) nanoplatelet, then there are more possibilities of shell layers without cadmium in the case of core/shell (or core/crown) nanoplatelet; thus a core/shell (or core/crown) nanoplatelet with a CdS core may comprise less cadmium in weight than a core/shell quantum dot with a CdS core. The lattice difference between CdS and nonCadmium shells is too important for the quantum dot to sustain. Finally, semiconductor nanoplatelets have better absorption properties than semiconductor quantum dots, thus resulting in less cadmium in weight needed in semiconductor nanoplatelets.

According to one embodiment, the nanoparticles 3 are atomically flat. In this embodiment, the atomically flat nanoparticles 3 may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

Figure 5:
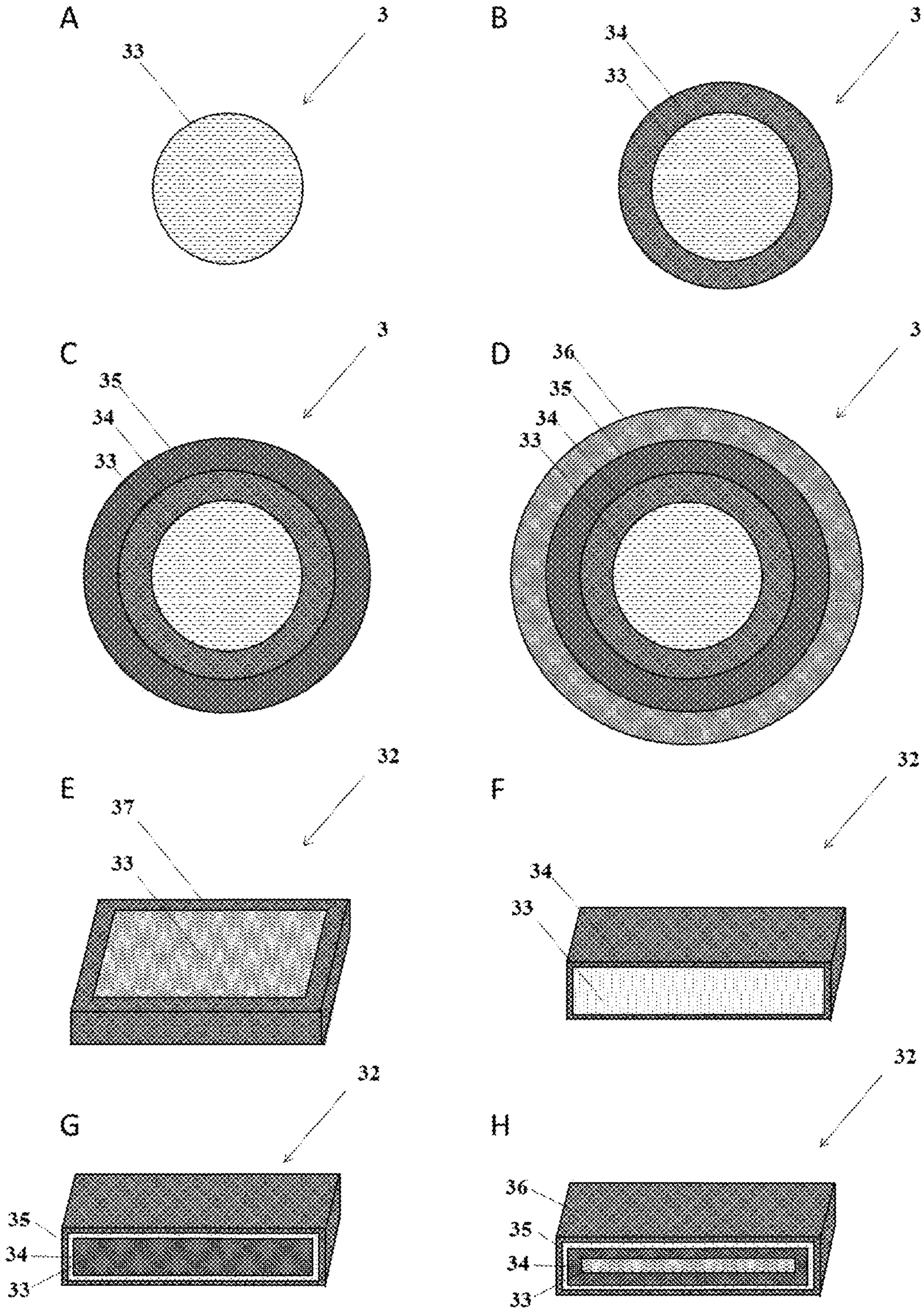
FIG. 5 illustrates different types of nanoparticles 3.

According to one embodiment, as illustrated in FIG. 5A, the nanoparticles 3 are core nanoparticles 33 without a shell.

According to one embodiment, the nanoparticles 3 comprise at least one atomically flat core nanoparticle. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the nanoparticles 3 are core 33/shell 34 nanoparticles, wherein the core 33 is partially or totally covered with at least one shell 34 comprising at least one layer of material.

According to one embodiment, as illustrated in FIGS. 5B-C and FIG. 5F-G, the nanoparticles 3 are core 33/shell 34 nanoparticles, wherein the core 33 is covered with at least one shell (34, 35).

According to one embodiment, the at least one shell (34, 35) has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the nanoparticles 3 are core 33/shell 34 nanoparticles, wherein the core 33 and the shell 34 are composed of the same material.

According to one embodiment, the nanoparticles 3 are core 33/shell 34 nanoparticles, wherein the core 33 and the shell 34 are composed of at least two different materials.

According to one embodiment, the nanoparticles 3 are core 33/shell 34 nanoparticles, wherein the core 33 is a luminescent core covered with at least one shell 34 selected in the group of magnetic material, plasmonic material, dielectric material, piezoelectric material, pyro-electric material, ferro-electric material, light scattering material, electrically insulating material, thermally insulating material or catalytic material.

According to one embodiment, the nanoparticles 3 are core 33/shell 34 nanoparticles, wherein the core 33 is a magnetic core covered with at least one shell 34 selected in the group of luminescent material, plasmonic material, dielectric material, piezoelectric material, pyro-electric material, ferro-electric material, light scattering material, electrically insulating material, thermally insulating material or catalytic material.

According to one embodiment, the nanoparticles 3 are core 33/shell 34 nanoparticles, wherein the core 33 is a plasmonic core covered with at least one shell 34 selected in the group of magnetic material, luminescent material, dielectric material, piezoelectric material, pyro-electric material, ferro-electric material, light scattering material, electrically insulating material, thermally insulating material or catalytic material.

According to one embodiment, the nanoparticles 3 are core 33/shell 34 nanoparticles, wherein the core 33 is a dielectric core covered with at least one shell 34 selected in the group of magnetic material, plasmonic material, luminescent material, piezoelectric material, pyro-electric material, ferro-electric material, light scattering material, electrically insulating material, thermally insulating material or catalytic material.

According to one embodiment, the nanoparticles 3 are core 33/shell 34 nanoparticles, wherein the core 33 is a piezoelectric core covered with at least one shell 34 selected in the group of magnetic material, plasmonic material, dielectric material, luminescent material, pyro-electric material, ferro-electric material, light scattering material, electrically insulating material, thermally insulating material or catalytic material.

According to one embodiment, the nanoparticles 3 are core 33/shell 34 nanoparticles, wherein the core 33 is a pyro-electric core covered with at least one shell 34 selected in the group of magnetic material, plasmonic material, dielectric material, luminescent material, piezoelectric material, ferro-electric material, light scattering material, electrically insulating material, thermally insulating material or catalytic material.

According to one embodiment, the nanoparticles 3 are core 33/shell 34 nanoparticles, wherein the core 33 is a ferro-electric core covered with at least one shell 34 selected in the group of magnetic material, plasmonic material, dielectric material, luminescent material, piezoelectric material, pyro-electric material, light scattering material, electrically insulating material, thermally insulating material or catalytic material.

According to one embodiment, the nanoparticles 3 are core 33/shell 34 nanoparticles, wherein the core 33 is a light scattering core covered with at least one shell 34 selected in the group of magnetic material, plasmonic material, dielectric material, luminescent material, piezoelectric material, pyro-electric material, ferro-electric material, electrically insulating material, thermally insulating material or catalytic material.

According to one embodiment, the nanoparticles 3 are core 33/shell 34 nanoparticles, wherein the core 33 is an electrically insulating core covered with at least one shell 34 selected in the group of magnetic material, plasmonic material, dielectric material, luminescent material, piezoelectric material, pyro-electric material, ferro-electric material, light scattering material, thermally insulating material or catalytic material.

According to one embodiment, the nanoparticles 3 are core 33/shell 34 nanoparticles, wherein the core 33 is a thermally insulating core covered with at least one shell 34 selected in the group of magnetic material, plasmonic material, dielectric material, luminescent material, piezoelectric material, pyro-electric material, ferro-electric material, light scattering material, electrically insulating material or catalytic material.

According to one embodiment, the nanoparticles 3 are core 33/shell 34 nanoparticles, wherein the core 33 is a catalytic core covered with at least one shell 34 selected in the group of magnetic material, plasmonic material, dielectric material, luminescent material, piezoelectric material, pyro-electric material, ferro-electric material, light scattering material, electrically insulating material or thermally insulating material.

According to one embodiment, the nanoparticles 3 are core 33/shell 36 nanoparticles, wherein the core 33 is covered with an insulator shell 36. In this embodiment, the insulator shell 36 prevents the aggregation of the cores 33.

According to one embodiment, the insulator shell 36 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, as illustrated in FIG. 5D and FIG. 5H, the nanoparticles 3 are core 33/shell (34, 35, 36) nanoparticles, wherein the core 33 is covered with at least one shell (34, 35) and an insulator shell 36.

According to one embodiment, the shells (34, 35, 36) covering the core 33 of the nanoparticles 3 may be composed of the same material.

According to one embodiment, the shells (34, 35, 36) covering the core 33 of the nanoparticles 3 may be composed of at least two different materials.

According to one embodiment, the shells (34, 35, 36) covering the core 33 of the nanoparticles 3 may have the same thickness.

According to one embodiment, the shells (34, 35, 36) covering the core 33 of the nanoparticles 3 may have different thickness.

According to one embodiment, each shell (34, 35, 36) covering the core 33 of the nanoparticles 3 has a thickness homogeneous all along the core 33, i.e. each shell (34, 35, 36) has a same thickness all along the core 33.

According to one embodiment, each shell (34, 35, 36) covering the core 33 of the nanoparticles 3 has a thickness heterogeneous along the core 33, i.e. said thickness varies along the core 33.

According to one embodiment, the nanoparticles 3 are core 33/insulator shell 36 nanoparticles, wherein examples of insulator shell 36 include but are not limited to: non-porous $SiO_2$, mesoporous $SiO_2$, non-porous MgO, mesoporous MgO, non-porous ZnO, mesoporous ZnO, non-porous $Al_2O_3$, mesoporous $Al_2O_3$, non-porous $ZrO_2$, mesoporous $ZrO_2$, non-porous $TiO_2$, mesoporous $TiO_2$, non-porous $SnO_2$, mesoporous $SnO_2$, or a mixture thereof. Said insulator shell 36 acts as a supplementary barrier against oxidation and can drain away the heat if it is a good thermal conductor.

According to one embodiment, as illustrated in FIG. 5E, the nanoparticles 3 are core 33/crown 37 nanoparticles with a 2D structure, wherein the core 33 is covered with at least one crown 37.

According to one embodiment, the nanoparticles 3 are core 33/crown 37 nanoparticles, wherein the core 33 is covered with a crown 37 comprising at least one layer of material.

According to one embodiment, the nanoparticles 3 are core 33/crown 37 nanoparticles, wherein the core 33 and the crown 37 are composed of the same material.

According to one embodiment, the nanoparticles 3 are core 33/crown 37 nanoparticles, wherein the core 33 and the crown 37 are composed of at least two different materials.

According to one embodiment, the nanoparticles 3 are core 33/crown 37 nanoparticles, wherein the core 33 is a luminescent core covered with at least one crown 37 selected in the group of magnetic material, plasmonic material, dielectric material, piezoelectric material, pyro-electric material, ferro-electric material, light scattering material, electrically insulating material, thermally insulating material or catalytic material.

According to one embodiment, the nanoparticles 3 are core 33/crown 37 nanoparticles, wherein the core 33 is a magnetic core covered with at least one crown 37 selected in the group of luminescent material, plasmonic material, dielectric material, piezoelectric material, pyro-electric material, ferro-electric material, light scattering material, electrically insulating material, thermally insulating material, or catalytic material.

According to one embodiment, the nanoparticles 3 are core 33/crown 37 nanoparticles, wherein the core 33 is a plasmonic core covered with at least one crown 37 selected in the group of magnetic material, luminescent material, dielectric material, piezoelectric material, pyro-electric material, ferro-electric material, light scattering material, electrically insulating material, thermally insulating material or catalytic material.

According to one embodiment, the nanoparticles 3 are core 33/crown 37 nanoparticles, wherein the core 33 is a dielectric core covered with at least one crown 37 selected in the group of magnetic material, plasmonic material, luminescent material, piezoelectric material, pyro-electric material, ferro-electric material, light scattering material, electrically insulating material, thermally insulating material or catalytic material.

According to one embodiment, the nanoparticles 3 are core 33/crown 37 nanoparticles, wherein the core 33 is a piezoelectric core covered with at least one crown 37 selected in the group of magnetic material, plasmonic material, dielectric material, luminescent material, pyro-electric material, ferro-electric material, light scattering material, electrically insulating material, thermally insulating material or catalytic material.

According to one embodiment, the nanoparticles 3 are core 33/crown 37 nanoparticles, wherein the core 33 is a pyro-electric core covered with at least one crown 37 selected in the group of magnetic material, plasmonic material, dielectric material, luminescent material, piezoelectric material, ferro-electric material, light scattering material, electrically insulating material, thermally insulating material or catalytic material.

According to one embodiment, the nanoparticles 3 are core 33/crown 37 nanoparticles, wherein the core 33 is a ferro-electric core covered with at least one crown 37 selected in the group of magnetic material, plasmonic material, dielectric material, luminescent material, piezoelectric material, pyro-electric material, light scattering material, electrically insulating material, thermally insulating material or catalytic material.

According to one embodiment, the nanoparticles 3 are core 33/crown 37 nanoparticles, wherein the core 33 is a light scattering core covered with at least one crown 37 selected in the group of magnetic material, plasmonic material, dielectric material, luminescent material, piezoelectric material, pyro-electric material, ferro-electric material, electrically insulating material, thermally insulating material or catalytic material.

According to one embodiment, the nanoparticles 3 are core 33/crown 37 nanoparticles, wherein the core 33 is an electrically insulating core covered with at least one crown 37 selected in the group of magnetic material, plasmonic material, dielectric material, luminescent material, piezoelectric material, pyro-electric material, ferro-electric material, light scattering material, thermally insulating material or catalytic material.

According to one embodiment, the nanoparticles 3 are core 33/crown 37 nanoparticles, wherein the core 33 is a thermally insulating core covered with at least one crown 37 selected in the group of magnetic material, plasmonic material, dielectric material, luminescent material, piezoelectric material, pyro-electric material, ferro-electric material, light scattering material, electrically insulating material or catalytic material.

According to one embodiment, the nanoparticles 3 are core 33/crown 37 nanoparticles, wherein the core 33 is a catalytic core covered with at least one crown 37 selected in the group of magnetic material, plasmonic material, dielectric material, luminescent material, piezoelectric material, pyro-electric material, ferro-electric material, light scattering material, electrically insulating material or thermally insulating material.

According to one embodiment, the nanoparticles 3 are core 33/crown 37 nanoparticles, wherein the core 33 is covered with an insulator crown. In this embodiment, the insulator crown prevents the aggregation of the cores 33.

According to one embodiment, a colloidal suspension comprising a combination of at least two different nanoparticles is used for the method of the invention. In this embodiment, the resulting particle 1 will exhibit different properties.

According to one embodiment, the colloidal suspension of nanoparticles 3 comprises at least one luminescent nanoparticle and at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the colloidal suspension of nanoparticles 3 comprises at least two different luminescent nanoparticles, wherein said luminescent nanoparticles have different emission wavelengths.

In a preferred embodiment, the colloidal suspension of nanoparticles 3 comprises at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the particle 1 comprises at least one luminescent nanoparticle emitting in the green region of the visible spectrum and at least one luminescent nanoparticle emitting in the red region of the visible spectrum, thus the particle 1 paired with a blue LED will be a white light emitter.

In a preferred embodiment, the colloidal suspension of nanoparticles 3 comprises at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the particle 1 comprises at least one luminescent nanoparticle emitting in the blue region of the visible spectrum and at least one luminescent nanoparticle emitting in the red region of the visible spectrum, thus the particle 1 will be a white light emitter.

In a preferred embodiment, the colloidal suspension of nanoparticles 3 comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the colloidal suspension of nanoparticles 3 comprises at least one luminescent nanoparticle emitting in the blue region of the visible spectrum and at least one luminescent nanoparticle emitting in the green region of the visible spectrum.

In a preferred embodiment, the colloidal suspension of nanoparticles 3 comprises three different luminescent nanoparticles, wherein said luminescent nanoparticles emit different emission wavelengths or color.

In a preferred embodiment, the colloidal suspension of nanoparticles 3 comprises at least three different luminescent nanoparticles, wherein at least one luminescent nanoparticle emits at a wavelength in the range from 400 to 490 nm, at least one luminescent nanoparticle emits at a wavelength in the range from 500 to 560 nm and at least one luminescent nanoparticle emits at a wavelength in the range from 600 to 2500 nm. In this embodiment, the colloidal suspension of nanoparticles 3 comprises at least one luminescent nanoparticle emitting in the blue region of the visible spectrum, at least one luminescent nanoparticle emitting in the green region of the visible spectrum and at least one luminescent nanoparticle emitting in the red region of the visible spectrum.

According to one embodiment, the colloidal suspension of nanoparticles 3 comprises at least one magnetic nanoparticle and at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the colloidal suspension of nanoparticles 3 comprises at least one plasmonic nanoparticle and at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the colloidal suspension of nanoparticles 3 comprises at least one dielectric nanoparticle and at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the colloidal suspension of nanoparticles 3 comprises comprises at least one piezoelectric nanoparticle and at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the colloidal suspension of nanoparticles 3 comprises at least one pyro-electric nanoparticle and at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the colloidal suspension of nanoparticles 3 comprises at least one ferro-electric nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the colloidal suspension of nanoparticles 3 comprises at least one light scattering nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the colloidal suspension of nanoparticles 3 comprises at least one electrically insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the colloidal suspension of nanoparticles 3 comprises at least one thermally insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the colloidal suspension of nanoparticles 3 comprises at least one catalytic nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the colloidal suspension of nanoparticles 3 comprises at least one nanoparticle 3 without a shell and at least one nanoparticle 3 selected in the group of core 33/shell 34 nanoparticles 3 and core 33/insulator shell 36 nanoparticles 3.

According to one embodiment, the colloidal suspension of nanoparticles 3 comprises at least one core 33/shell 34 nanoparticle 3 and at least one nanoparticle 3 selected in the group of nanoparticles 3 without a shell and core 33/insulator shell 36 nanoparticles 3.

According to one embodiment, the colloidal suspension of nanoparticles 3 comprises at least one core 33/insulator shell 36 nanoparticle 3 and at least one nanoparticle 3 selected in the group of nanoparticles 3 without a shell and core 33/shell 34 nanoparticles 3.

According to one embodiment, the colloidal suspension of nanoparticles 3 comprises at least two nanoparticles 3.

In a preferred embodiment, the particle 1 comprises at least one luminescent nanoparticle and at least one plasmonic nanoparticle.

According to one embodiment, the number of nanoparticles 3 comprised in a particle 1 depends mainly on the molar ratio or the mass ratio between the chemical species allowing to produce the inorganic material 2 and the nanoparticles 3.

According to one embodiment, the nanoparticles 3 represent at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the particle 1.

According to one embodiment, the loading charge of nanoparticles 3 in a particle 1 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of nanoparticles 3 in a particle 1 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the nanoparticles 3 are not encapsulated in particle 1 via physical entrapment or electrostatic attraction.

According to one embodiment, the nanoparticles 3 and the inorganic material 2 are not bonded or linked by electrostatic attraction or a functionalized silane based coupling agent.

According to one embodiment, the nanoparticles 3 are ROHS compliant.

According to one embodiment, the nanoparticles 3 comprise less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the nanoparticles 3 comprise less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the nanoparticles 3 comprise less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the nanoparticles 3 are colloidal nanoparticles.

According to one embodiment, the nanoparticles 3 are electrically charged nanoparticles.

According to one embodiment, the nanoparticles 3 are not electrically charged nanoparticles.

According to one embodiment, the nanoparticles 3 are not positively charged nanoparticles.

According to one embodiment, the nanoparticles 3 are not negatively charged nanoparticles.

According to one embodiment, the nanoparticles 3 are organic nanoparticles.

According to one embodiment, the organic nanoparticles are composed of a material selected in the group of carbon nanotube, graphene and its chemical derivatives, graphene, fullerenes, nanodiamonds, boron nitride nanotubes, boron nitride nanosheets, phosphorene and $Si_2BN$.

According to one embodiment, the organic nanoparticles comprise an organic material.

In one embodiment, the organic material is selected from polyacrylates; polymethacrylate; polyacrylamide; polyester; polyether; polyolefin (or polyalkene); polysaccharide; polyamide; or a mixture thereof; preferably the organic material is an organic polymer.

According to one embodiment, the organic material refers to any element and/or material containing carbon, preferably any element and/or material containing at least one carbon-hydrogen bond.

According to one embodiment, the organic material may be natural or synthetic.

According to one embodiment, the organic material is a small organic compound or an organic polymer.

According to one embodiment, the organic polymer is selected from polyacrylates; polymethacrylates; polyacrylamides; polyamides; polyesters; polyethers; polyolefins; polysaccharides; polyurethanes (or polycarbamates), polystyrenes; polyacrylonitrile-butadiene-styrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); polysulfone; polyethersulfone; polyethylenimine; polyphenylsulfone; poly(acrylonitrile styrene acrylate); polyepoxides, polythiophenes, polypyrroles; polyanilines; polyaryletherketones; polyfurans; polyimides; polyimidazoles; polyetherimides; polyketones; polynucleotides; polystyrene sulfonates; polyetheramines; polyamic acid; or any combinations and/or derivatives and/or copolymers thereof.

According to one embodiment, the organic polymer is a polyacrylate, preferably selected from poly(methyl acrylate), poly(ethyl acrylate), poly(propyl acrylate), poly(butyl acrylate), poly(pentyl acrylate), and poly(hexyl acrylate).

According to one embodiment, the organic polymer is a polymethacrylate, preferably selected from poly(methyl methacrylate), poly(ethyl methacrylate), poly(propyl methacrylate), poly(butyl methacrylate), poly(pentyl methacrylate), and poly(hexyl methacrylate). According to one embodiment, the organic polymer is poly(methyl methacrylate) (PMMA).

According to one embodiment, the organic polymer is a polyacrylamide, preferably selected from poly(acrylamide); poly(methyl acrylamide), poly(dimethyl acrylamide), poly (ethyl acrylamide), poly(diethyl acrylamide), poly(propyl acrylamide), poly(isopropyl acrylamide); poly(butyl acrylamide); and poly(tert-butyl acrylamide).

According to one embodiment, the organic polymer is a polyester, preferably selected from poly(glycolic acid) (PGA), poly(lactic acid) (PLA), poly(caprolactone) (PCL), polyhydroxyalcanoate (PHA), polyhydroxybutyrate (PHB), polyethylene adipate, polybutylene succinate, poly(ethylene terephthalate), poly(butylene terephthalate), poly(trimethylene terephthalate), polyarylate or any combination thereof.

According to one embodiment, the organic polymer is a polyether, preferably selected from aliphatic polyethers such as poly(glycol ether) or aromatic polyethers. According to one embodiment, the polyether is selected from poly(methylene oxide); poly(ethylene glycol)/poly(ethylene oxide), poly(propylene glycol) and poly(tetrahydrofuran).

According to one embodiment, the organic polymer is a polyolefin (or polyalkene), preferably selected from poly (ethylene), poly(propylene), poly(butadiene), poly(methylpentene), poly(butane) and poly(isobutylene).

According to one embodiment, the organic polymer is a polysaccharide selected from chitosan, dextran, hyaluronic acid, amylose, amylopectin, pullulan, heparin, chitin, cellulose, dextrin, starch, pectin, alginates, carrageenans, fucan, curdlan, xylan, polyguluronic acid, xanthan, arabinan, polymannuronic acid and their derivatives.

According to one embodiment, the organic polymer is a polyamide, preferably selected from polycaprolactame, polyauroamide, polyundecanamide, polytetramethylene adipamide, polyhexamethylene adipamide (also called nylon), polyhexamethylene nonanediamide, polyhexamethylene sebacamide, polyhexamethylene dodecanediamide; polydecamethylene sebacamide; Polyhexaméthylène isophtalamide; Polymétaxylylène adipamide; Polymétaphénylène isophtalamide; Polyparaphénylène téréphtalamide; polyphtalimides.

According to one embodiment, the organic polymer is a naturel or synthetic polymer.

According to one embodiment, the organic polymer is synthetized by organic reaction, radical polymerization, polycondensation, polyaddition, or ring opening polymerization (ROP).

According to one embodiment, the organic polymer is a homopolymer or a copolymer. According to one embodiment, the organic polymer is linear, branched, and/or cross-linked. According to one embodiment, the branched organic polymer is brush polymer (or also called comb polymer) or is a dendrimer.

According to one embodiment, the organic polymer is amorphous, semi-crystalline or crystalline. According to one embodiment, the organic polymer is a thermoplastic polymer or an elastomer.

According to one embodiment, the organic polymer is not a polyelectrolyte.

According to one embodiment, the organic polymer is not a hydrophilic polymer.

According to one embodiment, the organic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the nanoparticles 3 are inorganic nanoparticles.

According to one embodiment, the nanoparticles 3 comprise an inorganic material. Said inorganic material is the same or different from the inorganic material 2.

According to one embodiment, the particle 1 comprises at least one inorganic nanoparticle and at least one organic nanoparticle.

According to one embodiment, the nanoparticles 3 are not ZnO nanoparticles.

According to one embodiment, the nanoparticles 3 are not metal nanoparticles.

According to one embodiment, the particle 1 does not comprise only metal nanoparticles.

According to one embodiment, the particle 1 does not comprise only magnetic nanoparticles.

According to one embodiment, the inorganic nanoparticles are colloidal nanoparticles.

According to one embodiment, the inorganic nanoparticles are amorphous.

According to one embodiment, the inorganic nanoparticles are crystalline.

According to one embodiment, the inorganic nanoparticles are totally crystalline.

According to one embodiment, the inorganic nanoparticles are partially crystalline.

According to one embodiment, the inorganic nanoparticles are monocrystalline.

According to one embodiment, the inorganic nanoparticles are polycrystalline. In this embodiment, each inorganic nanoparticle comprises at least one grain boundary.

According to one embodiment, the inorganic nanoparticles are nanocrystals.

According to one embodiment, the inorganic nanoparticles are semiconductor nanocrystals.

According to one embodiment, the inorganic nanoparticles are composed of a material selected in the group of metals, halides, chalcogenides, phosphides, sulfides, metalloids, metallic alloys, ceramics such as for example oxides, carbides, or nitrides. Said inorganic nanoparticles are prepared using protocols known to the person skilled in the art.

According to one embodiment, the inorganic nanoparticles are selected in the group of metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof. Said nanoparticles are prepared using protocols known to the person skilled in the art.

According to one embodiment, the inorganic nanoparticles are selected from metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof, preferably is a semiconductor nanocrystal.

According to one embodiment, a chalcogenide is a chemical compound consisting of at least one chalcogen anion selected in the group of O, S, Se, Te, Po, and at least one or more electropositive element.

According to one embodiment, the metallic nanoparticles are selected in the group of gold nanoparticles, silver nanoparticles, copper nanoparticles, vanadium nanoparticles, platinum nanoparticles, palladium nanoparticles, ruthenium nanoparticles, rhenium nanoparticles, yttrium nanoparticles, mercury nanoparticles, cadmium nanoparticles, osmium nanoparticles, chromium nanoparticles, tantalum nanoparticles, manganese nanoparticles, zinc nanoparticles, zirconium nanoparticles, niobium nanoparticles, molybdenum nanoparticles, rhodium nanoparticles, tungsten nanoparticles, iridium nanoparticles, nickel nanoparticles, iron nanoparticles, or cobalt nanoparticles.

According to one embodiment, examples of carbide nanoparticles include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide nanoparticles include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide nanoparticles include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride nanoparticles include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x\neq 0$.

According to one embodiment, examples of sulfide nanoparticles include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x\neq 0$.

According to one embodiment, examples of halide nanoparticles include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide nanoparticles include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, $RhS_2$, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide nanoparticles include but are not limited to: InP, $Cd_3P_2$, $Zn_3P_2$, AlP, GaP, TlP, or a mixture thereof.

According to one embodiment, examples of metalloid nanoparticles include but are not limited to: Si, B, Ge, As, Sb, Te, or a mixture thereof.

According to one embodiment, examples of metallic alloy nanoparticles include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the nanoparticles 3 are nanoparticles comprising hygroscopic materials such as for example phosphor materials or scintillator materials.

According to one embodiment, the nanoparticles 3 are perovskite nanoparticles.

According to one embodiment, perovskites comprise a material $A_mB_nX_{3p}$, wherein A is selected from the group consisting of Ba, B, K, Pb, Cs, Ca, Ce, Na, La, Sr, Th, FA (formamidinium $CN_2H_5^+$), or a mixture thereof; B is selected from the group consisting of Fe, Nb, Ti, Pb, Sn, Ge, Bi, Zr, or a mixture thereof; X is selected from the group consisting of O, Cl, Br, I, cyanide, thiocyanate, or a mixture thereof; m, n and p are independently a decimal number from 0 to 5; m, n and p are not simultaneously equal to 0; m and n are not simultaneously equal to 0.

According to one embodiment, m, n and p are not equal to 0.

According to one embodiment, examples of perovskites include but are not limited to: $Cs_3Bi_2I_9$, $Cs_3Bi_2Cl_9$, $Cs_3Bi_2Br_9$, $BFeO_3$, $KNbO_3$, $BaTiO_3$, $CH_3NH_3PbI_3$, $CH_3NH_3PbCl_3$, $CH_3NH_3PbBr_3$, $FAPbBr_3$ (with FA formamidinium), $FAPbCl_3$, $FAPbI_3$, $CsPbCl_3$, $CsPbBr_3$, $CsPbI_3$, $CsSnI_3$, $CsSnCl_3$, $CsSnBr_3$, $CsGeCl_3$, $CsGeBr_3$, $CsGeI_3$, $FAPbCl_xBr_yI_z$ (with x, y and z independent decimal number from 0 to 5 and not simultaneously equal to 0).

According to one embodiment, the nanoparticles 3 are phosphor nanoparticles.

According to one embodiment, the inorganic nanoparticles are phosphor nanoparticles.

According to one embodiment, examples of phosphor nanoparticles include but are not limited to:

- rare earth doped garnets or garnets such as for example $Y_3Al_5O_{12}$, $Y_3Ga_5O_{12}$, $Y_3Fe_2(FeO_4)_3$, $Y_3Fe_5O_{12}$, $Y_4Al_2O_9$, $YAlO_3$, $RE_{3-n}Al_5O_{12}:Ce_n$ (RE=Y, Gd, Tb, Lu), $Gd_3Al_5O_{12}$, $Gd_3Ga_5O_{12}$, $Lu_3Al_5O_{12}$, $Fe_3Al_2(SiO_4)_3$, $(Lu_{(1-x-y)}>A_xCe_y)_3B_zAl_5O_{12}C_{2z}$ with A=at least one of Sc, La, Gd, Tb or mixture thereof, B at least one of Mg, Sr, Ca, Ba or mixture thereof, C at least one of F, C, Br, I or mixture thereof, $0\leq x\leq 0.5$, $0.001\leq y\leq 0.2$, and $0.001\leq z\leq 0.5$, $(Lu_{0.90}Gd_{0.07}Ce_{0.03})_3Sr_{0.34}Al_5O_{12}F_{0.68}$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, TAG, GAL, LuAG, YAG;
- doped nitrides such as europium doped $CaAlSiN_3$, $Sr(LiAl_3N_4):Eu$, $SrMg_3SiN_4:Eu$, $La_3Si_6N_{11}:Ce$, $La_3Si_6N_{11}:Ce$, $(Ca,Sr)AlSiN_3:Eu$, $(Ca_{0.2}Sr_{0.8})AlSiN_3$, $(Ca, Sr, Ba)_2Si_5N_8:Eu$;
- sulfide-based phosphors such as for example $CaS:Eu^{2+}$, $SrS:Eu^{2+}$;
- $A_2(MF_6)$: $Mn^{4+}$ wherein A comprises Na, K, Rb, Cs, or $NH_4$ and M comprises Si, Ti, Zr, or Mn, such as for example $Mn^{4+}$ doped potassium fluorosilicate (PFS), $K_2(SiF_6):Mn^{4+}$ or $K_2(TiF_6):Mn^{4+}$, $Na_2SnF_6:Mn^{4+}$, $Cs_2SnF_6:Mn^{4+}$, $Na_2SiF_6:Mn^{4+}$, $Na_2GeF_6:Mn^{4+}$;
- oxynitrides such as for example europium doped (Li, Mg, Ca, Y)-α-SiAlON, $SrAl_2$ $Si_3ON_6$:Eu, $Eu_xSi_{6-z}Al_zO_yN_{8-y}$ (y=z−2x), $Eu_{0.018}Si_{5.77}Al_{0.23}O_{0.194}N_{7.806}$, $SrSi_2O_2N_2:Eu^{2+}$, $Pr^{3+}$ activated β-SiAlON:Eu;

silicates such as for example $A_2Si(OD)_4$:Eu with A=Sr, Ba, Ca, Mg, Zn or mixture thereof and D=F, Cl, S, N, Br or mixture thereof, $(SrBaCa)_2SiO_4$:Eu, $Ba_2MgSi_2O_7$:Eu, $Ba_2SiO_4$:Eu, $Sr_3SiO_5$, $(Ca,Ce)_3(Sc,Mg)_2Si_3O_{12}$;

carbonitrides such as for example $Y_2Si_4N_6C$, $CsLnSi(CN_2)_4$:Eu with Ln=Y, La or Gd;

oxycarbonitrides such as for example $Sr_2Si_5N_{8-[(4x/3)+z]}C_xO_{3z/2}$ wherein 0≤x≤5.0, 0.06<z≤0.1, and x≠3z/2;

europium aluminates such as for example $EuAl_6O_{10}$, $EuAl_2O_4$;

barium oxides such as for example $Ba_{0.93}Eu_{0.07}Al_2O_4$;

blue phosphors such as for example ($BaMgAl_{10}O_{17}$:Eu), $Sr_5(PO_4)_3Cl$:Eu, AlN:Eu:, $LaSi_3N_5$:Ce, $SrSi_9Al_{19}ON_{31}$:Eu, $SrSi_{6-x}Al_xO_{1+x}N_{8-x}$:Eu;

halogenated garnets such as for example $(Lu_{1-a-b-c}Y_aTb_bA_c)_3(Al_{1-d}B_d)_5(O_{1-e}C_e)_{12}$:Ce, Eu, where A is selected from the group consisting of Mg, Sr, Ca, Ba or mixture thereof; B is selected from the group consisting of Ga, In or mixture thereof; C is selected from the group consisting of F, Cl, Br or mixture thereof; and 0≤a≤1; 0≤b≤1; 0≤c≤0.5; 0≤d≤1; and 0≤e≤0.2;

$((Sr_{1-z}M_z)_{1-(x+W)}A_wCe_x)_3(Al_{1-y}Si_y)O_{4+y+3(x-w)}F_{1-y-3(x-w)}$, wherein 0<x≤0.10, 0≤y≤0.5, 0≤z≤0.5, 0≤w≤x, A comprises Li, Na, K, $R_b$ or mixture thereof; and M comprises Ca, Ba, Mg, Zn, Sn or mixture thereof, $(Sr_{0.98}Na_{0.01}Ce_{0.01})_3(Al_{0.9}Si_{0.1})_3O_{4.1}F_{0.9}$, $(Sr_{0.595}Ca_{0.4}Ce_{0.005})_3(Al_{0.6}Si_{0.4})O_{4.415}F_{0.585}$;

rare earth doped nanoparticles;

doped nanoparticles;

any phosphors known by the skilled artisan;

or a mixture thereof.

According to one embodiment, examples of phosphor nanoparticles include but are not limited to:

blue phosphors such as for example $BaMgAl_{10}O_{17}:Eu^{2+}$ or $Co^{2+}$, $Sr_5(PO_4)_3Cl:Eu^{2+}$, $AlN:Eu^{2+}$, $LaSi_3N_5:Ce^{3+}$, $SrSi_9Al_{19}ON_{31}:Eu^{2+}$, $SrSi_{6-x}Al_xO_{1+x}N_{8-x}:Eu^{2+}$;

red phosphors such as for example $Mn^{4+}$ doped potassium fluorosilicate (PFS), carbonitrides, nitrides, sulfides (CaS), $CaAlSiN_3:Eu^{3+}$, $(Ca,Sr)AlSiN_3:Eu^{3+}$, $(Ca, Sr, Ba)_2Si_5N_8:Eu^{3+}$, $SrLiAl_3N_4:Eu^{3+}$, $SrMg_3SiN_4:Eu^{3+}$, red emitting silicates;

orange phosphors such as for example orange emitting silicates, Li, Mg, Ca, or Y doped α-SiAlON;

green phosphors such as for example oxynitrides, carbonitrides, green emitting silicates, LuAG, green GAL, green YAG, green GaYAG, β-SiAlON:$Eu^{2+}$, $SrSi_2O_2N_2:Eu^{2+}$; and yellow phosphors such as for example yellow emitting silicates, TAG, yellow YAG, $La_3Si_6N_{11}:Ce^{3+}$ (LSN), yellow GAL.

According to one embodiment, examples of phosphor nanoparticles include but are not limited to: blue phosphors; red phosphors; orange phosphors; green phosphors; and yellow phosphors.

According to one embodiment, the phosphor nanoparticle has an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the phosphor nanoparticles have an average size ranging from 0.1 µm to 50 µm.

According to one embodiment, the particle 1 comprises one phosphor nanoparticle.

According to one embodiment, the nanoparticles 3 are scintillator nanoparticles.

According to one embodiment, examples of scintillator nanoparticles include but are not limited to: NaI(Tl) (thallium-doped sodium iodide), CsI(Tl), CsI(Na), CsI(pure), CsF, KI(Tl), LiI(Eu), $BaF_2$, $CaF_2$(Eu), ZnS(Ag), $CaWO_4$, $CdWO_4$, YAG(Ce) ($Y_3Al_5O_{12}$(Ce)), GSO, LSO, $LaCl_3$(Ce) (lanthanum chloride doped with cerium), $LaBr_3$(Ce) (cerium-doped lanthanum bromide), LYSO ($Lu_{1.8}Y_{0.2}SiO_5$(Ce)), or a mixture thereof.

According to one embodiment, the nanoparticles 3 are metal nanoparticles (gold, silver, aluminum, magnesium, or copper, alloys).

According to one embodiment, the nanoparticles 3 are inorganic semiconductors or insulators which can be coated with organic compounds.

According to one embodiment, the inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides.

According to one embodiment, the semiconductor nanocrystals comprise a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystals comprise a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, w, x, y and z are independently a decimal number from 0 to 5, at the condition that when w is 0, x, y and z are not 0, when x is 0, w, y and z are not 0, when y is 0, w, x and z are not 0 and when z is 0, w, x and y are not 0.

According to one embodiment, the semiconductor nanocrystals comprise a material of formula $M_xN_yE_zA_w$, wherein M and/or N is selected from the group consisting of Ib, IIa, IIb, IIIa, IIIb, IVa, IVb, Va, Vb, VIb, VIIb, VIII, or mixtures thereof; E and/or A is selected from the group consisting of Va, VIa, VIIa, or mixtures thereof; x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystals comprise a material of formula $M_xE_y$, wherein M is selected from group consisting of Cd, Zn, Hg, Ge, Sn, Pb, Cu, Ag, Fe, In, Al, Ti, Mg, Ga, Tl, Mo, Pd, W, Cs, Pb, or a mixture thereof; x and y are independently a decimal number from 0 to 5, at the condition that x and y are not simultaneously equal to 0, and $x \neq 0$.

According to one embodiment, the semiconductor nanocrystals comprise a material of formula $M_xE_y$, wherein E is selected from group consisting of S, Se, Te, O, P, C, N, As, Sb, F, Cl, Br, I, or a mixture thereof; x and y are independently a decimal number from 0 to 5, at the condition that x and y are not simultaneously equal to 0, and $x \neq 0$ According to one embodiment, the semiconductor nanocrystals are selected from the group consisting of a IIb-VIa, IVa-VIa, Ib-IIIa-VIa, IIb-IVa-Va, Ib-VIa, VIII-VIa, IIb-Va, IIIa-VIa, IVb-VIa, IIa-VIa, IIIa-Va, IIIa-VIa, VIb-VIa, and Va-VIa semiconductor.

According to one embodiment, the semiconductor nanocrystals comprise a material $M_xN_yE_zA_w$ selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, $MoS_2$, PdS, $Pd_4S$, $WS_2$, $CsPbCl_3$, $PbBr_3$, $CsPbBr_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, the inorganic nanoparticles are semiconductor nanoplatelets, nanosheets, nanoribbons, nanowires, nanodisks, nanocubes, nanorings, magic size clusters, or spheres such as for example quantum dots.

According to one embodiment, the inorganic nanoparticles are semiconductor nanoplatelets, nanosheets, nanoribbons, nanowires, nanodisks, nanocubes, magic size clusters, or nanorings.

According to one embodiment, the inorganic nanoparticle comprises an initial nanocrystal.

According to one embodiment, the inorganic nanoparticle comprises an initial colloidal nanocrystal.

According to one embodiment, the inorganic nanoparticle comprises an initial nanoplatelet.

According to one embodiment, the inorganic nanoparticle comprises an initial colloidal nanoplatelet.

According to one embodiment, the inorganic nanoparticles are core nanoparticles, wherein each core is not partially or totally covered with at least one shell comprising at least one layer of inorganic material.

According to one embodiment, the inorganic nanoparticles are core 33 nanocrystals, wherein each core 33 is not partially or totally covered with at least one shell 34 comprising at least one layer of inorganic material.

According to one embodiment, the inorganic nanoparticles are core/shell nanoparticles, wherein the core is partially or totally covered with at least one shell comprising at least one layer of inorganic material.

According to one embodiment, the inorganic nanoparticles are core 33/shell 34 nanocrystals, wherein the core 33 is partially or totally covered with at least one shell 34 comprising at least one layer of inorganic material.

According to one embodiment, the core/shell semiconductor nanocrystals comprise at least one shell 34 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5;

x, y, z and w are not simultaneously equal to 0; x and y are not simultaneously equal to 0; z and w may not be simultaneously equal to 0.

According to one embodiment, the core/shell semiconductor nanocrystals comprise two shells (34, 35) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the shells (34, 35) comprise different materials.

According to one embodiment, the shells (34, 35) comprise the same material.

According to one embodiment, the core/shell semiconductor nanocrystals comprise at least one shell comprising a material of formula $M_xN_yE_zA_w$, wherein M, N, E and A are as described hereabove.

According to one embodiment, examples of core/shell semiconductor nanocrystals include but are not limited to: CdSe/CdS, CdSe/$Cd_xZn_{1-x}S$, CdSe/CdS/ZnS, CdSe/ZnS/CdS, CdSe/ZnS, CdSe/$Cd_xZn_{1-x}S$/ZnS, CdSe/ZnS/$Cd_xZn_{1-x}S$, CdSe/CdS/$Cd_xZn_{1-x}S$, CdSe/ZnSe/ZnS, CdSe/ZnSe/$Cd_xZn_{1-x}S$, $CdSe_xS_{1-x}$/CdS, $CdSe_xS_{1-x}$/CdZnS, $CdSe_xS_{1-x}$/CdS/ZnS, $CdSe_xS_{1-x}$/ZnS/CdS, $CdSe_xS_{1-x}$/ZnS, $CdSe_xS_{1-x}$/$Cd_xZn_{1-x}S$/ZnS, $CdSe_xS_{1-x}$/ZnS/$Cd_xZn_{1-x}S$, $CdSe_xS_{1-x}$/CdS/$Cd_xZn_{1-x}S$, $CdSe_xS_{1-x}$/ZnSe/ZnS, $CdSe_xS_{1-x}$/ZnSe/$Cd_xZn_{1-x}S$, InP/CdS, InP/CdS/ZnSe/ZnS, InP/$Cd_xZn_{1-x}S$, InP/CdS/ZnS, InP/ZnS/CdS, InP/ZnS, InP/$Cd_xZn_{1-x}S$/ZnS, InP/ZnS/$Cd_xZn_{1-x}S$, InP/CdS/$Cd_xZn_{1-x}S$, InP/ZnSe, InP/ZnSe/ZnS, InP/ZnSe/$Cd_xZn_{1-x}S$, InP/$ZnSe_xS_{1-x}$, InP/GaP/ZnS, $In_xZn_{1-x}P$/ZnS, $In_xZn_{1-x}P$/ZnS, InP/GaP/ZnSe, InP/ZnS/ZnSe, InP/GaP/ZnSe/ZnS, InP/ZnS/ZnSe/ZnS, wherein x is a decimal number from 0 to 1.

According to one embodiment, the core/shell semiconductor nanocrystals are ZnS rich, i.e. the last monolayer of the shell is a ZnS monolayer.

According to one embodiment, the core/shell semiconductor nanocrystals are CdS rich, i.e. the last monolayer of the shell is a CdS monolayer.

According to one embodiment, the core/shell semiconductor nanocrystals are $Cd_xZn_{1-x}S$ rich, i.e. the last monolayer of the shell is a $Cd_xZn_{1-x}S$ monolayer, wherein x is a decimal number from 0 to 1.

According to one embodiment, the last atomic layer of the semiconductor nanocrystals is a cation-rich monolayer of cadmium, zinc or indium.

According to one embodiment, the last atomic layer of the semiconductor nanocrystals is an anion-rich monolayer of sulfur, selenium or phosphorus.

According to one embodiment, the inorganic nanoparticles are core/crown semiconductor nanocrystals.

According to one embodiment, the core/crown semiconductor nanocrystals comprise at least one crown 37 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the core/crown semiconductor nanocrystals comprise at least one crown comprising a material of formula $M_xN_yE_zA_w$, wherein M, N, E and A are as described hereabove.

According to one embodiment, the crown 37 comprises a different material than the material of core 33.

According to one embodiment, the crown 37 comprises the same material than the material of core 33.

According to one embodiment, the semiconductor nanocrystal is atomically flat. In this embodiment, the atomically flat semiconductor nanocrystal may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the nanoparticles 3 comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the inorganic nanoparticles comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystals comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the particle 1 comprises at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystal comprises at least one atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystals are semiconductor nanoplatelets.

According to one embodiment, the semiconductor nanoplatelets are atomically flat. In this embodiment, the atomically flat nanoplatelet may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanoplatelet comprises at least one atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence, or any other characterization means known by the person skilled in the art.

According to one embodiment, the semiconductor nanoplatelets are quasi-2D.

According to one embodiment, the semiconductor nanoplatelets are 2D-shaped.

According to one embodiment, the semiconductor nanoplatelets have a thickness tuned at the atomic level.

According to one embodiment, the semiconductor nanoplatelet comprises an initial nanocrystal.

According to one embodiment, the semiconductor nanoplatelet comprises an initial colloidal nanocrystal.

According to one embodiment, the semiconductor nanoplatelet comprises an initial nanoplatelet.

According to one embodiment, the semiconductor nanoplatelet comprises an initial colloidal nanoplatelet.

According to one embodiment, the core 33 of the semiconductor nanoplatelets is an initial nanoplatelet.

According to one embodiment, the initial nanoplatelet comprises a material of formula $M_xN_yE_zA_w$, wherein M, N, E and A are as described hereabove.

According to one embodiment, the thickness of the initial nanoplatelet comprises an alternate of atomic layers of M and E.

According to one embodiment, the thickness of the initial nanoplatelet comprises an alternate of atomic layers of M, N, A and E.

According to one embodiment, a semiconductor nanoplatelet comprises an initial nanoplatelet partially or completely covered with at least one layer of additional material.

According to one embodiment, the at least one layer of additional material comprises a material of formula $M_xN_yE_zA_w$, wherein M, N, E and A are as described hereabove.

According to one embodiment, a semiconductor nanoplatelet comprises an initial nanoplatelet partially or completely covered on a least one facet by at least one layer of additional material.

In one embodiment wherein several layers cover all or part of the initial nanoplatelet, these layers can be composed of the same material or composed of different materials.

In one embodiment wherein several layers cover all or part of the initial nanoplatelet, these layers can be composed such as to form a gradient of materials.

In one embodiment, the initial nanoplatelet is an inorganic colloidal nanoplatelet.

In one embodiment, the initial nanoplatelet comprised in the semiconductor nanoplatelet has preserved its 2D structure.

In one embodiment, the material covering the initial nanoplatelet is inorganic.

In one embodiment, at least one part of the semiconductor nanoplatelet has a thickness greater than the thickness of the initial nanoplatelet.

In one embodiment, the semiconductor nanoplatelet comprises the initial nanoplatelet totally covered with at least one layer of material.

In one embodiment, the semiconductor nanoplatelet comprises the initial nanoplatelet totally covered with a first layer of material, said first layer being partially or completely covered with at least a second layer of material.

In one embodiment, the initial nanoplatelet has a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the thickness of the initial nanoplatelet is smaller than at least one of the lateral dimensions (length or width) of the initial nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

In one embodiment, the initial nanoplatelet has lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the semiconductor nanoplatelets have a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the semiconductor nanoplatelets have lateral dimensions of at least 2 nm, 3 nm, 4 nm, 5 nm, 6 nm, 7 nm, 8 nm, 9 nm, 10 nm, 15 nm, 20 nm, 25 nm, 30 nm, nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the thickness of the semiconductor nanoplatelet is smaller than at least one of the lateral dimensions (length or width) of the semiconductor nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the semiconductor nanoplatelets are obtained by a process of growth in the thickness of at least one face of at least one initial nanoplatelet by deposition of a film or a layer of material on the surface of the at least one initial nanoplatelet; or a process lateral growth of at least one face of at least one initial nanoplatelet by deposition of a film or a layer of material on the surface of the at least one initial nanoplatelet; or any methods known by the person skilled in the art.

In one embodiment, the semiconductor nanoplatelet can comprise the initial nanoplatelet and 1, 2, 3, 4, 5 or more layers covering all or part of the initial nanoplatelet, said layers begin of same composition as the initial nanoplatelet or being of different composition than the initial nanoplatelet or being of different composition one another.

In one embodiment, the semiconductor nanoplatelet can comprise the initial nanoplatelet and at least 1, 2, 3, 4, 5 or more layers in which the first deposited layer covers all or part of the initial nanoplatelet and the at least second deposited layer covers all or part of the previously deposited layer, said layers being of same composition as the initial nanoplatelet or being of different composition than the initial nanoplatelet and possibly of different compositions one another.

According to one embodiment, the semiconductor nanoplatelets have a thickness quantified by a $M_xN_yE_zA_w$ monolayer, wherein M, N, E and A are as described hereabove.

According to one embodiment, the core 33 of the semiconductor nanoplatelets have a thickness of at least 1 $M_xN_yE_zA_w$ monolayer, at least 2 $M_xN_yE_zA_w$ monolayers, at least 3 $M_xN_yE_zA_w$ monolayers, at least 4 $M_xN_yE_zA_w$ monolayers, at least 5 $M_xN_yE_zA_w$ monolayers, wherein M, N, E and A are as described hereabove.

According to one embodiment, the shell 34 of the semiconductor nanoplatelets have a thickness quantified by a $M_xN_yE_zA_w$ monolayer, wherein M, N, E and A are as described hereabove, wherein M, N, E and A are as described hereabove.

According to one embodiment, the nanoparticles 3 are suspended in an organic solvent, wherein said organic solvent includes but is not limited to: pentane, hexane, heptane, octane, decane, dodecane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol or a mixture thereof. According to one embodiment, the nanoparticles 3 are suspended in water.

According to one embodiment, the nanoparticles 3 are transferred in an aqueous solution prior to step (b) by exchanging the ligands at the surface of the nanoparticles 3. In this embodiment, the exchanging ligands include but are not limited to: 2-mercaptoacetic acid, 3-mercaptopropionic acid, 12-mercaptododecanoic acid, 2-mercaptoehtyltrimethoxysilane, 3-mercaptopropyltrimethoxysilane, 12-mercaptododecyltrimethoxysilane, 11-mercaptol-undecanol, 16-hydroxyhexadecanoic acid, ricinoleic acid, cysteamine, or a mixture thereof.

According to one embodiment, prior to step (b), the ligands at the surface of the nanoparticles 3 are exchanged with at least one exchanging ligand comprising at least one atom of Si, Al, Ti, B, P, Ge, As, Fe, T, Z, Ni, Zn, Ca, Na, K, Mg, Pb, Ag, V, P, Te, Mn, Ir, Sc, Nb, or Sn. In this embodiment, the at least one exchanging ligand comprises at least one atom of at least one precursor of the inorganic material 2 allowing the nanoparticles 3 to be uniformly dispersed in the at least one particle 1. In the case of at least one exchanging ligand comprising at least one atom of Si, the surface of the nanoparticles 3 can be silanized before mixing step with the precursor solution.

According to one embodiment, at least one exchanging ligand comprising at least one atom of Si, Al, Ti, B, P, Ge, As, Fe, T, Z, Ni, Zn, Ca, Na, K, Mg, Pb, Ag, V, P, Te, Mn Ir, Sc, Nb, or Sn includes but is not limited to: mercapto-functional silanes such as for example 2-mercaptoethyltrimethoxysilane, 3-mercaptopropyltrimethoxysilane, 12-mercaptododecyltrimethoxysilane; 2-aminooehtyltrimethoxysilane; 3-aminopropyltrimethoxysilane, 12-aminododecyltrimethoxysilane; or a mixture thereof.

According to one embodiment, prior to step (b), the ligands at the surface of the nanoparticles 3 are partially exchanged with at least one exchanging ligand comprising at least one atom of Si, Al, Ti, B, P, Ge, As, Fe, T, Z, Ni, Zn, Ca, Na, K, Mg, Pb, Ag, V, P, Te, Mn Ir, Sc, Nb, or Sn. In this embodiment, the at least one exchanging ligand comprising at least one atom of Si, Al, Ti, B, P, Ge, As, Fe, T, Z, Ni, Zn, Ca, Na, K, Mg, Pb, Ag, V, P, Te, Mn Ir, Sc, Nb, or Sn includes but is not limited to: n-alkyltrimethoxylsilanes such as for example n-butyltrimethoxysilane, n-octyltrimethoxylsilane, n-dodecyltrimethoxysilane, n-octadecyltrimethoxysilane; 2-aminooehtyltrimethoxysilane; 3-aminopropyltrimethoxysilane; 12-aminododecyltrimethoxysilane.

According to one embodiment, at least one ligand comprising at least one atom of silicon, aluminium or titanium is added to the at least one colloidal suspension comprising a plurality of nanoparticles 3. In this embodiment, the at least one ligand comprising at least one atom of silicon, aluminium or titanium includes but is not limited to: n-alkyltrimethoxylsilanes such as for example n-butyltrimethoxysilane, n-octyltrimethoxylsilane, n-dodecyltrimethoxysilane, n-octadecyltrimethoxysilane; 2-aminooehtyltrimethoxysilane; 3-aminopropyltrimethoxysilane; 12-aminododecyltrimethoxysilane. In this embodiment, the ligands at the surface of the nanoparticles 3 and the at least one ligand comprising at least one atom of silicon, aluminium or titanium are interdigitated at the surface of the nanoparticles 3, allowing the nanoparticles 3 to be uniformly dispersed in the at least one particle 1.

According to one embodiment, the ligands at the surface of the nanoparticles 3 are C3 to C20 alkanethiol ligands such as for example propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, or a mixture thereof. In this embodiment, C3 to C20 alkanethiol ligands help control the hydrophobicity of the nanoparticles surface.

According to one embodiment, prior to step (b), the ligands at the surface of the nanoparticles 3 are exchanged with at least one exchanging ligand which is a copolymer, block copolymer and/or a multidentate ligand.

In one embodiment of the invention, said at least one exchanging ligand which is a copolymer comprises at least two monomers, said monomers being:

- one anchoring monomer comprising a first moiety $M_A$ having affinity for the surface of the nanoparticles 3, and
- one hydrophilic monomer comprising a second moiety $M_B$ having a high water solubility.

In one embodiment of the invention, said at least one exchanging ligand which is a copolymer has the following formula I:

$$(A)x(B)y$$

wherein

A comprising at least one anchoring monomer comprising a first moiety $M_A$ having affinity for the surface of the nanoparticles 3 as described here above, B comprising at least one hydrophilic monomer comprising a second moiety MB having a high water solubility, and each of x and y is independently a positive integer, preferably an integer ranging from 1 to 499, from 1 to 249, from 1 to 99, or from 1 to 24.

In one embodiment of the invention, the at least one exchanging ligand which is a copolymer has the following formula II:

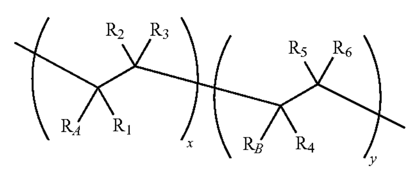

wherein $R_A$ represents a group comprising the first moiety $M_A$ having affinity for the surface of the nanoparticles 3 as described here above, $R_B$ represents a group comprising the second moiety $M_B$ having a high water solubility, $R_1$, $R_2$, $R_3$, $R_4$, $R_5$, $R_6$ can be independently H, or a group selected from an alkyl, alkenyl, aryl, hydroxyle, halogen, alkoxy, carboxylate, each of x and y is independently a positive integer, preferably an integer ranging from 1 to 499.

In another embodiment of the invention, the at least one exchanging ligand which is a copolymer comprising at least two monomers has the following formula II':

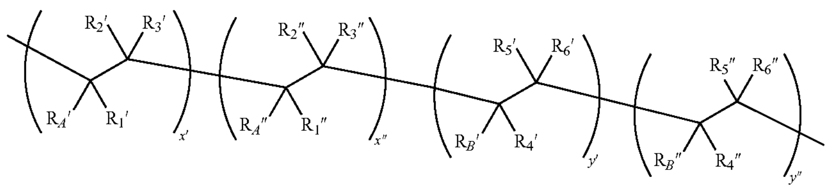

wherein $R_A'$ and $R_A''$ represent respectively a group comprising the first moiety $M_A'$ and $M_A''$ having affinity for the surface of the nanoparticles 3, $R_B'$ and $R_B''$ represent respectively a group comprising the second moiety $M_B'$ and $M_B''$ having a high water solubility, $R_1'$, $R_2'$, $R_3'$, $R_1''$, $R_2''$, $R_3''$, $R_4'$, $R_5'$, $R_6'$, $R_4''$, $R_5''$, $R_6''$ can be independently H, or a group selected from an alkyl, alkenyl, aryl, hydroxyle, halogen, alkoxy, carboxylate, each of x' and x" is independently a positive integer, preferably an integer ranging from 0 to 500, with the condition that at least one of x' and x" is not 0, each of y' and y" is independently a positive integer, preferably an integer ranging from 0 to 500, with the condition that at least one of y' and y" is not 0.

In one embodiment of the invention, said at least one exchanging ligand which is a copolymer is synthesized from at least two monomers, said monomers being:

one anchoring monomer wherein $M_A$ is a dithiol group, one hydrophilic monomer wherein $M_B$ is a sulfobetaine group.

In another embodiment of the invention, said at least one exchanging ligand which is a copolymer is synthesized from at least three monomers, said monomers being:

one anchoring monomer as defined here above, one hydrophilic monomer as defined here above, and one functionalizable monomer comprising a reactive function $M_C$.

In one embodiment of the invention, said at least one exchanging ligand which is a copolymer has the following formula III:

$$(A)_x(B)_y(C)_z$$

wherein

A comprises at least one anchoring monomer comprising a first moiety $M_A$ having affinity for the surface of a nanocrystal as described here above, B comprises at least one hydrophilic monomer comprising a second moiety $M_B$ having a high water solubility, C comprises at least one functionalizable monomer comprising a third moiety $M_C$ having a reactive function, and each of x, y and z is independently a positive integer, preferably an integer ranging from 1 to 498.

In said embodiment, the at least one exchanging ligand which is a copolymer has the following formula IV:

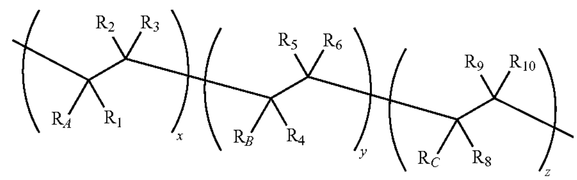

wherein $R_A$, $R_B$, $R_1$, $R_2$, $R_3$, $R_4$, $R_5$ and $R_6$ are defined here above, $R_C$ represents a group comprising the third moiety $M_C$, and $R_8$, $R_9$ and $R_{10}$ can be independently H, or a group selected from an alkyl, alkenyl, aryl, hydroxyl, halogen, alkoxy, carboxylate, each of x, y and z is independently a positive integer, preferably an integer ranging from 1 to 498.

In another embodiment of the invention, said at least one exchanging ligand which is a copolymer comprising at least two monomers has the following formula IV':

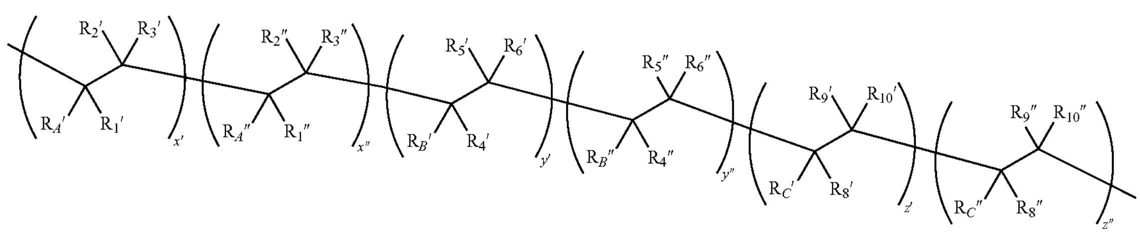

wherein $R_A'$, $R_A''$, $R_B'$, $R_B''$, $R_1'$, $R_2'$, $R_3'$, $R_1''$, $R_2''$, $R_3''$, $R_4'$, $R_5'$, $R_6'$, $R_4''$, $R_5''$, and $R_6''$ are defined here above, $R_C'$ and $R_C''$ represent respectively a group comprising the third moiety $M_C'$ and $M_C''$, and $R_8'$, $R_9'$, $R_{10}'$, $R_8''$, $R_9''$, and $R_{10}''$ can be independently H, or a group selected from an alkyl, alkenyl, aryl, hydroxyl, halogen, alkoxy, carboxylate, each of x' and x" is independently a positive integer, preferably an integer ranging from 0 to 499, with the condition that at least one of x' and x" is not 0, each of y' and y" is independently a positive integer, preferably an integer ranging from 0 to 499, with the condition that at least one of y' and y" is not 0, each of z' and z" is independently a positive integer, preferably an integer ranging from 0 to 499, with the condition that at least one of z' and z" is not 0.

According to one embodiment, the at least one exchanging ligand which is a copolymer is obtained from at least two monomers, said monomers being:

one anchoring monomer $M_A$ having a side-chain comprising a first moiety $M_A$ having affinity for the surface of the nanoparticles 3; and one hydrophilic monomer $M_B$ having a side-chain comprising a second moiety $M_B$ being hydrophilic;

and wherein one end of copolymer is H and the other end comprises a functional group or a bioactive group.

According to one embodiment, the at least one exchanging ligand which is a copolymer is of general formula (V):

*H-P[(A)x-co-(B)y]n-L-R* wherein

A represents an anchoring monomer having a side-chain comprising a first moiety $M_A$ having affinity for the surface of the nanoparticles 3;

B represents a hydrophilic monomer having a side-chain comprising a second moiety $M_B$ being hydrophilic;

n represents a positive integer, preferably an integer ranging from 1 to 999, preferably from 1 to 499, from 1 to 249 or from 1 to 99;

x and y represent each independently a percentage of n, wherein x and y are different from 0% of n and different from 100% of n, preferably ranging from more than 0% to less than 100% of n, preferably from more than 0% to 80% of n, from more than 0% to 50% of n; wherein x+y is equal to 100% of n;

R represents:

a functional group selected from the group comprising —$NH_2$, —COOH, —OH, —SH, —CHO, ketone, halide; activated ester such as for example N-hydroxysuccinimide ester, N-hydroxyglutarimide ester or maleimide ester; activated carboxylic acid such as for example acid anhydride or acid halide; isothiocyanate; isocyanate; alkyne; azide; glutaric anhydride, succinic anhydride, maleic anhydride; hydrazide; chloroformate, maleimide, alkene, silane, hydrazone, oxime and furan; and a bioactive group selected from the group comprising avidin or streptavidin; antibody such as a monoclonal antibody or a single chain antibody; sugars; a protein or peptide sequence having a specific binding affinity for an affinity target, such as for example an avimer or an affibody (the affinity target may be for example a protein, a nucleic acid, a peptide, a metabolite or a small molecule), antigens, steroids, vitamins, drugs, haptens, metabolites, toxins, environmental pollutants, amino acids, peptides, proteins, aptamers, nucleic acids, nucleotides, peptide nucleic acid (PNA), folates, carbohydrates, lipids, phospholipid, lipoprotein, lipopolysaccharide, liposome hormone, polysaccharide, polymers, polyhistidine tags, fluorophores; and L represents a bound or a spacer selected from the group comprising alkylene, alkenylene, arylene or arylalkyl linking groups having 1 to 50 chain atoms, wherein the linking group can be optionally interrupted or terminated by —O—, —S—, —$NR_7$—, wherein $R_7$ is H or alkyl, —CO—, —NHCO—, —CONH— or a combination thereof; or a spacer selected from the group comprising DNA, RNA, peptide nucleic acid (PNA), polysaccharide, peptide.

In a specific embodiment, the at least one exchanging ligand which is a copolymer is of formula (V-a):

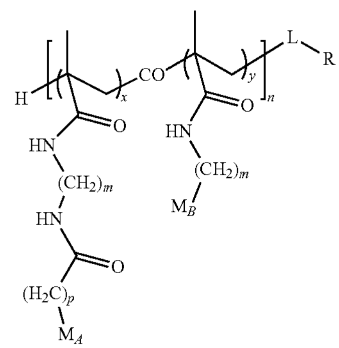

wherein n, x, y, L, R, $M_A$ and $M_B$ are as defined above;

wherein q is an integer ranging from 1 to 20, preferably from 1 to 10, preferably from 1 to 5, preferably 2, 3, 4, m is an integer ranging from 1 to 20, preferably from 1 to 10, preferably from 1 to 5, preferably 2, 3, 4 and p is an integer ranging from 1 to 20, preferably from 1 to 10, preferably from 1 to 6, preferably 3, 4, 5.

In a specific embodiment, the at least one exchanging ligand which is a copolymer is of formula (V-b):

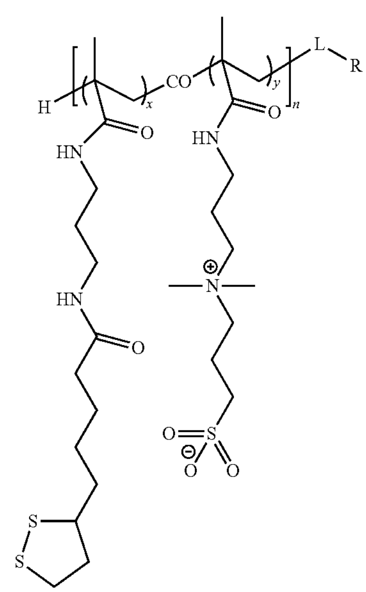

wherein n, x, y, L and R are as defined in formula (V) above; or a reduced form thereof.

In another specific embodiment, the at least one exchanging ligand which is a copolymer is of formula (V-c):

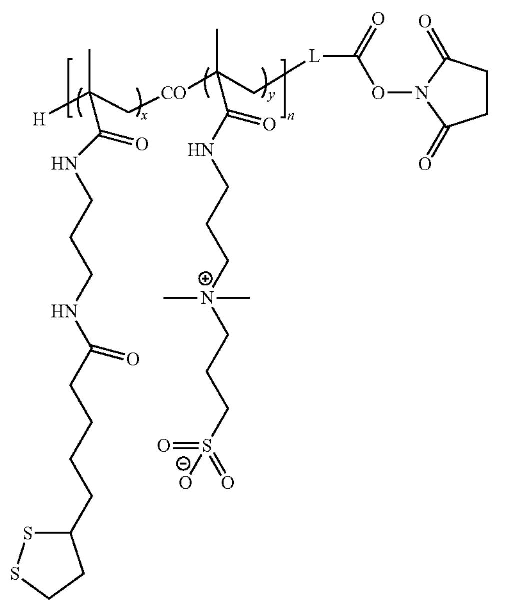

wherein n, x, y and L are as defined in formula (V) above; or a reduced form thereof.

In another specific embodiment, the at least one exchanging ligand which is a copolymer is of formula (V-d):

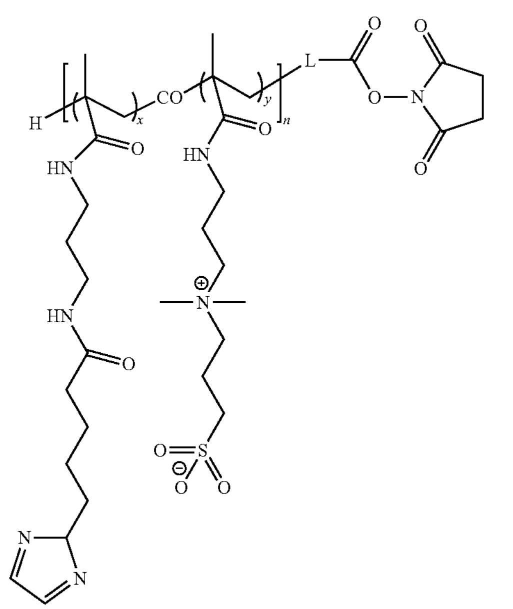

wherein n, x, y and L are as defined in formula (V) above; or a reduced form thereof.

In another specific embodiment, the at least one exchanging ligand which is a copolymer is of formula (V-e):

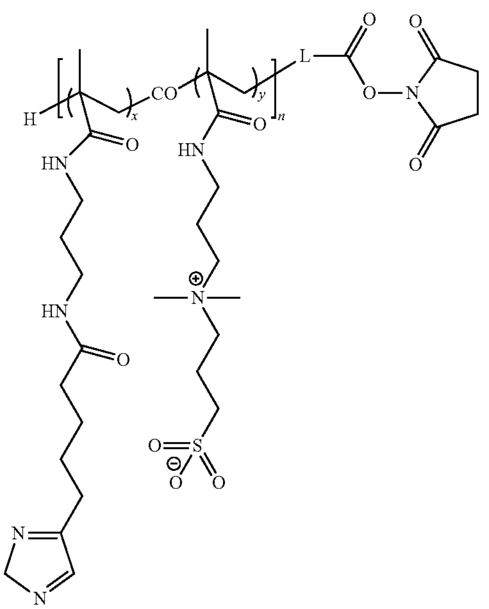

wherein n, x, y and L are as defined in formula (V) above; or a reduced form thereof.

According to an embodiment, the at least one exchanging ligand which is a copolymer is of general formula (VI):

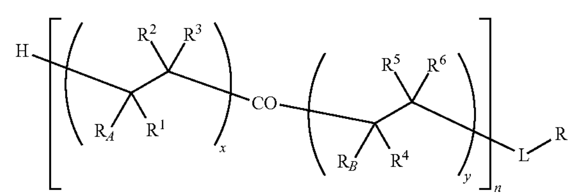

wherein n, x, y, L and R are as defined in formula (V);

$R_A$ represents a group comprising the first moiety $M_A$ having affinity for the surface of the nanoparticles 3;

$R_B$ represents a group comprising the second moiety $M_B$ being hydrophilic;

$R^1$, $R^2$, $R^3$, $R^4$, $R^5$ and $R^6$ represent each independently H or a group selected from the alkyl, alkenyl, aryl, hydroxyl, halogen, alkoxy and carboxylate, amide.

According to an embodiment, the at least one exchanging ligand which is a copolymer is of general formula (VII):

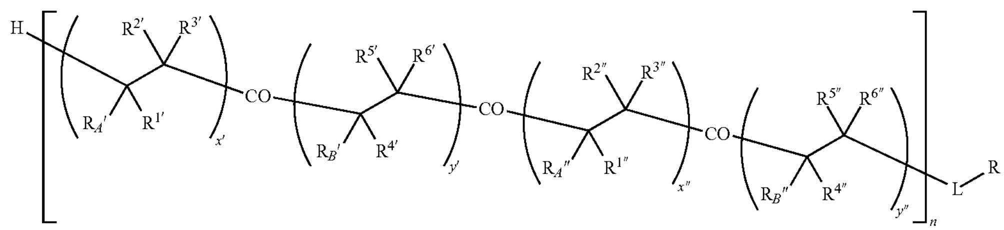

wherein

L and R are as defined in formula (V);

$R_A'$ and $R_A''$ represent respectively a group comprising a first moiety $M_A'$ and a group comprising a first moiety $M_A''$, said moieties $M_A'$ and $M_A''$ having affinity for the surface of the nanoparticles 3;

$R_B'$ and $R_B''$ represent respectively a group comprising a second moiety $M_B'$ and a group comprising a second moiety $M_B''$, said moieties $M_B'$ and $M_B''$ being hydrophilic;

$R^{1'}$, $R^{2'}$, $R^{3'}$, $R^{4'}$, $R^{5'}$, $R^{6'}$, $R^{1''}$, $R^{2''}$, $R^{3''}$, $R^{4''}$, $R^{5''}$ and $R^{6''}$ represent each independently H or a group selected from the alkyl, alkenyl, aryl, hydroxyl, halogen, alkoxy and carboxylate, amide;

n represents a positive integer, preferably an integer ranging from 1 to 1000, preferably from 1 to 499, from 1 to 249 or from 1 to 99;

x' and x" represent each independently a percentage of n, wherein at least one of x' and x" is different from 0% of n; wherein x' and x" are different from 100% of n, preferably x' and x" are ranging from more than 0% to less than 100% of n, preferably from more than 0% to 50% of n, from more than 0% to 50% of n;

y' and y" represent each independently a percentage of n, wherein at least one of y' and y" is different from 0% of n; wherein y' and y" are different from 100% of n, preferably y' and y" are from more than 0% to less than 100% of n, preferably from more than 0% to 50% of n, from more than 0% to 50% of n;

wherein x'+x"+y'+y" is equal to 100% of n.

In another embodiment, of the invention, the at least one exchanging ligand which is a copolymer is synthesized from at least 3 monomers, said monomers being:

one anchoring monomer A as defined above, one hydrophilic monomer B as defined above, one hydrophobic monomer C having a side-chain comprising a hydrophobic function $M_C$, and wherein one end of copolymer is H and the other end comprises a functional group or a bioactive group.

According to an embodiment, the at least one exchanging ligand which is a copolymer is of general formula (VIII):

$$H\text{-}P[(A)_x\text{-}co\text{-}(B)_y\text{-}co\text{-}(C)_z]_n\text{-}L\text{-}R$$

wherein

A, B, L, R and n are as defined above;

C represents a hydrophobic monomer having a side-chain comprising a moiety $M_C$ being hydrophobic;

x, y and z represent each independently a percentage of n, wherein x and y are different from 0% of n and different from 100% of n, preferably x, y and z are ranging from more than 0% to less than 100% of n, preferably from more than 0% to 80% of n, from more than 0% to 50% of n and wherein x+y+z is equal to 100% of n.

According to an embodiment, the at least one exchanging ligand which is a copolymer is of general formula (IX):

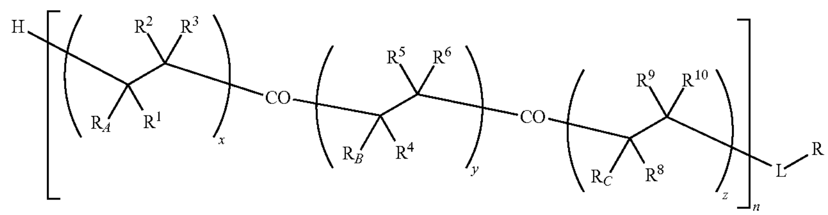

wherein n, L, R, $R_A$, $R_B$, $R_1$, $R^2$, $R^3$, $R^4$, $R^5$ and $R^6$ are as defined above;

$R_C$ represents a group comprising the third moiety $M_C$ being hydrophobic;

$R^8$, $R^9$, and $R^{10}$ represent each independently H or a group selected from the alkyl, alkenyl, aryl, hydroxyl, halogen, alkoxy and carboxylate, amide;

x, y and z represent each independently a percentage of n, wherein x and y are different from 0% of n and different from 100% of n, preferably x, y and z are ranging from more than 0% to less than 100% of n, preferably from more than 0% to 80% of n, from more than 0% to 50% of n; and wherein x+y+z is equal to 100% of n.

In one embodiment of the invention, x+y is ranging from 5 to 500, from 5 to 250, from 5 to 100, from 5 to 75, from 5 to 50, from 10 to 50, from 10 to 30, from 5 to 35, from 5 to 25, from 15 to 25. In one embodiment of the invention, x+y+z is ranging from 5 to 750, from 5 to 500, from 5 to 150, from 5 to 100, from 10 to 75, from 10 to 50, from 5 to 50, from 15 to 25, from 5 to 25. In one embodiment of the invention, x'+x"+y'+y" is ranging from 5 to 500, from 5 to 250, from 5 to 100, from 5 to 75, from 5 to 50, from 10 to 50, from 10 to 30, from 5 to 35, from 5 to 25, from 15 to 25. In one embodiment of the invention, said x is equal to x'+x". In one embodiment of the invention, said y is equal to y'+y". In one embodiment of the invention, x'+x"+y'+y"+z'+z" is ranging from 5 to 750, from 5 to 500, from 5 to 150, from 5 to 100, from 10 to 75, from 10 to 50, from 5 to 50, from 15 to 25, from 5 to 25. In one embodiment of the invention, said z is equal to z'+z".

In one embodiment, the first moiety $M_A$ having affinity for the surface of the nanoparticles 3 has preferably affinity for a metal present at the surface of the nanoparticles 3 or for a material present at the surface of the nanoparticles 3 and selected in the group of O, S, Se, Te, N, P, As, and mixture thereof.

In one embodiment of the invention, said at least one exchanging ligand which is a copolymer comprising at least two monomers has a plurality of monomers including the monomer A and the monomer B. In one embodiment, said ligand is a random or block copolymer. In another embodiment, said ligand is a random or block copolymer consisting essentially of monomer A and monomer B. In one embodiment of the invention, said ligand is a multi-dentate ligand.

In one embodiment of the invention, said first moiety $M_A$ having affinity for the surface of the nanoparticles 3 and in particular affinity for a metal present at the surface of the nanoparticles 3 includes, but is not limited to, a thiol moiety, a dithiol moiety, an imidazole moiety, a catechol moiety, a pyridine moiety, a pyrrole moiety, a thiophene moiety, a thiazole moiety, a pyrazine moiety, a carboxylic acid or carboxylate moiety, a naphthyridine moiety, a phosphine moiety, a phosphine oxide moiety, a phenol moiety, a primary amine moiety, a secondary amine moiety, a tertiary amine moiety, a quaternary amine moiety, an aromatic amine moiety, or a combination thereof.

In one embodiment of the invention, said first moiety $M_A$ having affinity for the surface of the nanoparticles 3 and in particular affinity for a material selected in the group of O, S, Se, Te, N, P, As, and mixture thereof, includes, but is not limited to, an imidazole moiety, a pyridine moiety, a pyrrole moiety, a thiazole moiety, a pyrazine moiety, a naphthyridine moiety, a phosphine moiety, a phosphine oxide moiety, a primary amine moiety, a secondary amine moiety, a tertiary amine moiety, a quaternary amine moiety, an aromatic amine moiety, or a combination thereof.

In one embodiment of the invention, said first moiety $M_A$ is not a dihydrolipoic acid (DHLA) moiety.

In another embodiment of the invention, said first moiety $M_A$ is not an imidazole moiety.

In one embodiment, monomers A and B are methacrylamide monomers.

In one embodiment of the invention, said second moiety $M_B$ having a high water solubility includes, but is not limited to, a zwitterionic moiety (i.e. any compound having both a negative charge and a positive charge, preferably a group with both an ammonium group and a sulfonate group or a group with both an ammonium group and a carboxylate group) such as for example an aminocarboxylate, an aminosulfonate, a carboxybetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a sulfobetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphobetaine wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphorylcholine, a phosphocholine moiety, and combinations thereof or a PEG moiety.

An example of a suitable PEG moiety is $—[O—CH_2—CHR']_n—R"$, wherein R' can be H or $C_1$-$C_3$ alkyl, R" can be H, —OH, $C_1$-$C_6$ alkyl, $C_1$-$C_6$ alkoxy, aryl, aryloxy, arylalkyl, or arylalkoxy and n can be an integer in the range of 1 to 120, preferably of 1 to 60, more preferably of 1 to 30.

In one embodiment, when B comprises a monomer comprising a second moiety $M_B$ which is a PEG moiety, then B further comprises at least one monomer comprising a second moiety MB which is not a PEG moiety.

In another embodiment of the invention, said second moiety $M_B$ having a high water solubility is not a PEG moiety.

In one embodiment of the invention, said moiety $M_A$ comprises said moieties $M_A$' and $M_A$".

In one embodiment of the invention, said moiety $M_B$ comprises said moieties $M_B$' and $M_B$".

In one embodiment of the invention, said first moieties $M_A$' and $M_A$" having affinity for the surface of the nanoparticles 3 and in particular affinity for a metal present at the surface of the nanoparticles 3 include, but is not limited to, a thiol moiety, a dithiol moiety, an imidazole moiety, a catechol moiety, a pyridine moiety, a pyrrole moiety, a thiophene moiety, a thiazole moiety, a pyrazine moiety, a carboxylic acid or carboxylate moiety, a naphthyridine moiety, a phosphine moiety, a phosphine oxide moiety, a phenol moiety, a primary amine moiety, a secondary amine moiety, a tertiary amine moiety, a quaternary amine moiety, an aromatic amine moiety, or a combination thereof.

In one embodiment of the invention, said first moieties $M_A$' and $M_A$" having affinity for the surface of the nanoparticles 3 and in particular affinity for a material selected in the group of O, S, Se, Te, N, P, As, and mixture thereof, include, but is not limited to, an imidazole moiety, a pyridine moiety, a pyrrole moiety, a thiazole moiety, a pyrazine moiety, a naphthyridine moiety, a phosphine moiety, a phosphine oxide moiety, a primary amine moiety, a secondary amine moiety, a tertiary amine moiety, a quaternary amine moiety, an aromatic amine moiety, or a combination thereof.

In one embodiment of the invention, said first moiety $M_A$' having affinity for the surface of the nanoparticles 3 is a dithiol moiety and said first moiety $M_A$" having affinity for the surface of the nanoparticles 3 is an imidazole moiety.

In one embodiment of the invention, said second moieties $M_B$' and $M_B$" having a high water solubility include, but is not limited to, a zwitterionic moiety (i.e. any compound having both a negative charge and a positive charge, preferably a group with both an ammonium group and a sulfonate group or a group with both an ammonium group and a carboxylate group) such as for example an aminocarboxylate, an aminosulfonate, a carboxybetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a sulfobetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphobetaine wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphorylcholine, a phosphocholine moiety, and combinations thereof or a PEG moiety, or a poly(ether)glycol moiety, wherein if $M_B'$ is a PEG moiety, then $M_B''$ is not a PEG moiety and inversely.

In one embodiment of the invention, said second moiety $M_B'$ having a high water solubility is a sulfobetaine group and said second moiety $M_B''$ having a high water solubility is a PEG moiety.

In one embodiment of the invention, said third moiety $M_C$ having a reactive function can form a covalent bond with a selected agent under selected conditions and includes, but is not limited to, any moiety having an amine group such as a primary amine group, any moiety having an azido group, any moiety having an halogen group, any moiety having an alkenyl group, any moiety having an alkynyl group, any moiety having an acidic function, any moiety having an activated acidic function, any moiety having an alcoholic group, any moiety having an activated alcoholic group, any moiety having a thiol group. It can also be a small molecule, such as biotin, that can bind with high affinity to a macromolecule, such as a protein or an antibody.

According to one embodiment, the reactive function of $M_C$ may be protected by any suitable protective group commonly used in the chemical practice. Protection and deprotection may be performed by any suitable method known in the art and adapted to the structure of the molecule to be protected. The reactive function of $M_C$ may be protected during the synthesis of the ligand and removed after the polymerization step. The reactive group of $M_C$ may alternatively be introduced in the ligand after the polymerization step.

In another embodiment of the invention, said third moiety $M_C$ having a reactive function can form a non covalent bond with a selective binding counterpart and said third moiety $M_C$ having a reactive function includes, but is not limited to, biotin that binds its counterpart streptavidin, a nucleic acid that binds its counterpart a sequence-complementary nucleic acid, FK506 that binds its counterpart FKBP, an antibody that binds its counterpart the corresponding antigen.

In one embodiment of the invention, $R_C$ comprising the third moiety $M_C$ can have the formula $-L_C-M_C$, wherein $L_C$ can be a bond or an alkylene, alkenylene, a PEG moiety, or arylene linking group having 1 to 8 chain atoms and can be optionally interrupted or terminated by —O—, —S—, —$NR_7$—, wherein $R_7$ is H or alkyl, —CO—, —NHCO—, —CONH— or a combination thereof and $M_C$ corresponds to the third moiety as described here above.

An example of a suitable PEG moiety is —[O—$CH_2$—CHR']$_n$—, wherein R' can be H or $C_1$-$C_3$ alkyl, and n can be an integer in the range of 0 to 30.

According to one embodiment, the functional group is selected from the group comprising —NH2, —COOH, —OH, —SH, —CHO, ketone, halide; activated ester such as for example N-hydroxysuccinimide ester, N-hydroxyglutarimide ester or maleimide ester; activated carboxylic acid such as for example acid anhydride or acid halide; isothiocyanate; isocyanate; alkyne; azide; glutaric anhydride, succinic anhydride, maleic anhydride; hydrazide; chloroformate, maleimide, alkene, silane, hydrazone, oxime and furan.

According to an embodiment, the bioactive group is selected from the group comprising avidin or streptavidin; antibody such as a monoclonal antibody or a single chain antibody; sugars; a protein or peptide sequence having a specific binding affinity for an affinity target, such as for example an avimer or an affibody (the affinity target may be for example a protein, a nucleic acid, a peptide, a metabolite or a small molecule), antigens, steroids, vitamins, drugs, haptens, metabolites, toxins, environmental pollutants, amino acids, peptides, proteins, aptamers, nucleic acids, nucleotides, peptide nucleic acid (PNA), folates, carbohydrates, lipids, phospholipid, lipoprotein, lipopolysaccharide, liposome hormone, polysaccharide, polymers, polyhistidine tags, fluorophores.

In one embodiment of the invention, $R_A$ comprising the first moiety $M_A$ can have the formula $-L_A-M_A$, wherein $L_A$ can be a bond or an alkylene, alkenylene, or arylene linking group having 1 to 8 chain atoms and can be optionally interrupted or terminated by —O—, —S—, —$NR_7$—, wherein $R_7$ is H or alkyl, —CO—, —NHCO—, —CONH— or a combination thereof and $M_A$ corresponds to the first moiety as described here above.

In one embodiment of the invention, $R_B$ comprising the second moiety $M_B$ can have the formula $-L_B-M_B$, wherein $L_B$ can be a bond or an alkylene, alkenylene, or arylene linking group having 1 to 8 chain atoms and can be optionally interrupted or terminated by —O—, —S—, —$NR_7$—, wherein $R_7$ is H or alkyl, —CO—, —NHCO—, —CONH— or a combination thereof and $M_B$ corresponds to the second moiety as described here above.

According to one embodiment, the method for obtaining the particle 1 of the invention does not comprise an additional heating step to heat the particle 1 after the final step of the method of the invention, the temperature of this additional heating step being at least 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., 1400° C., 1450° C., or 1500° C. Indeed, an additional heating step, especially at high temperature, may cause the degradation of the specific property of the nanoparticles 3, for example it may cause the quenching of the fluorescence for fluorescent nanoparticles comprised in particles 1.

According to one embodiment, the method of the invention further comprises an additional heating step to heat the particle 1. In this embodiment, said additional heating step takes place after the final step of the method of the invention.

According to one embodiment, the temperature of the additional heating step is at least 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., 1400° C., 1450° C., or 1500° C.

According to one embodiment, the time of the additional heating step is at least 5 min, 10 min, 15 min, 20 min, 25 min, 30 min, 35 min, 40 min, 45 min, 50 min, 55 min, 60 min, 1.5 hours, 2 hours, 2.5 hours, 3 hours, 3.5 hours, 4 hours, 4.5 hours, 5 hours, 5.5 hours, 6 hours, 6.5 hours, 7 hours, 7.5 hours, 8 hours, 8.5 hours, 9 hours, 9.5 hours, 10 hours, 11 hours, 12 hours, 13 hours, 14 hours, 15 hours, 16 hours, 17 hours, 18 hours, 19 hours, 20 hours, 21 hours, 22 hours, 23 hours, 24 hours, 30 hours, 36 hours, 42 hours, 48 hours, 54 hours, 60 hours, 66 hours, 72 hours, 78 hours, 84 hours, 90 hours, 96 hours, 102 hours, 108 hours, 114 hours, 120 hours, 126 hours, 132 hours, 138 hours, 144 hours, 150 hours, 156 hours, 162 hours or 168 hours.

According to one embodiment, the method of the invention further comprises a step of functionalization of said particle 1.

According to one embodiment, the particle 1 of the invention is functionalized with a specific-binding component, wherein said specific-binding component includes but is not limited to: antigens, steroids, vitamins, drugs, haptens, metabolites, toxins, environmental pollutants, amino acids, peptides, proteins, antibodies, polysaccharides, nucleotides, nucleosides, oligonucleotides, psoralens, hormones, nucleic acids, nucleic acid polymers, carbohydrates, lipids, phospholipids, lipoproteins, lipopolysaccharides, liposomes, lipophilic polymers, synthetic polymers, polymeric microparticles, biological cells, virus and combinations thereof. Preferred peptides include, but are not limited to: neuropeptides, cytokines, toxins, protease substrates, and protein kinase substrates. Preferred protein conjugates include enzymes, antibodies, lectins, glycoproteins, histones, albumins, lipoproteins, avidin, streptavidin, protein A, protein G, phycobiliproteins and other fluorescent proteins, hormones, toxins and growth factors. Preferred nucleic acid polymers are single- or multi-stranded, natural or synthetic DNA or RNA oligonucleotides, or DNA/RNA hybrids, or incorporating an unusual linker such as morpholine derivatized phosphides, or peptide nucleic acids such as N-(2-aminoethyl)glycine units, where the nucleic acid contains fewer than 50 nucleotides, more typically fewer than 25 nucleotides. The functionalization of the particle 1 of the invention can be made using techniques known in the art.

According to one embodiment, the method further comprises a step of forming a shell on the particle 1.

According to one embodiment, prior the step of forming a shell on the particle 1, said particles 1 are separated, collected, dispersed and/or suspended as described hereabove.

According to one embodiment, prior the step of forming a shell on the particle 1, said particles 1 are not separated, collected, dispersed and/or suspended.

According to one embodiment, the shell forming step comprises directing the particles 1 suspended in a gas to a tube wherein they are placed in the presence of at least one molecule comprising silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine cadmium, sulfur, selenium, indium, tellurium, mercury, tin, copper, nitrogen, gallium, antimony, thallium, molybdenum, palladium, cerium, tungsten, cobalt, manganese, or a mixture thereof; and molecular oxygen to form a shell of the corresponding oxide, mixed oxides, mixed oxides thereof or a mixture thereof.

According to one embodiment, the shell forming step comprises directing the particles 1 suspended in a gas to a tube wherein they are alternatively placed in the presence of molecules comprising silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine cadmium, sulfur, selenium, indium, tellurium, mercury, tin, copper, nitrogen, gallium, antimony, thallium, molybdenum, palladium, cerium, tungsten, cobalt, manganese, or a mixture thereof; and molecular oxygen to form a shell of the corresponding oxide, mixed oxides, mixed oxides thereof or a mixture thereof.

According to one embodiment, the shell forming step may be repeated at least twice using different or same molecules comprising silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine cadmium, sulfur, selenium, indium, tellurium, mercury, tin, copper, nitrogen, gallium, antimony, thallium, molybdenum, palladium, cerium, tungsten, cobalt, manganese, or a mixture thereof. In this embodiment, the thickness of the shell is increased.

According to one embodiment, the shell forming step comprises directing the particles 1 suspended in a gas to a tube wherein they are subjected to an Atomic Layer Deposition (ALD) process to form a shell on particles 1, said shell comprising silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, the shell forming step by ALD may be repeated at least twice using different or same shell precursors. In this embodiment, the thickness of the shell is increased.

According to one embodiment, the tube for the shell forming step may be straight, spiral or ring-shaped.

According to one embodiment, during the shell forming step, the particles 1 may be deposited on a support as described hereabove. In this embodiment, said support is in the tube, or is the tube itself.

According to one embodiment, the shell forming step comprises dispersing the particles 1 in a solvent and subjecting them to a heating step as described hereabove.

According to one embodiment, the shell forming step comprises dispersing the particles 1 in a solvent and subjecting them to the method of the invention. In this embodiment, the method of the invention can be repeated with the particles 1 at least once, or several times to obtain at least one or several shells respectively.

According to one embodiment, after the shell forming step, the particles 1 are collected as described hereabove.

According to one embodiment, the size of the particles 1 can be controlled by the heating temperature, the heating time, the cooling temperature, the quantity of solution A and/or B, the concentration of solution A and/or B, the hydrolysis time, the hydrolysis temperature, the nanoparticles 3 concentration in the colloidal suspension of nanoparticles 3, the nature of the acid and/or the base in solution A or B, the nature of the organic solvent, the nature and the flow rate of the gases injected into the system, or the geometry and the dimensions of the various elements of the device 4.

According to one embodiment, the size distribution of the particles 1 can be controlled by the heating temperature, the heating time, the cooling temperature, the quantity of solution A and/or B, the concentration of solution A and/or B, the hydrolysis time, the hydrolysis temperature, the nanoparticles 3 concentration in the colloidal suspension of nanoparticles 3, the nature of the acid and/or the base in solution A or B, the nature of the organic solvent, the nature and the flow rate of the gases injected into the system, or the geometry and the dimensions of the various elements of the device 4.

According to one embodiment, the degree of filling of the particles 1 by the nanoparticles 3 can be controlled by the heating temperature, the heating time, the cooling temperature, the quantity of solution A and/or B, the concentration of solution A and/or B, the hydrolysis time, the hydrolysis temperature, the nanoparticles 3 concentration in the colloidal suspension of nanoparticles 3, the nature of the acid and/or the base in solution A or B, the nature of the organic solvent, the nature and the flow rate of the gases injected into the system, or the geometry and the dimensions of the various elements of the device 4.

According to one embodiment, the density of the particles 1 can be controlled by the heating temperature, the heating time, the cooling temperature, the quantity of solution A and/or B, the concentration of solution A and/or B, the hydrolysis time, the hydrolysis temperature, the nanoparticles 3 concentration in the colloidal suspension of nanoparticles 3, the nature of the acid and/or the base in solution A or B, the nature of the organic solvent, the nature and the flow rate of the gases injected into the system, or the geometry and the dimensions of the various elements of the device 4.

According to one embodiment, the porosity of the particles 1 can be controlled by the heating temperature, the heating time, the cooling temperature, the quantity of solution A and/or B, the concentration of solution A and/or B, the hydrolysis time, the hydrolysis temperature, the nanoparticles 3 concentration in the colloidal suspension of nanoparticles 3, the nature of the acid and/or the base in solution A or B, the nature of the organic solvent, the nature and the flow rate of the gases injected into the system, or the geometry and the dimensions of the various elements of the device 4.

According to one embodiment, the permeability to gas of the particles 1 can be controlled by the heating temperature, the heating time, the cooling temperature, the quantity of solution A and/or B, the concentration of solution A and/or B, the hydrolysis time, the hydrolysis temperature, the nanoparticles 3 concentration in the colloidal suspension of nanoparticles 3, the nature of the acid and/or the base in solution A or B, the nature of the organic solvent, the nature and the flow rate of the gases injected into the system, or the geometry and the dimensions of the various elements of the device 4.

According to one embodiment, the method of the invention does not comprise the following steps: preparing an aqueous or organic solution of nanoparticles 3, immersing a nanometer pore glass in said solution for at least ten minutes, taking the immersed nanometer pore glass out of the solution and drying it in the air, wrapping and packaging the nanometer pore glass with resin, and solidifying said resin.

According to one embodiment, the method further comprises the dispersion of the as-obtained particles in a $H_2$ gas flow. In this embodiment, said $H_2$ gas flow will allow the passivation of defects in the nanoparticles 3, the inorganic material 2 and/or the particle 1.

Another object of the invention relates to a particle 1 obtained by the method of the invention, wherein said obtained particle 1 comprises a plurality of nanoparticles 3 encapsulated in an inorganic material 2 (as illustrated in FIG. 1).

According to one embodiment, the obtained particle 1 is a composite particle.

According to one embodiment, the plurality of nanoparticles 3 is uniformly dispersed in said inorganic material 2. In this embodiment, the uniform dispersion of the plurality of nanoparticles 3 in the inorganic material 2 prevents the aggregation of said nanoparticles 3, thereby preventing the degradation of their properties. For example, in the case of inorganic fluorescent nanoparticles, a uniform dispersion will allow the optical properties of said nanoparticles to be preserved, and quenching can be avoided.

Obtained particle 1 of the invention are also particularly interesting as they can easily comply with ROHS requirements depending on the inorganic material 2 selected. It is then possible to have ROHS compliant particles while preserving the properties of nanoparticles 3 that may not be ROHS compliant themselves.

According to one embodiment, the obtained particle 1 is air processable. This embodiment is particularly advantageous for the manipulation or the transport of said obtained particle 1 and for the use of said obtained particle 1 in a device such as an optoelectronic device.

According to one embodiment, the obtained particle 1 is compatible with standard lithography processes. This embodiment is particularly advantageous for the use of said obtained particle 1 in a device such as an optoelectronic device.

According to one embodiment, the obtained particle 1 has a largest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the obtained particle 1 has a smallest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the size ratio between the obtained particle 1 and the nanoparticles 3 ranges from 1.25 to 1 000, preferably from 2 to 500, more preferably from 5 to 250, even more preferably from 5 to 100.

According to one embodiment, the smallest dimension of the obtained particle 1 is smaller than the largest dimension of said obtained particle 1 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the obtained particles 1 have an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

Obtained particles 1 with an average size less than 1 μm have several advantages compared to bigger particles comprising the same number of nanoparticles 3: i) increasing the light scattering compared to bigger particles; ii) obtaining more stable colloidal suspensions compared to bigger particles, when they are dispersed in a solvent; iii) having a size compatible with pixels of at least 100 nm.

Obtained particles 1 with an average size larger than 1 μm have several advantages compared to smaller particles comprising the same number of nanoparticles 3: i) reducing light scattering compared to smaller particles; ii) having whispering-gallery wave modes; iii) having a size compatible with pixels equal to or larger than 1 μm; iv) increasing the average distance between nanoparticles 3 comprised in said obtained particles 1, resulting in a better heat draining; v) increasing the average distance between nanoparticles 3 comprised in said obtained particles 1 and the surface of said obtained particles 1, thus better protecting the nanoparticles 3 against oxidation, or delaying oxidation resulting from a chemical reaction with chemical species coming from the outer space of said particles 1; vi) increasing the mass ratio between obtained particle 1 and nanoparticles 3 comprised in said obtained particle 1 compared to smaller obtained particles 1, thus reducing the mass concentration of chemical elements subject to ROHS standards, making it easier to comply with the ROHS requirements.

According to one embodiment, the obtained particle 1 is ROHS compliant.

According to one embodiment, the obtained particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the obtained particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the obtained particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the obtained particle 1 comprises heavier chemical elements than the main chemical element present in the inorganic material 2. In this embodiment, said heavy chemical elements in the obtained particle 1 will lower the mass concentration of chemical elements subject to ROHS standards, allowing said obtained particle 1 to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the obtained particle 1 has a smallest curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$; 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299 $\mu m^{-1}$, 0.0296 $\mu m^{-1}$, 0.0294 $\mu m^{-1}$, 0.0292 $\mu m^{-1}$, 0.029 $\mu m^{-1}$, 0.0288 $\mu m^{-1}$, 0.0286 $\mu m^{-1}$, 0.0284 $\mu m^{-1}$, 0.0282 $\mu m^{-1}$, 0.028 $\mu m^{-1}$, 0.0278 $\mu m^{-1}$, 0.0276 $\mu m^{-1}$, 0.0274 $\mu m^{-1}$, 0.0272 $\mu m^{-1}$; 0.0270 $\mu m^{-1}$, 0.0268 $\mu m^{-1}$, 0.02667 $\mu m^{-1}$, 0.0265 $\mu m^{-1}$, 0.0263 $\mu m^{-1}$, 0.0261 $\mu m^{-1}$, 0.026 $\mu m^{-1}$, 0.0258 $\mu m^{-1}$, 0.0256 $\mu m^{-1}$, 0.0255 $\mu m^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 $\mu m^{-1}$, 0.023 $\mu m^{-1}$, 0.0229 $\mu m^{-1}$, 0.0227 $\mu m^{-1}$, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, the obtained particle 1 has a largest curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533

μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the obtained particles 1 are polydisperse.

According to one embodiment, the obtained particles 1 are monodisperse.

According to one embodiment, the obtained particles 1 have a narrow size distribution.

According to one embodiment, the obtained particles 1 are not aggregated.

According to one embodiment, the obtained particles 1 do not touch, are not in contact.

According to one embodiment, the obtained particles 1 are adjoining, are in contact.

According to one embodiment, the surface roughness of the obtained particle 1 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said obtained particle 1, meaning that the surface of said obtained particles 1 is completely smooth.

According to one embodiment, the surface roughness of the obtained particle 1 is less or equal to 0.5% of the largest dimension of said obtained particle 1, meaning that the surface of said obtained particles 1 is completely smooth.

According to one embodiment, the obtained particle 1 has a spherical shape, an ovoid shape, a discoidal shape, a cylindrical shape, a faceted shape, a hexagonal shape, a triangular shape, a cubic shape, or a platelet shape.

According to one embodiment, the obtained particle 1 has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the obtained particle 1 has a spherical shape, or the obtained particle 1 is a bead.

According to one embodiment, the obtained particle 1 is hollow, i.e. the obtained particle 1 is a hollow bead.

According to one embodiment, the obtained particle 1 does not have a core/shell structure.

According to one embodiment, the obtained particle 1 has a core/shell structure as described hereafter.

According to one embodiment, the obtained particle 1 is not a fiber.

According to one embodiment, the obtained particle 1 is not a matrix with undefined shape.

According to one embodiment, the obtained particle 1 is not macroscopical piece of glass. In this embodiment, a piece of glass refers to glass obtained from a bigger glass entity for example by cutting it, or to glass obtained by using a mold. In one embodiment, a piece of glass has at least one dimension exceeding 1 mm.

According to one embodiment, the obtained particle 1 is not obtained by reducing the size of the inorganic material 2. For example, obtained particle 1 is not obtained by milling a piece of inorganic material 2, nor by cutting it, nor by firing it with projectiles like particles, atoms or electrons, or by any other method.

According to one embodiment, the obtained particle 1 is not obtained by milling bigger particles or by spraying a powder.

According to one embodiment, the obtained particle 1 is not a piece of nanometer pore glass doped with nanoparticles 3.

According to one embodiment, the obtained particle 1 is not a glass monolith.

According to one embodiment, the spherical obtained particle 1 has a diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical obtained particles 1 has an average diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical obtained particles 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical obtained particle 1 has a unique curvature of at least 200 $μm^{-1}$, 100 $μm^{-1}$, 66.6 $μm^{-1}$, 50 $μm^{-1}$, 33.3 $μm^{-1}$, 28.6 $μm^{-1}$, 25 $μm^{-1}$, 20 $μm^{-1}$, 18.2 $μm^{-1}$, 16.7 $μm^{-1}$, 15.4 $μm^{-1}$, 14.3 $μm^{-1}$, 13.3 $μm^{-1}$, 12.5 $μm^{-1}$, 11.8 $μm^{-1}$, 11.1 $μm^{-1}$, 10.5 $μm^{-1}$, 10 $μm^{-1}$, 9.5 $μm^{-1}$, 9.1 $μm^{-1}$, 8.7 $μm^{-1}$, 8.3 $μm^{-1}$, 8 $μm^{-1}$, 7.7 $μm^{-1}$, 7.4 $μm^{-1}$, 7.1 $μm^{-1}$, 6.9 $μm^{-1}$, 6.7 $μm^{-1}$, 5.7 $μm^{-1}$, 5 $μm^{-1}$, 4.4 $μm^{-1}$, 4 $μm^{-1}$, 3.6 $μm^{-1}$, 3.3 $μm^{-1}$, 3.1 $μm^{-1}$, 2.9 $μm^{-1}$, 2.7 $μm^{-1}$, 2.5 $μm^{-1}$, 2.4 $μm^{-1}$, 2.2 $μm^{-1}$, 2.1 $μm^{-1}$, 2 $μm^{-1}$, 1.3333 $μm^{-1}$, 0.8 $μm^{-1}$, 0.6666 $μm^{-1}$, 0.5714 $μm^{-1}$, 0.5 $μm^{-1}$, 0.4444 $μm^{-1}$, 0.4 $μm^{-1}$, 0.3636 $μm^{-1}$, 0.3333 $μm^{-1}$, 0.3080 $μm^{-1}$, 0.2857 $μm^{-1}$, 0.2667 $μm^{-1}$, 0.25 $μm^{-1}$, 0.2353 $μm^{-1}$, 0.2222 $μm^{-1}$, 0.2105 $μm^{-1}$, 0.2 $μm^{-1}$, 0.1905 $μm^{-1}$, 0.1818 $μm^{-1}$, 0.1739 $μm^{-1}$, 0.1667 $μm^{-1}$, 0.16 $μm^{-1}$, 0.1538 $μm^{-1}$, 0.1481 $μm^{-1}$, 0.1429 $μm^{-1}$, 0.1379 $μm^{-1}$, 0.1333 $μm^{-1}$, 0.1290 $μm^{-1}$, 0.125 $μm^{-1}$, 0.1212 $μm^{-1}$, 0.1176 $μm^{-1}$, 0.1176 $μm^{-1}$, 0.1143 $μm^{-1}$, 0.1111 $μm^{-1}$, 0.1881 $μm^{-1}$, 0.1053 $μm^{-1}$, 0.1026 $μm^{-1}$, 0.1 $μm^{-1}$, 0.0976 $μm^{-1}$, 0.9524 $μm^{-1}$, 0.0930 $μm^{-1}$, 0.0909 $μm^{-1}$, 0.0889 $μm^{-1}$, 0.870 $μm^{-1}$, 0.0851 $μm^{-1}$, 0.0833 $μm^{-1}$, 0.0816 $μm^{-1}$, 0.08 $μm^{-1}$, 0.0784 $μm^{-1}$, 0.0769 $μm^{-1}$, 0.0755 $μm^{-1}$, 0.0741 $μm^{-1}$, 0.0727 $μm^{-1}$, 0.0714 $μm^{-1}$, 0.0702 $μm^{-1}$, 0.0690 $μm^{-1}$, 0.0678 $μm^{-1}$, 0.0667 $μm^{-1}$, 0.0656 $μm^{-1}$, 0.0645 $μm^{-1}$, 0.0635 $μm^{-1}$, 0.0625 $μm^{-1}$, 0.0615 $μm^{-1}$, 0.0606 $μm^{-1}$, 0.0597 $μm^{-1}$, 0.0588 $μm^{-1}$, 0.0580 $μm^{-1}$, 0.0571 $μm^{-1}$, 0.0563 $μm^{-1}$, 0.0556 $μm^{-1}$, 0.0548 $μm^{-1}$, 0.0541 $μm^{-1}$, 0.0533 $μm^{-1}$, 0.0526 $μm^{-1}$, 0.0519 $μm^{-1}$, 0.0513 $μm^{-1}$, 0.0506 $μm^{-1}$, 0.05 $μm^{-1}$, 0.0494 $μm^{-1}$, 0.0488 $μm^{-1}$, 0.0482 $μm^{-1}$, 0.0476 $μm^{-1}$, 0.0471 $μm^{-1}$, 0.0465 $μm^{-1}$, 0.0460 $μm^{-1}$, 0.0455 $μm^{-1}$, 0.0450 $μm^{-1}$, 0.0444 $μm^{-1}$, 0.0440 $μm^{-1}$, 0.0435 $μm^{-1}$, 0.0430 $μm^{-1}$, 0.0426 $μm^{-1}$, 0.0421 $μm^{-1}$, 0.0417 $μm^{-1}$, 0.0412 $μm^{-1}$, 0.0408 $μm^{-1}$, 0.0404 $μm^{-1}$, 0.04 $μm^{-1}$, 0.0396 $μm^{-1}$, 0.0392 $μm^{-1}$, 0.0388 $μm^{-1}$, 0.0385 $μm^{-1}$; 0.0381 $μm^{-1}$, 0.0377 $μm^{-1}$, 0.0374 $μm^{-1}$, 0.037 $μm^{-1}$, 0.0367 $μm^{-1}$, 0.0364 $μm^{-1}$, 0.0360 $μm^{-1}$, 0.0357 $μm^{-1}$, 0.0354 $μm^{-1}$, 0.0351 $μm^{-1}$, 0.0348 $μm^{-1}$, 0.0345 $μm^{-1}$, 0.0342 $μm^{-1}$, 0.0339 $μm^{-1}$, 0.0336 $μm^{-1}$, 0.0333 $μm^{-1}$, 0.0331 $μm^{-1}$, 0.0328 $μm^{-1}$, 0.0325 $μm^{-1}$, 0.0323 $μm^{-1}$, 0.032 $μm^{-1}$, 0.0317 $μm^{-1}$, 0.0315 $μm^{-1}$, 0.0312 $μm^{-1}$, 0.031 $μm^{-1}$, 0.0308 $μm^{-1}$, 0.0305 $μm^{-1}$, 0.0303 $μm^{-1}$, 0.0301 $μm^{-1}$, 0.03 $μm^{-1}$, 0.0299 $μm^{-1}$, 0.0296 $μm^{-1}$, 0.0294 $μm^{-1}$, 0.0292 $μm^{-1}$, 0.029 $μm^{-1}$, 0.0288 $μm^{-1}$, 0.0286 $μm^{-1}$, 0.0284 $μm^{-1}$, 0.0282 $μm^{-1}$, 0.028 $μm^{-1}$, 0.0278 $μm^{-1}$, 0.0276 $μm^{-1}$, 0.0274 $μm^{-1}$, 0.0272 $μm^{-1}$; 0.0270 $μm^{-1}$, 0.0268 $μm^{-1}$, 0.02667 $μm^{-1}$, 0.0265 $μm^{-1}$, 0.0263 $μm^{-1}$, 0.0261 $μm^{-1}$, 0.026 $μm^{-1}$, 0.0258 $μm^{-1}$, 0.0256 $μm^{-1}$, 0.0255 $μm^{-1}$, 0.0253 $μm^{-1}$, 0.0252 $μm^{-1}$, 0.025 $μm^{-1}$, 0.0248 $μm^{-1}$, 0.0247 $μm^{-1}$, 0.0245 $μm^{-1}$, 0.0244 $μm^{-1}$, 0.0242 $μm^{-1}$, 0.0241 $μm^{-1}$, 0.024 $μm^{-1}$, 0.0238 $μm^{-1}$, 0.0237 $μm^{-1}$, 0.0235 $μm^{-1}$, 0.0234 $μm^{-1}$, 0.0233 $μm^{-1}$, 0.231 $μm^{-1}$, 0.023 $μm^{-1}$, 0.0229 $μm^{-1}$, 0.0227 $μm^{-1}$, 0.0226 $μm^{-1}$, 0.0225 $μm^{-1}$, 0.0223 $μm^{-1}$, 0.0222 $μm^{-1}$, 0.0221 $μm^{-1}$, 0.022 $μm^{-1}$, 0.0219 $μm^{-1}$, 0.0217 $μm^{-1}$, 0.0216 $μm^{-1}$, 0.0215 $μm^{-1}$, 0.0214 $μm^{-1}$, 0.0213 $μm^{-1}$, 0.0212 $μm^{-1}$, 0.0211 $μm^{-1}$, 0.021 $μm^{-1}$, 0.0209 $μm^{-1}$, 0.0208 $μm^{-1}$, 0.0207 $μm^{-1}$, 0.0206 $μm^{-1}$, 0.0205 $μm^{-1}$, 0.0204 $μm^{-1}$, 0.0203 $μm^{-1}$, 0.0202 $μm^{-1}$, 0.0201 $μm^{-1}$, 0.02 $μm^{-1}$, or 0.002 $μm^{-1}$.

According to one embodiment, a statistical set of the spherical obtained particles 1 has an average unique curvature of at least 200 $μm^{-1}$, 100 $μm^{-1}$, 66.6 $μm^{-1}$, 50 $μm^{-1}$, 33.3 $μm^{-1}$, 28.6 $μm^{-1}$, 25 $μm^{-1}$, 20 $μm^{-1}$, 18.2 $μm^{-1}$, 16.7 $μm^{-1}$, 15.4 $μm^{-1}$, 14.3 $μm^{-1}$, 13.3 $μm^{-1}$, 12.5 $μm^{-1}$, 11.8 $μm^{-1}$, 11.1 $μm^{-1}$, 10.5 $μm^{-1}$, 10 $μm^{-1}$, 9.5 $μm^{-1}$, 9.1 $μm^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$; 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299 $\mu m^{-1}$, 0.0296 $\mu m^{-1}$, 0.0294 $\mu m^{-1}$, 0.0292 $\mu m^{-1}$, 0.029 $\mu m^{-1}$, 0.0288 $\mu m^{-1}$, 0.0286 $\mu m^{-1}$, 0.0284 $\mu m^{-1}$, 0.0282 $\mu m^{-1}$, 0.028 $\mu m^{-1}$, 0.0278 $\mu m^{-1}$, 0.0276 $\mu m^{-1}$, 0.0274 $\mu m^{-1}$, 0.0272 $\mu m^{-1}$; 0.0270 $\mu m^{-1}$, 0.0268 $\mu m^{-1}$, 0.02667 $\mu m^{-1}$, 0.0265 $\mu m^{-1}$, 0.0263 $\mu m^{-1}$, 0.0261 $\mu m^{-1}$, 0.026 $\mu m^{-1}$, 0.0258 $\mu m^{-1}$, 0.0256 $\mu m^{-1}$, 0.0255 $\mu m^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 $\mu m^{-1}$, 0.023 $\mu m^{-1}$, 0.0229 $\mu m^{-1}$, 0.0227 $\mu m^{-1}$, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, the curvature of the spherical obtained particle 1 has no deviation, meaning that said obtained particle 1 has a perfect spherical shape. A perfect spherical shape prevents fluctuations of the intensity of scattered light.

According to one embodiment, the unique curvature of the spherical obtained particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said obtained particle 1.

According to one embodiment, the obtained particle 1 is luminescent.

According to one embodiment, the obtained particle 1 is fluorescent.

According to one embodiment, the obtained particle 1 is phosphorescent.

According to one embodiment, the obtained particle 1 is electroluminescent.

According to one embodiment, the obtained particle 1 is chemiluminescent.

According to one embodiment, the obtained particle 1 is triboluminescent.

According to one embodiment, the features of the light emission of obtained particle 1 are sensible to external pressure variations. In this embodiment, "sensible" means that the features of the light emission can be modified by external pressure variations.

According to one embodiment, the wavelength emission peak of obtained particle 1 is sensible to external pressure variations. In this embodiment, "sensible" means that the wavelength emission peak can be modified by external pressure variations, i.e. external pressure variations can induce a wavelength shift.

According to one embodiment, the FWHM of obtained particle 1 is sensible to external pressure variations. In this embodiment, "sensible" means that the FWHM can be modified by external pressure variations, i.e. FWHM can be reduced or increased.

According to one embodiment, the PLQY of obtained particle 1 is sensible to external pressure variations. In this embodiment, "sensible" means that the PLQY can be modified by external pressure variations, i.e. PLQY can be reduced or increased.

According to one embodiment, the features of the light emission of obtained particle 1 are sensible to external temperature variations.

According to one embodiment, the wavelength emission peak of obtained particle 1 is sensible to external temperature variations. In this embodiment, "sensible" means that the wavelength emission peak can be modified by external temperature variations, i.e. external temperature variations can induce a wavelength shift.

According to one embodiment, the FWHM of obtained particle 1 is sensible to external temperature variations. In this embodiment, "sensible" means that the FWHM can be modified by external temperature variations, i.e. FWHM can be reduced or increased.

According to one embodiment, the PLQY of obtained particle 1 is sensible to external temperature variations. In this embodiment, "sensible" means that the PLQY can be modified by external temperature variations, i.e. PLQY can be reduced or increased.

According to one embodiment, the features of the light emission of obtained particle 1 are sensible to external variations of pH.

According to one embodiment, the wavelength emission peak of obtained particle 1 is sensible to external variations of pH. In this embodiment, "sensible" means that the wavelength emission peak can be modified by external variations of pH, i.e. external variations of pH can induce a wavelength shift.

According to one embodiment, the FWHM of obtained particle 1 is sensible to e external variations of pH. In this embodiment, "sensible" means that the FWHM can be modified by external variations of pH, i.e. FWHM can be reduced or increased.

According to one embodiment, the PLQY of obtained particle 1 is sensible to external variations of pH. In this embodiment, "sensible" means that the PLQY can be modified by external variations of pH, i.e. PLQY can be reduced or increased.

According to one embodiment, the obtained particle 1 comprises at least one nanoparticle 3 wherein the wavelength emission peak is sensible to external temperature variations; and at least one nanoparticle 3 wherein the wavelength emission peak is not or less sensible to external temperature variations. In this embodiment, "sensible" means that the wavelength emission peak can be modified by external temperature variations, i.e. wavelength emission peak can be reduced or increased. This embodiment is particularly advantageous for temperature sensor applications.

According to one embodiment, the obtained particle 1 exhibits an emission spectrum with at least one emission peak, wherein said emission peak has a maximum emission wavelength ranging from 400 nm to 50 μm.

According to one embodiment, the obtained particle 1 exhibits an emission spectrum with at least one emission peak, wherein said emission peak has a maximum emission wavelength ranging from 400 nm to 500 nm. In this embodiment, the obtained particle 1 emits blue light.

According to one embodiment, the obtained particle 1 exhibits an emission spectrum with at least one emission peak, wherein said emission peak has a maximum emission wavelength ranging from 500 nm to 560 nm, more preferably ranging from 515 nm to 545 nm. In this embodiment, the obtained particle 1 emits green light.

According to one embodiment, the obtained particle 1 exhibits an emission spectrum with at least one emission peak, wherein said emission peak has a maximum emission wavelength ranging from 560 nm to 590 nm. In this embodiment, the obtained particle 1 emits yellow light.

According to one embodiment, the obtained particle 1 exhibits an emission spectrum with at least one emission peak, wherein said emission peak has a maximum emission wavelength ranging from 590 nm to 750 nm, more preferably ranging from 610 nm to 650 nm. In this embodiment, the obtained particle 1 emits red light.

According to one embodiment, the obtained particle 1 exhibits an emission spectrum with at least one emission peak, wherein said emission peak has a maximum emission wavelength ranging from 750 nm to 50 μm. In this embodiment, the obtained particle 1 emits near infra-red, mid-infra-red, or infra-red light.

According to one embodiment, the obtained particle 1 is magnetic.

According to one embodiment, the obtained particle 1 is ferromagnetic.

According to one embodiment, the obtained particle 1 is paramagnetic.

According to one embodiment, the obtained particle 1 is superparamagnetic.

According to one embodiment, the obtained particle 1 is diamagnetic.

According to one embodiment, the obtained particle 1 is plasmonic.

According to one embodiment, the obtained particle 1 has catalytic properties.

According to one embodiment, the obtained particle 1 has photovoltaic properties.

According to one embodiment, the obtained particle 1 is piezo-electric.

According to one embodiment, the obtained particle 1 is pyro-electric.

According to one embodiment, the obtained particle 1 is ferro-electric.

According to one embodiment, the obtained particle 1 is drug delivery featured.

According to one embodiment, the obtained particle 1 is a light scatterer.

According to one embodiment, the obtained particle 1 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the obtained particle 1 is an electrical insulator. In this embodiment, the quenching of fluorescent properties for fluorescent nanoparticles 3 encapsulated in the inorganic material 2 is prevented when it is due to electron transport. In this embodiment, the obtained particle 1 may be used as an electrical insulator material exhibiting the same properties as the nanoparticles 3 encapsulated in the inorganic material 2.

According to one embodiment, the obtained particle 1 is an electrical conductor. This embodiment is particularly advantageous for an application of the obtained particle 1 in photovoltaics or LEDs.

According to one embodiment, the obtained particle 1 has an electrical conductivity at standard conditions ranging from $1\times10^{-20}$ to $10^{7}$ S/m, preferably from $1\times10^{-15}$ to 5 S/m, more preferably from $1\times10^{-7}$ to 1 S/m.

According to one embodiment, the obtained particle 1 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^{2}$ S/m, $5\times10^{2}$ S/m, $10^{3}$ S/m, $5\times10^{3}$ S/m, $10^{4}$ S/m, $5\times10^{4}$ S/m, $10^{5}$ S/m, $5\times10^{5}$ S/m, $10^{6}$ S/m, $5\times10^{6}$ S/m, or $10^{7}$ S/m.

According to one embodiment, the electrical conductivity of the obtained particle 1 may be measured for example with an impedance spectrometer.

According to one embodiment, the obtained particle 1 is a thermal insulator.

According to one embodiment, the obtained particle 1 is a thermal conductor. In this embodiment, the obtained particle 1 is capable of draining away the heat originating from the nanoparticles 3 encapsulated in the inorganic material 2, or from the environment.

According to one embodiment, the obtained particle 1 has a thermal conductivity at standard conditions ranging from 0.1 to 450 W/(m·K), preferably from 1 to 200 W/(m·K), more preferably from 10 to 150 W/(m·K).

According to one embodiment, the obtained particle 1 has a thermal conductivity at standard conditions of at least 0.1

W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the obtained particle 1 may be measured for example by steady-state methods or transient methods.

According to one embodiment, the obtained particle 1 is a local high temperature heating system.

According to one embodiment, the obtained particle 1 is hydrophobic.

According to one embodiment, the obtained particle 1 is hydrophilic.

According to one embodiment, the obtained particle 1 is dispersible in aqueous solvents, organic solvents and/or mixture thereof.

According to one embodiment, the obtained particle 1 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the obtained particle 1 exhibits emission spectra with at least one emission peak having a full width half maximum strictly lower than 90 nm, 80 nm, 70 nm, 60 nm, 50 nm, 40 nm, 30 nm, 25 nm, 20 nm, 15 nm, or 10 nm.

According to one embodiment, the obtained particle 1 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the obtained particle 1 exhibits emission spectra with at least one emission peak having a full width at quarter maximum strictly lower than 90 nm, 80 nm, 70 nm, 60 nm, 50 nm, 40 nm, 30 nm, 25 nm, 20 nm, 15 nm, or 10 nm.

According to one embodiment, the obtained particle 1 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99%, or 100%.

In one embodiment, the obtained particle 1 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW \cdot cm^{-2}$ and 100 $kW \cdot cm^{2}$, more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5

W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light illumination described herein provides continuous lighting.

According to one embodiment, the light illumination described herein provides pulsed light. This embodiment is particularly advantageous as it allows the evacuation of heat and/or electrical charges from nanoparticles 3. This embodiment is also particularly advantageous as using pulsed light allow a longer lifespan of the nanoparticles 3, thus of the composite particles 1, indeed under continuous light, nanoparticles 3 degrade faster than under pulsed light.

According to one embodiment, the light illumination described herein provides pulsed light. In this embodiment, if a continuous light illuminates a material with regular periods during which said material is voluntary removed from the illumination, said light may be considered as pulsed light. This embodiment is particularly advantageous as it allows the evacuation of heat and/or electrical charges from nanoparticles 3.

According to one embodiment, said pulsed light has a time off (or time without illumination) of at least 1 μsecond, 2 μseconds, 3 μseconds, 4 μseconds, 5 μseconds, 6 μseconds, 7 μseconds, 8 μseconds, 9 μseconds, 10 μseconds, 11 μseconds, 12 μseconds, 13 μseconds, 14 μseconds, 15 μseconds, 16 μseconds, 17 μseconds, 18 μseconds, 19 μseconds, 20 μseconds, 21 μseconds, 22 μseconds, 23 μseconds, 24 μseconds, 25 μseconds, 26 μseconds, 27 μseconds, 28 μseconds, 29 μseconds, 30 μseconds, 31 μseconds, 32 μseconds, 33 μseconds, 34 μseconds, 35 μseconds, 36 μseconds, 37 μseconds, 38 μseconds, 39 μseconds, 40 μseconds, 41 μseconds, 42 μseconds, 43 μseconds, 44 μseconds, 45 μseconds, 46 μseconds, 47 μseconds, 48 μseconds, 49 μseconds, 50 μseconds, 100 μseconds, 150 μseconds, 200 μseconds, 250 μseconds, 300 μseconds, 350 μseconds, 400 μseconds, 450 μseconds, 500 μseconds, 550 μseconds, 600 μseconds, 650 μseconds, 700 μseconds, 750 μseconds, 800 μseconds, 850 μseconds, 900 μseconds, 950 μseconds, 1 msecond, 2 mseconds, 3 mseconds, 4 mseconds, 5 mseconds, 6 mseconds, 7 mseconds, 8 mseconds, 9 mseconds, 10 mseconds, 11 mseconds, 12 mseconds, 13 mseconds, 14 mseconds, 15 mseconds, 16 mseconds, 17 mseconds, 18 mseconds, 19 mseconds, 20 mseconds, 21 mseconds, 22 mseconds, 23 mseconds, 24 mseconds, 25 mseconds, 26 mseconds, 27 mseconds, 28 mseconds, 29 mseconds, 30 mseconds, 31 mseconds, 32 mseconds, 33 mseconds, 34 mseconds, 35 mseconds, 36 mseconds, 37 mseconds, 38 mseconds, 39 mseconds, 40 mseconds, 41 mseconds, 42 mseconds, 43 mseconds, 44 mseconds, 45 mseconds, 46 mseconds, 47 mseconds, 48 mseconds, 49 mseconds, or 50 mseconds.

According to one embodiment, said pulsed light has a time on (or illumination time) of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, 1 μsecond, 2 μseconds, 3 μseconds, 4 μseconds, 5 μseconds, 6 μseconds, 7 μseconds, 8 μseconds, 9 μseconds, 10 μseconds, 11 μseconds, 12 μseconds, 13 μseconds, 14 μseconds, 15 μseconds, 16 μseconds, 17 μseconds, 18 μseconds, 19 μseconds, 20 μseconds, 21 μseconds, 22 μseconds, 23 μseconds, 24 μseconds, 25 μseconds, 26 μseconds, 27 μseconds, 28 μseconds, 29 μseconds, 30 μseconds, 31 μseconds, 32 μseconds, 33 μseconds, 34 μseconds, 35 μseconds, 36 μseconds, 37 μseconds, 38 μseconds, 39 μseconds, 40 μseconds, 41 μseconds, 42 μseconds, 43 μseconds, 44 μseconds, 45 μseconds, 46 μseconds, 47 μseconds, 48 μseconds, 49 μseconds, or 50 μseconds.

According to one embodiment, said pulsed light has a frequency of at least 10 Hz, 11 Hz, 12 Hz, 13 Hz, 14 Hz, 15 Hz, 16 Hz, 17 Hz, 18 Hz, 19 Hz, 20 Hz, 21 Hz, 22 Hz, 23 Hz, 24 Hz, 25 Hz, 26 Hz, 27 Hz, 28 Hz, 29 Hz, 30 Hz, 31 Hz, 32 Hz, 33 Hz, 34 Hz, 35 Hz, 36 Hz, 37 Hz, 38 Hz, 39 Hz, 40 Hz, 41 Hz, 42 Hz, 43 Hz, 44 Hz, 45 Hz, 46 Hz, 47 Hz, 48 Hz, 49 Hz, 50 Hz, 100 Hz, 150 Hz, 200 Hz, 250 Hz, 300 Hz, 350 Hz, 400 Hz, 450 Hz, 500 Hz, 550 Hz, 600 Hz, 650 Hz, 700 Hz, 750 Hz, 800 Hz, 850 Hz, 900 Hz, 950 Hz, 1 kHz, 2 kHz, 3 kHz, 4 kHz, 5 kHz, 6 kHz, 7 kHz, 8 kHz, 9 kHz, 10 kHz, 11 kHz, 12 kHz, 13 kHz, 14 kHz, 15 kHz, 16 kHz, 17 kHz, 18 kHz, 19 kHz, 20 kHz, 21 kHz, 22 kHz, 23 kHz, 24 kHz, 25 kHz, 26 kHz, 27 kHz, 28 kHz, 29 kHz, 30 kHz, 31 kHz, 32 kHz, 33 kHz, 34 kHz, 35 kHz, 36 kHz, 37 kHz, 38 kHz, 39 kHz, 40 kHz, 41 kHz, 42 kHz, 43 kHz, 44 kHz, 45 kHz, 46 kHz, 47 kHz, 48 kHz, 49 kHz, 50 kHz, 100 kHz, 150 kHz, 200 kHz, 250 kHz, 300 kHz, 350 kHz, 400 kHz, 450 kHz, 500 kHz, 550 kHz, 600 kHz, 650 kHz, 700 kHz, 750 kHz, 800 kHz, 850 kHz, 900 kHz, 950 kHz, 1 MHz, 2 MHz, 3 MHz, 4 MHz, 5 MHz, 6 MHz, 7 MHz, 8 MHz, 9 MHz, 10 MHz, 11 MHz, 12 MHz, 13 MHz, 14 MHz, 15 MHz, 16 MHz, 17 MHz, 18 MHz, 19 MHz, 20 MHz, 21 MHz, 22 MHz, 23 MHz, 24 MHz, 25 MHz, 26 MHz, 27 MHz, 28 MHz, 29 MHz, 30 MHz, 31 MHz, 32 MHz, 33 MHz, 34 MHz, 35 MHz, 36 MHz, 37 MHz, 38 MHz, 39 MHz, 40 MHz, 41 MHz, 42 MHz, 43 MHz, 44 MHz, 45 MHz, 46 MHz, 47 MHz, 48 MHz, 49 MHz, 50 MHz, or 100 MHz.

According to one embodiment, the spot area of the light which illuminates the obtained particle 1, the obtainable particle, and/or the nanoparticles 3 is at least 10 μm$^2$, 20 μm$^2$, 30 μm$^2$, 40 μm$^2$, 50 μm$^2$, 60 μm$^2$, 70 μm$^2$, 80 μm$^2$, 90 μm$^2$, 100 μm$^2$, 200 μm$^2$, 300 μm$^2$, 400 μm$^2$, 500 μm$^2$, 600 μm$^2$, 700 μm$^2$, 800 μm$^2$, 900 μm$^2$, $10^3$ μm$^2$, $10^4$ μm$^2$, $10^5$ μm$^2$, 1 mm$^2$, 10 mm$^2$, 20 mm$^2$, 30 mm$^2$, 40 mm$^2$, 50 mm$^2$, 60 mm$^2$, 70 mm$^2$, 80 mm$^2$, 90 mm$^2$, 100 mm$^2$, 200 mm$^2$, 300 mm$^2$, 400 mm$^2$, 500 mm$^2$, 600 mm$^2$, 700 mm$^2$, 800 mm$^2$, 900 mm$^2$, $10^3$ mm$^2$, $10^4$ mm$^2$, $10^5$ mm$^2$, 1 m$^2$, 10 m$^2$, 20 m$^2$, 30 m$^2$, 40 m$^2$, 50 m$^2$, 60 m$^2$, 70 m$^2$, 80 m$^2$, 90 m$^2$, or 100 m$^2$.

According to one embodiment, the emission saturation of the obtained particle 1, the obtainable particle, and/or the nanoparticles 3 is reached under a pulsed light with a peak pulse power of at least 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, 100 kW·cm$^{-2}$, 200 kW·cm$^{-2}$, 300 kW·cm$^{-2}$, 400 kW·cm$^{-2}$, 500 kW·cm$^{-2}$, 600 kW·cm$^{-2}$, 700 kW·cm$^{-2}$, 800 kW·cm$^{-2}$, 900 kW·cm$^{-2}$, or 1 MW·cm$^{-2}$.

According to one embodiment, the emission saturation of the obtained particle 1, the obtainable particle, and/or the nanoparticles 3 is reached under a continuous illumination with a peak pulse power of at least 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, or 1 kW·cm$^{-2}$.

Emission saturation of particles under illumination with a given photon flux occurs when said particles cannot emit more photons. In other words, a higher photon flux doesn't lead to a higher number of photons emitted by said particles.

According to one embodiment, the FCE (Frequency Conversion Efficiency) of illuminated obtained particle 1, obtainable particle, and/or nanoparticles 3 is of at least 1%, 2%, 3%, 4%, 5%, 6%, 7%, 8%, 9%, 10%, 15%, 16%, 17%, 18%, 18%, 19%, 20%, 21%, 22%, 23%, 24%, 25%, 30%, 35%, 40%, 45%, 50%, 55%, 60%, 65%, 70%, 75%, 80%, 85%, 90%, 95%, or 100%. In this embodiment, the FCE was measured at 480 nm.

In one embodiment, the obtained particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the obtained particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the obtained particle 1 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the obtained particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$. In this embodiment, the obtained particle 1 preferably comprises quantum dots, semiconductor nanoparticles, semiconductor nanocrystals, or semiconductor nanoplatelets.

In one preferred embodiment, the obtained particle 1 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the obtained particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$. In this embodiment, the obtained particle 1 preferably comprises quantum dots, semiconductor nanoparticles, semiconductor nanocrystals, or semiconductor nanoplatelets.

In one preferred embodiment, the obtained particle 1 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the obtained particle 1 is surfactant-free. In this embodiment, the surface of the obtained particle 1 will be easy to functionalize as said surface will not be blocked by any surfactant molecule.

According to one embodiment, the obtained particle 1 is not surfactant-free.

According to one embodiment, the obtained particle 1 is amorphous.

According to one embodiment, the obtained particle 1 is crystalline.

According to one embodiment, the obtained particle 1 is totally crystalline.

According to one embodiment, the obtained particle 1 is partially crystalline.

According to one embodiment, the obtained particle 1 is monocrystalline.

According to one embodiment, the obtained particle 1 is polycrystalline. In this embodiment, the obtained particle 1 comprises at least one grain boundary.

According to one embodiment, the obtained particle 1 is a colloidal particle.

According to one embodiment, the obtained particle 1 does not comprise a spherical porous bead, preferably the obtained particle 1 does not comprise a central spherical porous bead.

According to one embodiment, the obtained particle 1 does not comprise a spherical porous bead, wherein nanoparticles 3 are linked to the surface of said spherical porous bead.

According to one embodiment, the obtained particle 1 does not comprise a bead and nanoparticles 3 having opposite electronic charges.

According to one embodiment, the obtained particle 1 is porous.

According to one embodiment, the obtained particle 1 is considered porous when the quantity adsorbed by the obtained particles 1 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the obtained particle 1 can be hexagonal, vermicular or cubic.

According to one embodiment, the organized porosity of the obtained particle 1 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the obtained particle 1 is not porous.

According to one embodiment, the obtained particle 1 is considered non-porous when the quantity adsorbed by the said obtained particle 1 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the obtained particle 1 does not comprise pores or cavities.

According to one embodiment, the obtained particle 1 is permeable.

According to one embodiment, the permeable obtained particle 1 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the obtained particle 1 is impermeable to outer molecular species, gas or liquid. In this embodiment, outer molecular species, gas or liquid refers to molecular species, gas or liquid external to said obtained particle 1.

According to one embodiment, the impermeable obtained particle 1 has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the obtained particle 1 has an oxygen transmission rate ranging from $10^{-7}$ to 10 $cm^3 \cdot m^{-2} \cdot day^{-1}$, preferably from $10^{-7}$ to 1 $cm^3 \cdot m^{-2} \cdot day^{-1}$, more preferably from $10^{-7}$ to $10^{-1}$ $cm^3 \cdot m^{-2} \cdot day^{-1}$, even more preferably from $10^{-7}$ to $10^{-4}$ $cm^3 \cdot m^{-2} \cdot day^{-1}$ at room temperature.

According to one embodiment, the obtained particle 1 has a water vapor transmission rate ranging from $10^{-7}$ to 10 $g \cdot m^{-2} \cdot day^{-1}$, preferably from $10^{-7}$ to 1 $g \cdot m^{-2} \cdot day^{-1}$, more preferably from $10^{-7}$ to $10^{-1}$ $g \cdot m^{-2} \cdot day^{-1}$, even more preferably from $10^{-7}$ to $10^{-4}$ $g \cdot m^{-2} \cdot day^{-1}$ at room temperature. A water vapor transmission rate of $10^{-6}$ $g \cdot m^{-2} \cdot day^{-1}$ is particularly adequate for a use on LED.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtained particle 1 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the specific property of the obtained particle 1 comprises one or more of the following: fluorescence, phosphorescence, chemiluminescence, capacity of increasing local electromagnetic field, absorbance, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtained particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtained particle 1 is optically transparent, i.e. the obtained particle 1 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, each nanoparticle 3 is totally surrounded by or encapsulated in the inorganic material 2.

According to one embodiment, each nanoparticle 3 is partially surrounded by or encapsulated in the inorganic material 2.

According to one embodiment, the obtained particle 1 comprises at least 95%, 90%, 85%, 80%, 75%, 70%, 65%, 60%, 55%, 50%, 45%, 40%, 35%, 30%, 25%, 20%, 15%, 10%, 5%, 1%, or 0% of nanoparticles 3 on its surface.

According to one embodiment, the obtained particle 1 does not comprise nanoparticles 3 on its surface. In this embodiment, said nanoparticles 3 are completely surrounded by the inorganic material 2.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of nanoparticles 3 are comprised in the inorganic material 2. In this embodiment, each of said nanoparticles 3 is completely surrounded by the inorganic material 2.

According to one embodiment, the obtained particle 1 comprises at least one nanoparticle 3 located on the surface of said obtained particle 1. This embodiment is advantageous as the at least one nanoparticle 3 will be better excited by the incident light than if said nanoparticle 3 was dispersed in the inorganic material 2.

According to one embodiment, the obtained particle 1 comprises nanoparticles 3 dispersed in the inorganic material 2, i.e. totally surrounded by said inorganic material 2; and at least one nanoparticle 3 located on the surface of said luminescent particle 1.

According to one embodiment, the obtained particle 1 comprises nanoparticles 3 dispersed in the inorganic material 2, wherein said nanoparticles 3 emit at a wavelength in the range from 500 to 560 nm; and at least one nanoparticle 3 located on the surface of said obtained particle 1, wherein said at least one nanoparticle 3 emits at a wavelength in the range from 600 to 2500 nm.

According to one embodiment, the obtained particle 1 comprises nanoparticles 3 dispersed in the inorganic material 2, wherein said nanoparticles 3 emit at a wavelength in the range from 600 to 2500 nm; and at least one nanoparticle 3 located on the surface of said obtained particle 1, wherein said at least one nanoparticle 3 emits at a wavelength in the range from 500 to 560 nm.

According to one embodiment, the at least one nanoparticle 3 located on the surface of said obtained particle 1 may be chemically or physically adsorbed on said surface.

According to one embodiment, the at least one nanoparticle 3 located on the surface of said obtained particle 1 may be adsorbed on said surface.

According to one embodiment, the at least one nanoparticle 3 located on the surface of said obtained particle 1 may be adsorbed with a cement on said surface.

According to one embodiment, examples of cement include but are not limited to: polymers, silicone, oxides, or a mixture thereof.

According to one embodiment, the at least one nanoparticle 3 located on the surface of said obtained particle 1 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the inorganic material 2.

According to one embodiment, a plurality of nanoparticles 3 is uniformly spaced on the surface of the obtained particle 1.

According to one embodiment, each nanoparticle 3 of the plurality of nanoparticles 3 is spaced from its adjacent nanoparticle 3 by an average minimal distance, said average minimal distance is as described hereabove.

According to one embodiment, the obtained particle 1 is a homostructure.

According to one embodiment, the obtained particle 1 is not a core/shell structure wherein the core does not comprise nanoparticles 3 and the shell comprises nanoparticles 3.

According to one embodiment, the obtained particle 1 is a heterostructure, comprising a core 11 and at least one shell 12.

According to one embodiment, the shell 12 of the core/shell obtained particle 1 comprises comprises or consists of an inorganic material 21. In this embodiment, said inorganic material 21 is the same or different than the inorganic material 2 comprised in the core 11 of the core/shell obtained particle 1.

According to one embodiment, the core 11 of the core/shell obtained particle 1 comprises nanoparticles 3 as described herein and the shell 12 of the core/shell obtained particle 1 does not comprise nanoparticles 3.

According to one embodiment, the core 11 of the core/shell obtained particle 1 comprises nanoparticles 3 as described herein and the shell 12 of the core/shell obtained particle 1 comprises nanoparticles 3.

According to one embodiment, the nanoparticles 3 comprised in the core 11 of the core/shell obtained particle 1 are identical to the nanoparticles 3 comprised in the shell 12 of the core/shell obtained particle 1.

Figure 12:
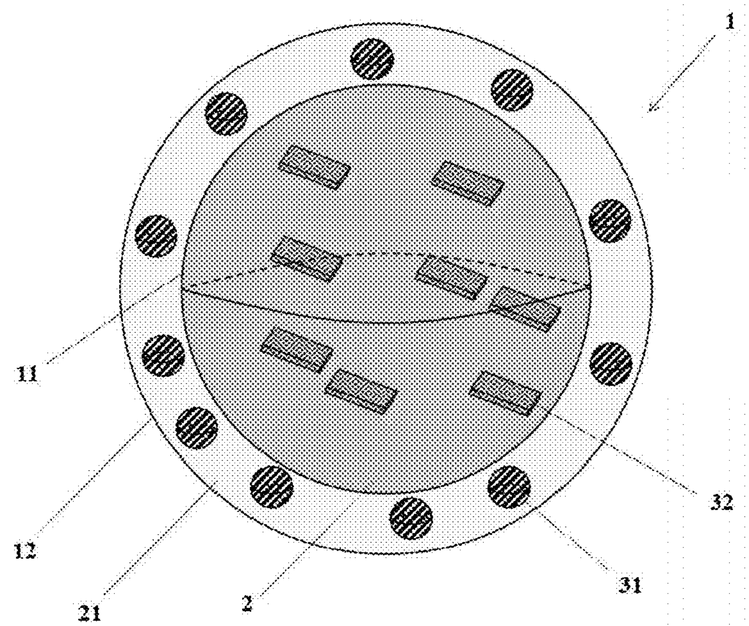
FIG. 12 illustrates a particle 1 comprising a core 11 comprising a plurality of nanoparticles 32 encapsulated in an inorganic material 2, and a shell 12 comprising a plurality of nanoparticles 31 encapsulated in an inorganic material 21.

According to one embodiment illustrated in FIG. 12, the nanoparticles 3 comprised in the core 11 of the core/shell obtained particle 1 are different to the nanoparticles 3 comprised in the shell 12 of the core/shell obtained particle 1. In this embodiment, the resulting core/shell obtained particle 1 will exhibit different properties.

According to one embodiment, the core 11 of the core/shell obtained particle 1 comprises at least one luminescent nanoparticle and the shell 12 of the core/shell obtained particle 1 comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 11 of the core/shell obtained particle 1 and the shell 12 of the core/shell obtained particle 1 comprise at least two different luminescent nanoparticles, wherein said luminescent nanoparticles have different emission wavelengths. This means that the core 11 comprises at least one luminescent nanoparticle and the shell 12 comprises at least one luminescent nanoparticle, said luminescent nanoparticles having different emission wavelengths.

In a preferred embodiment, the core 11 of the core/shell obtained particle 1 and the shell 12 of the core/shell obtained particle 1 comprise at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the core 11 of the core/shell obtained particle 1 and the shell 12 of the core/shell obtained particle 1 comprise at least one luminescent nanoparticle emitting in the green region of the visible spectrum and at least one luminescent nanoparticle emitting in the red region of the visible spectrum, thus the obtained particle 1 paired with a blue LED will be a white light emitter.

In a preferred embodiment, the core 11 of the core/shell obtained particle 1 and the shell 12 of the core/shell obtained particle 1 comprise at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the core 11 of the core/shell obtained particle 1 and the shell 12 of the core/shell obtained particle 1 comprise at least one luminescent nanoparticle emitting in the blue region of the visible spectrum and at least one luminescent nanoparticle emitting in the red region of the visible spectrum, thus the obtained particle 1 will be a white light emitter.

In a preferred embodiment, the core 11 of the core/shell obtained particle 1 and the shell 12 of the core/shell obtained particle 1 comprise comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the core 11 of the core/shell obtained particle 1 and the shell 12 of the core/shell obtained particle 1 comprise comprises at least one luminescent nanoparticle emitting in the blue region of the visible spectrum and at least one luminescent nanoparticle emitting in the green region of the visible spectrum.

According to one embodiment, the core 11 of the core/shell obtained particle 1 comprises at least one magnetic nanoparticle and the shell 12 of the core/shell obtained particle 1 comprises at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtained particle 1 comprises at least one plasmonic nanoparticle and the shell 12 of the core/shell obtained particle 1 comprises at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 11 of the core/shell obtained particle 1 comprises at least one plasmonic nanoparticle and the shell 12 of the core/shell obtained particle 1 comprises at least one luminescent nanoparticle emitting in the visible spectrum of light. According to one embodiment, the core 11 of the core/shell obtained particle 1 comprises at least one dielectric nanoparticle and the shell 12 of the core/shell obtained particle 1 comprises at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtained particle 1 comprises at least one piezoelectric nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtained particle 1 comprises at least one pyro-electric nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtained particle 1 comprises at least one ferro-electric nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the core 11 of the core/shell obtained particle 1 comprises at least one light scattering nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the core 11 of the core/shell obtained particle 1 comprises at least one electrically insulating nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the core 11 of the core/shell obtained particle 1 comprises at least one thermally insulating nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the core 11 of the core/shell obtained particle 1 comprises at least one catalytic nanoparticle and the shell 12 of the core/shell obtained particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the shell 12 of the obtained particle 1 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the shell 12 of the obtained particle 1 has a thickness homogeneous all along the core 11, i.e. the shell 12 of the obtained particle 1 has a same thickness all along the core 11.

According to one embodiment, the shell 12 of the obtained particle 1 has a thickness heterogeneous along the core 11, i.e. said thickness varies along the core 11.

According to one embodiment, the obtained particle 1 is not a core/shell particle wherein the core is an aggregate of metallic particles and the shell comprises the inorganic material 2. According to one embodiment, the obtained particle 1 is a core/shell particle wherein the core is filled with solvent and the shell comprises nanoparticles 3 dispersed in an inorganic material 2, i.e. said obtained particle 1 is a hollow bead with a solvent filled core.

According to one embodiment, the nanoparticles 3 are as described hereabove.

According to one embodiment, the inorganic material 2 is as described hereabove.

Figure 4:
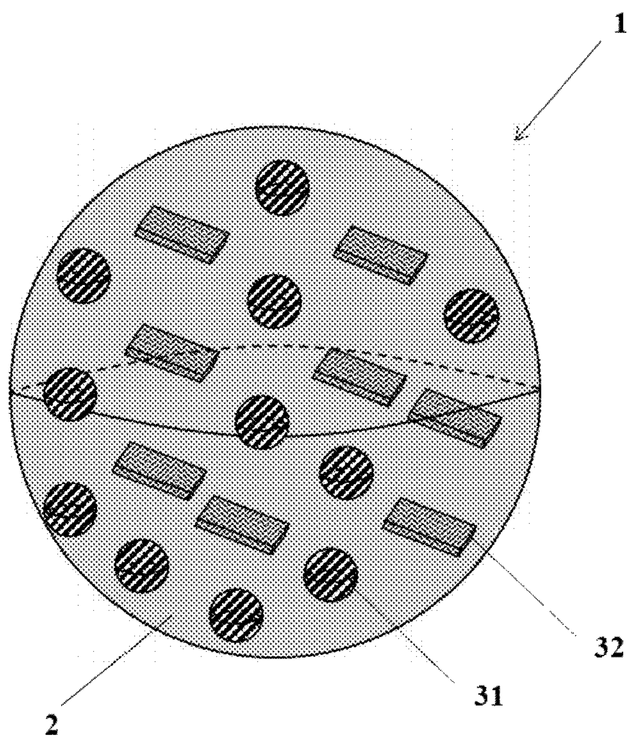
FIG. 4 illustrates a particle 1 comprising a plurality of spherical nanoparticles 31 and a plurality of 2D nanoparticles 32 encapsulated in an inorganic material 2.

According to one embodiment, as illustrated in FIG. 4, the obtained particle 1 comprises a combination of at least two different nanoparticles (31, 32). In this embodiment, the resulting obtained particle 1 will exhibit different properties.

According to one embodiment, the obtained particle 1 comprises at least one luminescent nanoparticle and at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the obtained particle 1 comprises at least two different luminescent nanoparticles, wherein said luminescent nanoparticles have different emission wavelengths.

In a preferred embodiment, the obtained particle 1 comprises at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the obtained particle 1 comprises at least one luminescent nanoparticle emitting in the green region of the visible spectrum and at least one luminescent nanoparticle emitting in the red region of the visible spectrum, thus the obtained particle 1 paired with a blue LED will be a white light emitter.

In a preferred embodiment, the obtained particle 1 comprises at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the obtained particle 1 comprises at least one luminescent nanoparticle emitting in the blue region of the visible spectrum and at least one luminescent nanoparticle emitting in the red region of the visible spectrum, thus the obtained particle 1 will be a white light emitter.

In a preferred embodiment, the obtained particle 1 comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the obtained particle 1 comprises at least one luminescent nanoparticle emitting in the blue region of the visible spectrum and at least one luminescent nanoparticle emitting in the green region of the visible spectrum.

In a preferred embodiment, the obtained particle 1 comprises three different luminescent nanoparticles, wherein said luminescent nanoparticles emit different emission wavelengths or color.

In a preferred embodiment, the obtained particle 1 comprises at least three different luminescent nanoparticles, wherein at least one luminescent nanoparticle emits at a wavelength in the range from 400 to 490 nm, at least one luminescent nanoparticle emits at a wavelength in the range from 500 to 560 nm and at least one luminescent nanoparticle emits at a wavelength in the range from 600 to 2500 nm. In this embodiment, the obtained particle 1 comprises at least one luminescent nanoparticle emitting in the blue region of the visible spectrum, at least one luminescent nanoparticle emitting in the green region of the visible spectrum and at least one luminescent nanoparticle emitting in the red region of the visible spectrum.

According to one embodiment, the obtained particle 1 comprises at least one magnetic nanoparticle and at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtained particle 1 comprises at least one plasmonic nanoparticle and at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtained particle 1 comprises at least one dielectric nanoparticle and at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtained particle 1 comprises at least one piezoelectric nanoparticle and at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtained particle 1 comprises at least one pyro-electric nanoparticle and at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the obtained particle 1 comprises at least one ferro-electric nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the obtained particle 1 comprises at least one light scattering nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the obtained particle 1 comprises at least one electrically insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the obtained particle 1 comprises at least one thermally insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the obtained particle 1 comprises at least one catalytic nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the obtained particle 1 comprises at least one nanoparticle 3 without a shell and at least one nanoparticle 3 selected in the group of core 33/shell 34 nanoparticles 3 and core 33/insulator shell 36 nanoparticles 3.

According to one embodiment, the obtained particle 1 comprises at least one core 33/shell 34 nanoparticle 3 and at least one nanoparticle 3 selected in the group of nanoparticles 3 without a shell and core 33/insulator shell 36 nanoparticles 3.

According to one embodiment, the obtained particle 1 comprises at least one core 33/insulator shell 36 nanoparticle 3 and at least one nanoparticle 3 selected in the group of nanoparticles 3 without a shell and core 33/shell 34 nanoparticles 3.

According to one embodiment, the obtained particle 1 comprises at least two nanoparticles 3.

According to one embodiment, the obtained particle 1 comprises more than ten nanoparticles 3.

According to one embodiment, the obtained particle 1 comprises at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 nanoparticles 3.

According to one embodiment, the nanoparticles 3 comprised in an obtained particle 1 are not aggregated.

According to one embodiment, the nanoparticles 3 comprised in an obtained particle 1 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the nanoparticles 3 comprised in an obtained particle 1 do not touch, are not in contact.

According to one embodiment, the nanoparticles 3 comprised in an obtained particle 1 are separated by inorganic material 2.

According to one embodiment, the nanoparticles 3 comprised in an obtained particle 1 can be individually evidenced.

According to one embodiment, the nanoparticles 3 comprised in an obtained particle 1 can be individually evidenced by transmission electron microscopy or fluorescence scanning microscopy, or any other characterization means known by the person skilled in the art.

According to one embodiment, the nanoparticles 3 comprised in an obtained particle 1 are uniformly dispersed in the inorganic material 2 comprised in said obtained particle 1.

According to one embodiment, the nanoparticles 3 comprised in an obtained particle 1 are uniformly dispersed within the inorganic material 2 comprised in said obtained particle 1.

According to one embodiment, the nanoparticles 3 comprised in an obtained particle 1 are dispersed within the inorganic material 2 comprised in said obtained particle 1.

According to one embodiment, the nanoparticles 3 comprised in an obtained particle 1 are uniformly and evenly dispersed within the inorganic material 2 comprised in said obtained particle 1.

According to one embodiment, the nanoparticles 3 comprised in an obtained particle 1 are evenly dispersed within the inorganic material 2 comprised in said obtained particle 1.

According to one embodiment, the nanoparticles 3 comprised in an obtained particle 1 are homogeneously dispersed within the inorganic material 2 comprised in said obtained particle 1.

According to one embodiment, the dispersion of nanoparticles 3 in the inorganic material 2 does not have the shape of a ring, or a monolayer.

According to one embodiment, each nanoparticle 3 of the plurality of nanoparticles is spaced from its adjacent nanoparticle 3 by an average minimal distance.

According to one embodiment, the average minimal distance between two nanoparticles 3 is controlled.

According to one embodiment, the average minimal distance is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 in the same particle 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17

μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 in the same particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10%

According to one embodiment, the specific property of the nanoparticles 3 comprises one or more of the following: fluorescence, phosphorescence, chemiluminescence, capacity of increasing local electromagnetic field, absorbance, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, μ1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, at least 0%, 5%, 10%, 15%, 20%, 25%, 30%, 35%, 40%, 45%, 50%, 55%, 60%, 65%, 70%, 75%, 80%, 85%, 90%, or 95% of the obtained particles 1 are empty, i.e. they do not comprise any nanoparticles 3.

According to one embodiment, the obtained particle 1 further comprises at least one dense particle dispersed in the inorganic material 2. In this embodiment, said at least one dense particle comprises a dense material with a density superior to the density of the inorganic material 2.

According to one embodiment, the dense material has a bandgap superior or equal to 3 eV.

According to one embodiment, examples of dense material include but are not limited to: oxides such as for example tin oxide, silicon oxide, germanium oxide, aluminium oxide, gallium oxide, hafnium oxide, titanium oxide, tantalum oxide, ytterbium oxide, zirconium oxide, yttrium oxide, thorium oxide, zinc oxide, lanthanide oxides, actinide oxides, alkaline earth metal oxides, mixed oxides, mixed oxides thereof; metal sulfides; carbides; nitrides; or a mixture thereof.

According to one embodiment, the at least one dense particle has a maximal packing fraction of 70%, 60%, 50%, 40%, 30%, 20%, 10% or 1%.

According to one embodiment, the at least one dense particle has a density of at least 3, 4, 5, 6, 7, 8, 9 or 10.

According to a preferred embodiment, examples of obtained particle 1 include but are not limited to: semiconductor nanoparticles encapsulated in an inorganic material, semiconductor nanocrystals encapsulated in an inorganic material, semiconductor nanoplatelets encapsulated in an inorganic material, perovskite nanoparticles encapsulated in an inorganic material, phosphor nanoparticles encapsulated in an inorganic material, semiconductor nanoplatelets coated with grease and then in an inorganic material such as for example $Al_2O_3$, or a mixture thereof. In this embodiment, grease can refer to lipids as, for example, long apolar carbon chain molecules; phospholipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of obtained particle 1 include but are not limited to: CdSe/CdZnS@$SiO_2$, CdSe/CdZnS@$Si_xCd_yZn_zO_w$, CdSe/CdZnS@$Al_2O_3$, InP/ZnS@$Al_2O_3$, $CH_5N_2$—$PbBr_3$@$Al_2O_3$, CdSe/CdZnS—Au@$SiO_2$, $Fe_3O_4$@$Al_2O_3$—CdSe/CdZnS@$SiO_2$, CdS/ZnS@$Al_2O_3$, CdSeS/CdZnS@$Al_2O_3$, CdSe/CdS/ZnS@$Al_2O_3$, InP/ZnSe/ZnS@$Al_2O_3$, $CuInS_2$/ZnS@$Al_2O_3$, $CuInSe_2$/ZnS@$Al_2O_3$, CdSe/CdS/ZnS@$SiO_2$, CdSeS/ZnS@$Al_2O_3$, CdSeS/CdZnS@$SiO_2$, InP/ZnS@$SiO_2$, CdSeS/CdZnS@$SiO_2$, InP/ZnSe/ZnS@$SiO_2$, $Fe_3O_4$@$Al_2O_3$, CdSe/CdZnS@ZnO, CdSe/CdZnS@ZnO, CdSe/CdZnS@$Al_2O_3$@MgO, CdSe/CdZnS—$Fe_3O_4$@$SiO_2$, phosphor nanoparticles@$Al_2O_3$, phosphor nanoparticles@ZnO, phosphor nanoparticles@$SiO_2$, phosphor nanoparticles@$HfO_2$, CdSe/CdZnS@$HfO_2$, CdSeS/CdZnS@$HfO_2$, InP/ZnS@$HfO_2$, CdSeS/CdZnS@$HfO_2$, InP/ZnSe/ZnS@$HfO_2$, CdSe/CdZnS—$Fe_3O_4$@$HfO_2$, CdSe/CdS/ZnS@$SiO_2$, or a mixture thereof; wherein phosphor nanoparticles include but are not limited to: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

According to one embodiment, the obtained particle 1 does not comprise quantum dots encapsulated in $TiO_2$, semiconductor nanocrystals encapsulated in $TiO_2$, or semiconductor nanoplatelet encapsulated in $TiO_2$.

According to one embodiment, the obtained particle 1 does not comprise a spacer layer between the nanoparticles 3 and the inorganic material 2.

According to one embodiment, the obtained particle 1 does not comprise one core/shell nanoparticle wherein the core is luminescent and emits red light, and the shell is a spacer layer between the nanoparticles 3 and the inorganic material 2.

According to one embodiment, the obtained particle 1 does not comprise a core/shell nanoparticle and a plurality of nanoparticles 3, wherein the core is luminescent and emits red light, and the shell is a spacer layer between the nanoparticles 3 and the inorganic material 2.

According to one embodiment, the obtained particle 1 does not comprise at least one luminescent core, a spacer layer, an encapsulation layer and a plurality of quantum dots, wherein the luminescent core emits red light, and the spacer layer is situated between said luminescent core and the inorganic material 2.

According to one embodiment, the obtained particle 1 does not comprise a luminescent core surrounded by a spacer layer and emitting red light.

According to one embodiment, the obtained particle 1 does not comprise nanoparticles covering or surrounding a luminescent core.

According to one embodiment, the obtained particle 1 does not comprise nanoparticles covering or surrounding a luminescent core emitting red light.

According to one embodiment, the obtained particle 1 does not comprise a luminescent core made by a specific material selected from the group consisting of silicate phosphor, aluminate phosphor, phosphate phosphor, sulfide phosphor, nitride phosphor, nitrogen oxide phosphor, and combination of aforesaid two or more materials; wherein said luminescent core is covered by a spacer layer.

According to one embodiment, the obtained particle 1 is functionalized as described hereabove.

Another object of the invention relates to a particle obtainable by the method of the invention, wherein said obtainable particle comprises a plurality of nanoparticles 3 encapsulated in an inorganic material 2, wherein the plurality of nanoparticles 3 is uniformly dispersed in said inorganic material 2.

The uniform dispersion of the plurality of nanoparticles 3 in the inorganic material 2 prevents the aggregation of said nanoparticles 3, thereby preventing the degradation of their properties. For example, in the case of inorganic fluorescent nanoparticles, a uniform dispersion will allow the optical properties of said nanoparticles to be preserved, and quenching can be avoided.

Obtainable particle of the invention are also particularly interesting as they can easily comply with ROHS requirements depending on the inorganic material 2 selected. It is then possible to have ROHS compliant particles while preserving the properties of nanoparticles 3 that may not be ROHS compliant themselves.

According to one embodiment, the obtainable particle is air processable. This embodiment is particularly advantageous for the manipulation or the transport of said obtainable particle and for the use of said obtainable particle in a device such as an optoelectronic device.

According to one embodiment, the obtainable particle is compatible with standard lithography processes. This embodiment is particularly advantageous for the use of said obtainable particle in a device such as an optoelectronic device.

According to one embodiment, the obtainable particle is a composite particle.

According to one embodiment, the obtainable particle has a largest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the obtainable particle has a smallest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the size ratio between the obtainable particle and the nanoparticles 3 ranges from 1.25 to 1 000, preferably from 2 to 500, more preferably from 5 to 250, even more preferably from 5 to 100.

According to one embodiment, the smallest dimension of the obtainable particle is smaller than the largest dimension of said obtainable particle by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the obtainable particles have an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

Obtainable particles with an average size less than 1 μm have several advantages compared to bigger particles comprising the same number of nanoparticles 3: i) increasing the scattering of light compared to bigger particles; ii) obtaining more stable colloidal suspensions compared to bigger particles, when they are dispersed in a solvent; iii) having a size compatible with pixels of at least 100 nm.

Obtainable particles with an average size larger than 1 μm have several advantages compared to smaller particles comprising the same number of nanoparticles 3: i) reducing light scattering compared to smaller particles; ii) having whispering-gallery wave modes; iii) having a size compatible with pixels larger than or equal to 1 μm; iv) increasing the average distance between nanoparticles 3 comprised in said obtainable particles, resulting in a better heat draining; v) increasing the average distance between nanoparticles 3 comprised in said obtainable particles and the surface of said obtainable particles, thus better protecting the nanoparticles 3 against oxidation, or delaying oxidation resulting from a chemical reaction with chemical species coming from the outer space of said particles; vi) increasing the mass ratio between obtainable particle and nanoparticles 3 comprised in said obtainable particle compared to smaller obtainable particles, thus reducing the mass concentration of chemical elements subject to ROHS standards, making it easier to comply with the ROHS requirements.

According to one embodiment, the obtainable particle is ROHS compliant.

According to one embodiment, the obtainable particle comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the obtainable particle comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the obtainable particle comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the obtainable particle comprises heavier chemical elements than the main chemical element present in the inorganic material 2. In this embodiment, said heavy chemical elements in the obtainable particle will lower the mass concentration of chemical elements subject to ROHS standards, allowing said obtainable particle to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the obtainable particle has a smallest curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$; 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299 $\mu m^{-1}$, 0.0296 $\mu m^{-1}$, 0.0294 $\mu m^{-1}$, 0.0292 $\mu m^{-1}$, 0.029 $\mu m^{-1}$, 0.0288 $\mu m^{-1}$, 0.0286 $\mu m^{-1}$, 0.0284 $\mu m^{-1}$, 0.0282 $\mu m^{-1}$, 0.028 $\mu m^{-1}$, 0.0278 $\mu m^{-1}$, 0.0276 $\mu m^{-1}$, 0.0274 $\mu m^{-1}$, 0.0272 $\mu m^{-1}$; 0.0270 $\mu m^{-1}$, 0.0268 $\mu m^{-1}$, 0.02667 $\mu m^{-1}$, 0.0265 $\mu m^{-1}$, 0.0263 $\mu m^{-1}$, 0.0261 $\mu m^{-1}$, 0.026 $\mu m^{-1}$, 0.0258 $\mu m^{-1}$, 0.0256 $\mu m^{-1}$, 0.0255 $\mu m^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 $\mu m^{-1}$, 0.023 $\mu m^{-1}$, 0.0229 $\mu m^{-1}$, 0.0227 $\mu m^{-1}$, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, the obtainable particle has a largest curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784

μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the obtainable particles are polydisperse.

According to one embodiment, the obtainable particles are monodisperse.

According to one embodiment, the obtainable particles have a narrow size distribution.

According to one embodiment, the obtainable particles are not aggregated.

According to one embodiment, the obtainable particles do not touch, are not in contact.

According to one embodiment, the obtainable particles are adjoining, are in contact.

According to one embodiment, the surface roughness of the obtainable particle is less or equal to 0%, 0.0001%, 0.0002%, 0.0003%, 0.0004%, 0.0005%, 0.0006%, 0.0007%, 0.0008%, 0.0009%. 0.001%. 0.002%. 0.003%. 0.004%. 0.005%. 0.006%. 0.007%. 0.008%. 0.009%. 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said obtainable particle, meaning that the surface of said obtainable particles is completely smooth.

According to one embodiment, the surface roughness of the obtainable particle is less or equal to 0.5% of the largest dimension of said obtainable particle, meaning that the surface of said obtainable particles is completely smooth.

According to one embodiment, the obtainable particle has a spherical shape, an ovoid shape, a discoidal shape, a cylindrical shape, a faceted shape, a hexagonal shape, a triangular shape, a cubic shape, or a platelet shape.

According to one embodiment, the obtainable particle has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the obtainable particle has a spherical shape, or the obtainable particle is a bead.

According to one embodiment, the obtainable particle is hollow, i.e. the obtainable particle is a hollow bead.

According to one embodiment, the obtainable particle does not have a core/shell structure.

According to one embodiment, the obtainable particle has a core/shell structure as described hereafter.

According to one embodiment, the obtainable particle is not a fiber.

According to one embodiment, the obtainable particle is not a matrix with undefined shape.

According to one embodiment, the obtainable particle is not macroscopical piece of glass. In this embodiment, a piece of glass refers to glass obtained from a bigger glass entity for example by cutting it, or to glass obtained by using a mold. In one embodiment, a piece of glass has at least one dimension exceeding 1 mm.

According to one embodiment, the obtainable particle is not obtained by reducing the size of the inorganic material 2. For example, obtainable particle is not obtained by milling a piece of inorganic material 2, nor by cutting it, nor by firing it with projectiles like particles, atoms or electrons, or by any other method.

According to one embodiment, the obtainable particle is not obtained by milling bigger particles or by spraying a powder.

According to one embodiment, the obtainable particle is not a piece of nanometer pore glass doped with nanoparticles 3.

According to one embodiment, the obtainable particle is not a glass monolith.

According to one embodiment, the spherical obtainable particle has a diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical obtainable particles has an average diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical obtainable particles may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical obtainable particle has a unique curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$; 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299 $\mu m^{-1}$, 0.0296 $\mu m^{-1}$, 0.0294 $\mu m^{-1}$, 0.0292 $\mu m^{-1}$, 0.029 $\mu m^{-1}$, 0.0288 $\mu m^{-1}$, 0.0286 $\mu m^{-1}$, 0.0284 $\mu m^{-1}$, 0.0282 $\mu m^{-1}$, 0.028 $\mu m^{-1}$, 0.0278 $\mu m^{-1}$, 0.0276 $\mu m^{-1}$, 0.0274 $\mu m^{-1}$, 0.0272 $\mu m^{-1}$; 0.0270 $\mu m^{-1}$, 0.0268 $\mu m^{-1}$, 0.02667 $\mu m^{-1}$, 0.0265 $\mu m^{-1}$, 0.0263 $\mu m^{-1}$, 0.0261 $\mu m^{-1}$, 0.026 $\mu m^{-1}$, 0.0258 $\mu m^{-1}$, 0.0256 $\mu m^{-1}$, 0.0255 $\mu m^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 $\mu m^{-1}$, 0.023 $\mu m^{-1}$, 0.0229 $\mu m^{-1}$, 0.0227 $\mu m^{-1}$, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, a statistical set of the spherical obtainable particles has an average unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical obtainable particle has no deviation, meaning that said obtainable particle has a perfect spherical shape. A perfect spherical shape prevents fluctuations of the intensity of scattered light.

According to one embodiment, the unique curvature of the spherical obtainable particle may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said obtainable particle.

According to one embodiment, the obtainable particle is luminescent.

According to one embodiment, the obtainable particle is fluorescent.

According to one embodiment, the obtainable particle is phosphorescent.

According to one embodiment, the obtainable particle is electroluminescent.

According to one embodiment, the obtainable particle is chemiluminescent.

According to one embodiment, the obtainable particle is triboluminescent.

According to one embodiment, the features of the light emission of obtainable particle are sensible to external pressure variations. In this embodiment, "sensible" means that the features of the light emission can be modified by external pressure variations.

According to one embodiment, the wavelength emission peak of obtainable particle is sensible to external pressure variations. In this embodiment, "sensible" means that the wavelength emission peak can be modified by external pressure variations, i.e. external pressure variations can induce a wavelength shift.

According to one embodiment, the FWHM of obtainable particle is sensible to external pressure variations. In this embodiment, "sensible" means that the FWHM can be modified by external pressure variations, i.e. FWHM can be reduced or increased.

According to one embodiment, the PLQY of obtainable particle is sensible to external pressure variations. In this embodiment, "sensible" means that the PLQY can be modified by external pressure variations, i.e. PLQY can be reduced or increased.

According to one embodiment, the features of the light emission of obtainable particle are sensible to external temperature variations.

According to one embodiment, the wavelength emission peak of obtainable particle is sensible to external temperature variations. In this embodiment, "sensible" means that the wavelength emission peak can be modified by external temperature variations, i.e. external temperature variations can induce a wavelength shift.

According to one embodiment, the FWHM of obtainable particle is sensible to external temperature variations. In this embodiment, "sensible" means that the FWHM can be modified by external temperature variations, i.e. FWHM can be reduced or increased.

According to one embodiment, the PLQY of obtainable particle is sensible to external temperature variations. In this embodiment, "sensible" means that the PLQY can be modified by external temperature variations, i.e. PLQY can be reduced or increased.

According to one embodiment, the features of the light emission of obtainable particle are sensible to external variations of pH.

According to one embodiment, the wavelength emission peak of obtainable particle is sensible to external variations of pH. In this embodiment, "sensible" means that the wavelength emission peak can be modified by external variations of pH, i.e. external variations of pH can induce a wavelength shift.

According to one embodiment, the FWHM of obtainable particle is sensible to e external variations of pH. In this embodiment, "sensible" means that the FWHM can be modified by external variations of pH, i.e. FWHM can be reduced or increased.

According to one embodiment, the PLQY of obtainable particle is sensible to external variations of pH. In this embodiment, "sensible" means that the PLQY can be modified by external variations of pH, i.e. PLQY can be reduced or increased.

According to one embodiment, the obtainable particle comprises at least one nanoparticle 3 wherein the wavelength emission peak is sensible to external temperature variations; and at least one nanoparticle 3 wherein the wavelength emission peak is not or less sensible to external temperature variations. In this embodiment, "sensible" means that the wavelength emission peak can be modified by external temperature variations, i.e. wavelength emission peak can be reduced or increased. This embodiment is particularly advantageous for temperature sensor applications.

According to one embodiment, the obtainable particle exhibits an emission spectrum with at least one emission peak, wherein said emission peak has a maximum emission wavelength ranging from 400 nm to 50 μm.

According to one embodiment, the obtainable particle exhibits an emission spectrum with at least one emission peak, wherein said emission peak has a maximum emission wavelength ranging from 400 nm to 500 nm. In this embodiment, the obtainable particle emits blue light.

According to one embodiment, the obtainable particle exhibits an emission spectrum with at least one emission peak, wherein said emission peak has a maximum emission wavelength ranging from 500 nm to 560 nm, more preferably ranging from 515 nm to 545 nm. In this embodiment, the obtainable particle emits green light.

According to one embodiment, the obtainable particle exhibits an emission spectrum with at least one emission peak, wherein said emission peak has a maximum emission wavelength ranging from 560 nm to 590 nm. In this embodiment, the obtainable particle emits yellow light.

According to one embodiment, the obtainable particle exhibits an emission spectrum with at least one emission peak, wherein said emission peak has a maximum emission wavelength ranging from 590 nm to 750 nm, more preferably ranging from 610 nm to 650 nm. In this embodiment, the obtainable particle emits red light.

According to one embodiment, the obtainable particle exhibits an emission spectrum with at least one emission peak, wherein said emission peak has a maximum emission wavelength ranging from 750 nm to 50 μm. In this embodiment, the obtainable particle emits near infra-red, mid-infrared, or infra-red light.

According to one embodiment, the obtainable particle is magnetic.

According to one embodiment, the obtainable particle is ferromagnetic.

According to one embodiment, the obtainable particle is paramagnetic.

According to one embodiment, the obtainable particle is superparamagnetic.

According to one embodiment, the obtainable particle is diamagnetic.

According to one embodiment, the obtainable particle is plasmonic.

According to one embodiment, the obtainable particle has catalytic properties.

According to one embodiment, the obtainable particle has photovoltaic properties.

According to one embodiment, the obtainable particle is piezo-electric.

According to one embodiment, the obtainable particle is pyro-electric.

According to one embodiment, the obtainable particle is ferro-electric.

According to one embodiment, the obtainable particle is drug delivery featured.

According to one embodiment, the obtainable particle is a light scatterer.

According to one embodiment, the obtainable particle absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the obtainable particle is an electrical insulator. In this embodiment, the quenching of fluorescent properties for fluorescent nanoparticles 3 encapsulated in the inorganic material 2 is prevented when it is due to electron transport. In this embodiment, the obtainable particle may be used as an electrical insulator material exhibiting the same properties as the nanoparticles 3 encapsulated in the inorganic material 2.

According to one embodiment, the obtainable particle is an electrical conductor. This embodiment is particularly advantageous for an application of the obtainable particle in photovoltaics or LEDs.

According to one embodiment, the obtainable particle has an electrical conductivity at standard conditions ranging from $1\times10-^{20}$ to $10^7$ S/m, preferably from $1\times10-^{15}$ to 5 S/m, more preferably from $1\times10^{-7}$ to 1 S/m.

According to one embodiment, the obtainable particle has an electrical conductivity at standard conditions of at least $1\times10-^{20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the obtainable particle may be measured for example with an impedance spectrometer.

According to one embodiment, the obtainable particle is a thermal insulator.

According to one embodiment, the obtainable particle is a thermal conductor. In this embodiment, the obtainable particle is capable of draining away the heat originating from the nanoparticles 3 encapsulated in the inorganic material 2, or from the environment.

According to one embodiment, the obtainable particle has a thermal conductivity at standard conditions ranging from 0.1 to 450 W/(m·K), preferably from 1 to 200 W/(m·K), more preferably from 10 to 150 W/(m·K).

According to one embodiment, the obtainable particle has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the obtainable particle may be measured for example by steady-state methods or transient methods.

According to one embodiment, the obtainable particle is a local high temperature heating system.

According to one embodiment, the obtainable particle is hydrophobic.

According to one embodiment, the obtainable particle is hydrophilic.

According to one embodiment, the obtainable particle is dispersible in aqueous solvents, organic solvents and/or mixture thereof.

According to one embodiment, the obtainable particle exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the obtainable particle exhibits emission spectra with at least one emission peak having a full width half maximum strictly lower than 90 nm, 80 nm, 70 nm, 60 nm, 50 nm, 40 nm, 30 nm, 25 nm, 20 nm, 15 nm, or 10 nm.

According to one embodiment, the obtainable particle exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the obtainable particle exhibits emission spectra with at least one emission peak having a full width at quarter maximum strictly lower than 90 nm, 80 nm, 70 nm, 60 nm, 50 nm, 40 nm, 30 nm, 25 nm, 20 nm, 15 nm, or 10 nm.

According to one embodiment, the obtainable particle has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99%, or 100%.

In one embodiment, the obtainable particle exhibits photoluminescence quantum yield (PLQY) decrease of less than 90%, 80%, 70%, 60%, 50%, 40%, 30%, 25%, 20%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 mW·cm$^{-2}$ and 100 kW·cm$^{2}$, more preferably between 10 mW·cm$^{-2}$ and 100 W·cm$^{-2}$, and even more preferably between 10 mW·cm$^{-2}$ and 30 W·cm$^{2}$.

According to one embodiment, the photon flux or average peak pulse power of the illumination is at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the obtainable particle exhibits photoluminescence quantum yield (PQLY) decrease of less than 90%, 80%, 70%, 60%, 50%, 40%, 30%, 25%, 20%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the obtainable particle exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$ According to one embodiment, the obtainable particle has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the obtainable particle exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$. In this embodiment, the obtainable particle preferably comprises quantum dots, semiconductor nanoparticles, semiconductor nanocrystals, or semiconductor nanoplatelets.

In one preferred embodiment, the obtainable particle exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the obtainable particle exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$. In this embodiment, the obtainable particle preferably comprises quantum dots, semiconductor nanoparticles, semiconductor nanocrystals, or semiconductor nanoplatelets.

In one preferred embodiment, the obtainable particle exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the obtainable particle is surfactant-free. In this embodiment, the surface of the obtainable particle will be easy to functionalize as said surface will not be blocked by any surfactant molecule.

According to one embodiment, the obtainable particle is not surfactant-free.

According to one embodiment, the obtainable particle is amorphous.

According to one embodiment, the obtainable particle is crystalline.

According to one embodiment, the obtainable particle is totally crystalline.

According to one embodiment, the obtainable particle is partially crystalline.

According to one embodiment, the obtainable particle is monocrystalline.

According to one embodiment, the obtainable particle is polycrystalline. In this embodiment, the obtainable particle comprises at least one grain boundary.

According to one embodiment, the obtainable particle is a colloidal particle.

According to one embodiment, the obtainable particle does not comprise a spherical porous bead, preferably the obtainable particle does not comprise a central spherical porous bead.

According to one embodiment, the obtainable particle does not comprise a spherical porous bead, wherein nanoparticles 3 are linked to the surface of said spherical porous bead.

According to one embodiment, the obtainable particle does not comprise a bead and nanoparticles 3 having opposite electronic charges.

According to one embodiment, the obtainable particle is porous.

According to one embodiment, the obtainable particle is considered porous when the quantity adsorbed by the obtainable particles determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the obtainable particle can be hexagonal, vermicular or cubic.

According to one embodiment, the organized porosity of the obtainable particle has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the obtainable particle is not porous.

According to one embodiment, the obtainable particle is considered non-porous when the quantity adsorbed by the said obtainable particle determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the obtainable particle does not comprise pores or cavities.

According to one embodiment, the obtainable particle is permeable.

According to one embodiment, the permeable obtainable particle has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the obtainable particle is impermeable to outer molecular species, gas or liquid. In this embodiment, outer molecular species, gas or liquid refers to molecular species, gas or liquid external to said obtainable particle.

According to one embodiment, the impermeable obtainable particle has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the obtainable particle has an oxygen transmission rate ranging from $10^{-7}$ to 10 $cm^3 \cdot m^2 \cdot day^{-1}$, preferably from $10^{-7}$ to 1 $cm^3 \cdot m^2 \cdot day^{-1}$, more preferably from $10^{-7}$ to $10^{-1}$ $cm^3 \cdot m^2 \cdot day^{-1}$, even more preferably from $10-^{7}$ to $10^{-4}$ $cm^3 \cdot m^2 \cdot day^{-1}$ at room temperature.

According to one embodiment, the obtainable particle has a water vapor transmission rate ranging from $10-^{7}$ to 10 $g \cdot m^{-2} \cdot day^{-1}$, preferably from $10-^{7}$ to 1 $g \cdot m^{-2} \cdot day^{-1}$, more preferably from $10^{-7}$ to $10-^{1}$ $g \cdot m^{-2} \cdot day^{-1}$, even more preferably from $10-^{7}$ to $10^{-4}$ $g \cdot m^{-2} \cdot day^{-1}$ at room temperature. A water vapor transmission rate of $10-^{6}$ $g \cdot m^2 \cdot day^{-1}$ is particularly adequate for a use on LED.

According to one embodiment, the obtainable particle exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the specific property of the obtainable particle comprises one or more of the following: fluorescence, phosphorescence, chemiluminescence, capacity of increasing local electromagnetic field, absorbance, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the obtainable particle exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the obtainable particle is optically transparent, i.e. the obtainable particle is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, each nanoparticle 3 is totally surrounded by or encapsulated in the inorganic material 2.

According to one embodiment, each nanoparticle 3 is partially surrounded by or encapsulated in the inorganic material 2.

According to one embodiment, the obtainable particle comprises at least 95%, 90%, 85%, 80%, 75%, 70%, 65%, 60%, 55%, 50%, 45%, 40%, 35%, 30%, 25%, 20%, 15%, 10%, 5%, 1%, or 0% of nanoparticles 3 on its surface.

According to one embodiment, the obtainable particle does not comprise nanoparticles 3 on its surface. In this embodiment, said nanoparticles 3 are completely surrounded by the inorganic material 2.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of nanoparticles 3 are comprised in the inorganic material 2. In this embodiment, each of said nanoparticles 3 is completely surrounded by the inorganic material 2.

According to one embodiment, the obtainable particle comprises at least one nanoparticle 3 located on the surface of said obtainable particle. This embodiment is advantageous as the at least one nanoparticle 3 will be better excited by the incident light than if said nanoparticle 3 was dispersed in the inorganic material 2.

According to one embodiment, the obtainable particle comprises nanoparticles 3 dispersed in the inorganic material 2, i.e. totally surrounded by said inorganic material 2; and at least one nanoparticle 3 located on the surface of said luminescent particle 1.

According to one embodiment, the obtainable particle comprises nanoparticles 3 dispersed in the inorganic material 2, wherein said nanoparticles 3 emit at a wavelength in the range from 500 to 560 nm; and at least one nanoparticle 3 located on the surface of said obtainable particle, wherein said at least one nanoparticle 3 emits at a wavelength in the range from 600 to 2500 nm.

According to one embodiment, the obtainable particle comprises nanoparticles 3 dispersed in the inorganic material 2, wherein said nanoparticles 3 emit at a wavelength in the range from 600 to 2500 nm; and at least one nanoparticle 3 located on the surface of said obtainable particle, wherein said at least one nanoparticle 3 emits at a wavelength in the range from 500 to 560 nm.

According to one embodiment, the at least one nanoparticle 3 located on the surface of said obtainable particle may be chemically or physically adsorbed on said surface.

According to one embodiment, the at least one nanoparticle 3 located on the surface of said obtainable particle may be adsorbed on said surface.

According to one embodiment, the at least one nanoparticle 3 located on the surface of said obtainable particle may be adsorbed with a cement on said surface.

According to one embodiment, examples of cement include but are not limited to: polymers, silicone, oxides, or a mixture thereof.

According to one embodiment, the at least one nanoparticle 3 located on the surface of said obtainable particle may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the inorganic material 2.

According to one embodiment, a plurality of nanoparticles 3 is uniformly spaced on the surface of the obtainable particle.

According to one embodiment, each nanoparticle 3 of the plurality of nanoparticles 3 is spaced from its adjacent nanoparticle 3 by an average minimal distance, said average minimal distance is as described hereabove.

According to one embodiment, the obtainable particle is a homostructure.

According to one embodiment, the obtainable particle is not a core/shell structure wherein the core does not comprise nanoparticles 3 and the shell comprises nanoparticles 3.

According to one embodiment, the obtainable particle is a heterostructure, comprising a core 11 and at least one shell 12.

According to one embodiment, the shell 12 of the core/shell obtainable particle comprises comprises or consists of an inorganic material 2. In this embodiment, said inorganic material 2 is the same or different than the inorganic material 2 comprised in the core 11 of the core/shell obtainable particle.

According to one embodiment, the core 11 of the core/shell obtainable particle comprises nanoparticles 3 as described herein and the shell 12 of the core/shell obtainable particle does not comprise nanoparticles 3.

According to one embodiment, the core 11 of the core/shell obtainable particle comprises nanoparticles 3 as described herein and the shell 12 of the core/shell obtainable particle comprises nanoparticles 3.

According to one embodiment, the nanoparticles 3 comprised in the core 11 of the core/shell obtainable particle are identical to the nanoparticles 3 comprised in the shell 12 of the core/shell obtainable particle.

According to one embodiment, the nanoparticles 3 comprised in the core 11 of the core/shell obtainable particle are different to the nanoparticles 3 comprised in the shell 12 of the core/shell obtainable particle. In this embodiment, the resulting core/shell obtainable particle will exhibit different properties.

According to one embodiment, the core 11 of the core/shell obtainable particle comprises at least one luminescent nanoparticle and the shell 12 of the core/shell obtainable particle comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 11 of the core/shell obtainable particle and the shell 12 of the core/shell obtainable particle comprise at least two different luminescent nanoparticles, wherein said luminescent nanoparticles have different emission wavelengths. This means that the core 11 comprises at least one luminescent nanoparticle and the shell 12 comprises at least one luminescent nanoparticle, said luminescent nanoparticles having different emission wavelengths.

In a preferred embodiment, the core 11 of the core/shell obtainable particle and the shell 12 of the core/shell obtainable particle comprise at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the core 11 of the core/shell obtainable particle and the shell 12 of the core/shell obtainable particle comprise at least one luminescent nanoparticle emitting in the green region of the visible spectrum and at least one luminescent nanoparticle emitting in the red region of the visible spectrum, thus the obtainable particle paired with a blue LED will be a white light emitter.

In a preferred embodiment, the core 11 of the core/shell obtainable particle and the shell 12 of the core/shell obtainable particle comprise at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the core 11 of the core/shell obtainable particle and the shell 12 of the core/shell obtainable particle comprise at least one luminescent nanoparticle emitting in the blue region of the visible spectrum and at least one luminescent nanoparticle emitting in the red region of the visible spectrum, thus the obtainable particle will be a white light emitter.

In a preferred embodiment, the core 11 of the core/shell obtainable particle and the shell 12 of the core/shell obtainable particle comprise comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the core 11 of the core/shell obtainable particle and the shell 12 of the core/shell obtainable particle comprise comprises at least one luminescent nanoparticle emitting in the blue region of the visible spectrum and at least one luminescent nanoparticle emitting in the green region of the visible spectrum.

According to one embodiment, the core 11 of the core/shell obtainable particle comprises at least one magnetic nanoparticle and the shell 12 of the core/shell obtainable particle comprises at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtainable particle comprises at least one plasmonic nanoparticle and the shell 12 of the core/shell obtainable particle comprises at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 11 of the core/shell obtainable particle comprises at least one plasmonic nanoparticle and the shell 12 of the core/shell obtainable particle comprises at least one luminescent nanoparticle emitting in the visible spectrum of light. According to one embodiment, the core 11 of the core/shell obtainable particle comprises at least one dielectric nanoparticle and the shell 12 of the core/shell obtainable particle comprises at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtainable particle comprises at least one piezoelectric nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtainable particle comprises at least one pyro-electric nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell obtainable particle comprises at least one ferro-electric nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the core 11 of the core/shell obtainable particle comprises at least one light scattering nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the core 11 of the core/shell obtainable particle comprises at least one electrically insulating nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the core 11 of the core/shell obtainable particle comprises at least one thermally insulating nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the core 11 of the core/shell obtainable particle comprises at least one catalytic nanoparticle and the shell 12 of the core/shell obtainable particle comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the shell 12 of the obtainable particle has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the shell 12 of the obtainable particle has a thickness homogeneous all along the core 11, i.e. the shell 12 of the obtainable particle has a same thickness all along the core 11.

According to one embodiment, the shell 12 of the obtainable particle has a thickness heterogeneous along the core 11, i.e. said thickness varies along the core 11.

According to one embodiment, the obtainable particle is not a core/shell particle wherein the core is an aggregate of metallic particles and the shell comprises the inorganic material 2. According to one embodiment, the obtainable particle is a core/shell particle wherein the core is filled with solvent and the shell comprises nanoparticles 3 dispersed in an inorganic material 2, i.e. said obtainable particle is a hollow bead with a solvent filled core.

According to one embodiment, the nanoparticles 3 are as described hereabove.

According to one embodiment, the inorganic material 2 is as described hereabove.

According to one embodiment, as illustrated in FIG. 4, the obtainable particle comprises a combination of at least two different nanoparticles (31, 32). In this embodiment, the resulting obtainable particle will exhibit different properties.

According to one embodiment, the obtainable particle comprises at least one luminescent nanoparticle and at least one nanoparticle 3 selected in the group of magnetic nanoparticle, plasmonic nanoparticle, dielectric nanoparticle, piezoelectric nanoparticle, pyro-electric nanoparticle, ferroelectric nanoparticle, light scattering nanoparticle, electrically insulating nanoparticle, thermally insulating nanoparticle, or catalytic nanoparticle.

In a preferred embodiment, the obtainable particle comprises at least two different luminescent nanoparticles, wherein said luminescent nanoparticles have different emission wavelengths.

In a preferred embodiment, the obtainable particle comprises at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the obtainable particle comprises at least one luminescent nanoparticle emitting in the green region of the visible spectrum and at least one luminescent nanoparticle emitting in the red region of the visible spectrum, thus the obtainable particle paired with a blue LED will be a white light emitter.

In a preferred embodiment, the obtainable particle comprises at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the obtainable particle comprises at least one luminescent nanoparticle emitting in the blue region of the visible spectrum and at least one luminescent nanoparticle emitting in the red region of the visible spectrum, thus the obtainable particle will be a white light emitter.

In a preferred embodiment, the obtainable particle comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the obtainable particle comprises at least one luminescent nanoparticle emitting in the blue region of the visible spectrum and at least one luminescent nanoparticle emitting in the green region of the visible spectrum.

In a preferred embodiment, the obtainable particle comprises three different luminescent nanoparticles, wherein said luminescent nanoparticles emit different emission wavelengths or color.

In a preferred embodiment, the obtainable particle comprises at least three different luminescent nanoparticles, wherein at least one luminescent nanoparticle emits at a wavelength in the range from 400 to 490 nm, at least one luminescent nanoparticle emits at a wavelength in the range from 500 to 560 nm and at least one luminescent nanoparticle emits at a wavelength in the range from 600 to 2500 nm. In this embodiment, the obtainable particle comprises at least one luminescent nanoparticle emitting in the blue region of the visible spectrum, at least one luminescent nanoparticle emitting in the green region of the visible spectrum and at least one luminescent nanoparticle emitting in the red region of the visible spectrum.

According to one embodiment, the obtainable particle comprises at least one magnetic nanoparticle and at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtainable particle comprises at least one plasmonic nanoparticle and at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtainable particle comprises at least one dielectric nanoparticle and at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtainable particle comprises at least one piezoelectric nanoparticle and at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the obtainable particle comprises at least one pyro-electric nanoparticle and at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the obtainable particle comprises at least one ferro-electric nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the obtainable particle comprises at least one light scattering nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the obtainable particle comprises at least one electrically insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the obtainable particle comprises at least one thermally insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the obtainable particle comprises at least one catalytic nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the obtainable particle comprises at least one nanoparticle 3 without a shell and at least one nanoparticle 3 selected in the group of core 33/shell 34 nanoparticles 3 and core 33/insulator shell 36 nanoparticles 3.

According to one embodiment, the obtainable particle comprises at least one core 33/shell 34 nanoparticle 3 and at least one nanoparticle 3 selected in the group of nanoparticles 3 without a shell and core 33/insulator shell 36 nanoparticles 3.

According to one embodiment, the obtainable particle comprises at least one core 33/insulator shell 36 nanoparticle 3 and at least one nanoparticle 3 selected in the group of nanoparticles 3 without a shell and core 33/shell 34 nanoparticles 3.

According to one embodiment, the obtainable particle comprises at least two nanoparticles 3.

According to one embodiment, the obtainable particle comprises more than ten nanoparticles 3.

According to one embodiment, the obtainable particle comprises at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 nanoparticles 3.

According to one embodiment, the nanoparticles 3 comprised in an obtainable particle are not aggregated.

According to one embodiment, the nanoparticles 3 comprised in an obtainable particle have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the nanoparticles 3 comprised in an obtainable particle do not touch, are not in contact.

According to one embodiment, the nanoparticles 3 comprised in an obtainable particle are separated by inorganic material 2.

According to one embodiment, the nanoparticles 3 comprised in an obtainable particle can be individually evidenced.

According to one embodiment, the nanoparticles 3 comprised in an obtainable particle can be individually evidenced by transmission electron microscopy or fluorescence scanning microscopy, or any other characterization means known by the person skilled in the art.

According to one embodiment, the nanoparticles 3 comprised in an obtainable particle are uniformly dispersed in the inorganic material 2 comprised in said obtainable particle.

According to one embodiment, the nanoparticles 3 comprised in an obtainable particle are uniformly dispersed within the inorganic material 2 comprised in said obtainable particle.

According to one embodiment, the nanoparticles 3 comprised in an obtainable particle are dispersed within the inorganic material 2 comprised in said obtainable particle.

According to one embodiment, the nanoparticles 3 comprised in an obtainable particle are uniformly and evenly dispersed within the inorganic material 2 comprised in said obtainable particle.

According to one embodiment, the nanoparticles 3 comprised in an obtainable particle are evenly dispersed within the inorganic material 2 comprised in said obtainable particle.

According to one embodiment, the nanoparticles 3 comprised in an obtainable particle are homogeneously dispersed within the inorganic material 2 comprised in said obtainable particle.

According to one embodiment, the dispersion of nanoparticles 3 in the inorganic material 2 does not have the shape of a ring, or a monolayer.

According to one embodiment, each nanoparticle 3 of the plurality of nanoparticles is spaced from its adjacent nanoparticle 3 by an average minimal distance.

According to one embodiment, the average minimal distance between two nanoparticles 3 is controlled.

According to one embodiment, the average minimal distance between two nanoparticles 3 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two nanoparticles 3 is at least 1 nm, 1.5 nm, 2 nm, 2.5 nm, 3 nm, 3.5 nm, 4 nm, 4.5 nm, 5 nm, 5.5 nm, 6 nm, 6.5 mn, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 ears, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60°

C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, at least 0%, 5%, 10%, 15%, 20%, 25%, 30%, 35%, 40%, 45%, 50%, 55%, 60%, 65%, 70%, 75%, 80%, 85%, 90%, or 95% of the obtainable particles are empty, i.e. they do not comprise any nanoparticles 3.

According to one embodiment, the obtainable particle is functionalized as described hereabove. According to one embodiment, the obtainable particle further comprises at least one dense particle dispersed in the inorganic material 2. In this embodiment, said at least one dense particle comprises a dense material with a density superior to the density of the inorganic material 2.

According to one embodiment, the dense material has a bandgap superior or equal to 3 eV.

According to one embodiment, examples of dense material include but are not limited to: oxides such as for example tin oxide, silicon oxide, germanium oxide, aluminium oxide, gallium oxide, hafnium oxide, titanium oxide, tantalum oxide, ytterbium oxide, zirconium oxide, yttrium oxide, thorium oxide, zinc oxide, lanthanide oxides, actinide oxides, alkaline earth metal oxides, mixed oxides, mixed oxides thereof; metal sulfides; carbides; nitrides; or a mixture thereof.

According to one embodiment, the at least one dense particle has a maximal packing fraction of 70%, 60%, 50%, 40%, 30%, 20%, 10% or 1%.

According to one embodiment, the at least one dense particle has a density of at least 3, 4, 5, 6, 7, 8, 9 or 10.

According to a preferred embodiment, examples of obtainable particle include but are not limited to: semiconductor nanoparticles encapsulated in an inorganic material, semiconductor nanocrystals encapsulated in an inorganic material, semiconductor nanoplatelets encapsulated in an inorganic material, perovskite nanoparticles encapsulated in an inorganic material, phosphor nanoparticles encapsulated in an inorganic material, semiconductor nanoplatelets coated with grease and then in an inorganic material such as for example $Al_2O_3$, or a mixture thereof. In this embodiment, grease can refer to lipids as, for example, long apolar carbon chain molecules; phospholipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of obtainable particle include but are not limited to: CdSe/CdZnS@$SiO_2$, CdSe/CdZnS@$Si_xCd_yZn_zO_w$, CdSe/CdZnS@$Al_2O_3$, InP/ZnS@$Al_2O_3$, $CH_5N_2$—$PbBr_3$@$Al_2O_3$, CdSe/CdZnS—Au@$SiO_2$, $Fe_3O_4$@$Al_2O_3$—CdSe/CdZnS@$SiO_2$, CdS/ZnS@$Al_2O_3$, CdSeS/CdZnS@$Al_2O_3$, CdSeS/ZnS@$Al_2O_3$, CdSeS/CdZnS@$SiO_2$, InP/ZnS@$SiO_2$, CdSeS/CdZnS@$SiO_2$, InP/ZnSe/ZnS@$SiO_2$, $Fe_3O_4$@$Al_2O_3$, CdSe/CdZnS@ZnO, CdSe/CdZnS@ZnO, CdSe/CdZnS@$Al_2O_3$@MgO, CdSe/CdZnS—$Fe_3O_4$@$SiO_2$, phosphor nanoparticles@$Al_2O_3$, phosphor nanoparticles@ZnO, phosphor nanoparticles@$SiO_2$, phosphor nanoparticles@$HfO_2$, CdSe/CdZnS@$HfO_2$, CdSeS/CdZnS@$HfO_2$, InP/ZnS@$HfO_2$, CdSeS/CdZnS@$HfO_2$, InP/ZnSe/ZnS@$HfO_2$, CdSe/CdZnS—$Fe_3O_4$@$HfO_2$, CdSe/CdS/ZnS@$SiO_2$, or a mixture thereof; wherein phosphor nanoparticles include but are not limited to: Yttrium aluminium garnet particles (YAG, $Y_3Al_5O_{12}$), (Ca,Y)-α-SiAlON:Eu particles, (($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

According to one embodiment, the obtainable particle does not comprise quantum dots encapsulated in $TiO_2$, semiconductor nanocrystals encapsulated in $TiO_2$, or semiconductor nanoplatelet encapsulated in $TiO_2$.

According to one embodiment, the obtainable particle does not comprise a spacer layer between the nanoparticles 3 and the inorganic material 2.

According to one embodiment, the obtainable particle does not comprise one core/shell nanoparticle wherein the core is luminescent and emits red light, and the shell is a spacer layer between the nanoparticles 3 and the inorganic material 2.

According to one embodiment, the obtainable particle does not comprise a core/shell nanoparticle and a plurality of nanoparticles 3, wherein the core is luminescent and emits red light, and the shell is a spacer layer between the nanoparticles 3 and the inorganic material 2.

According to one embodiment, the obtainable particle does not comprise at least one luminescent core, a spacer layer, an encapsulation layer and a plurality of quantum dots, wherein the luminescent core emits red light, and the spacer layer is situated between said luminescent core and the inorganic material 2.

According to one embodiment, the obtainable particle does not comprise a luminescent core surrounded by a spacer layer and emitting red light.

According to one embodiment, the obtainable particle does not comprise nanoparticles covering or surrounding a luminescent core.

According to one embodiment, the obtainable particle does not comprise nanoparticles covering or surrounding a luminescent core emitting red light.

According to one embodiment, the obtainable particle does not comprise a luminescent core made by a specific material selected from the group consisting of silicate phosphor, aluminate phosphor, phosphate phosphor, sulfide phosphor, nitride phosphor, nitrogen oxide phosphor, and combination of aforesaid two or more materials; wherein said luminescent core is covered by a spacer layer.

Figure 6:
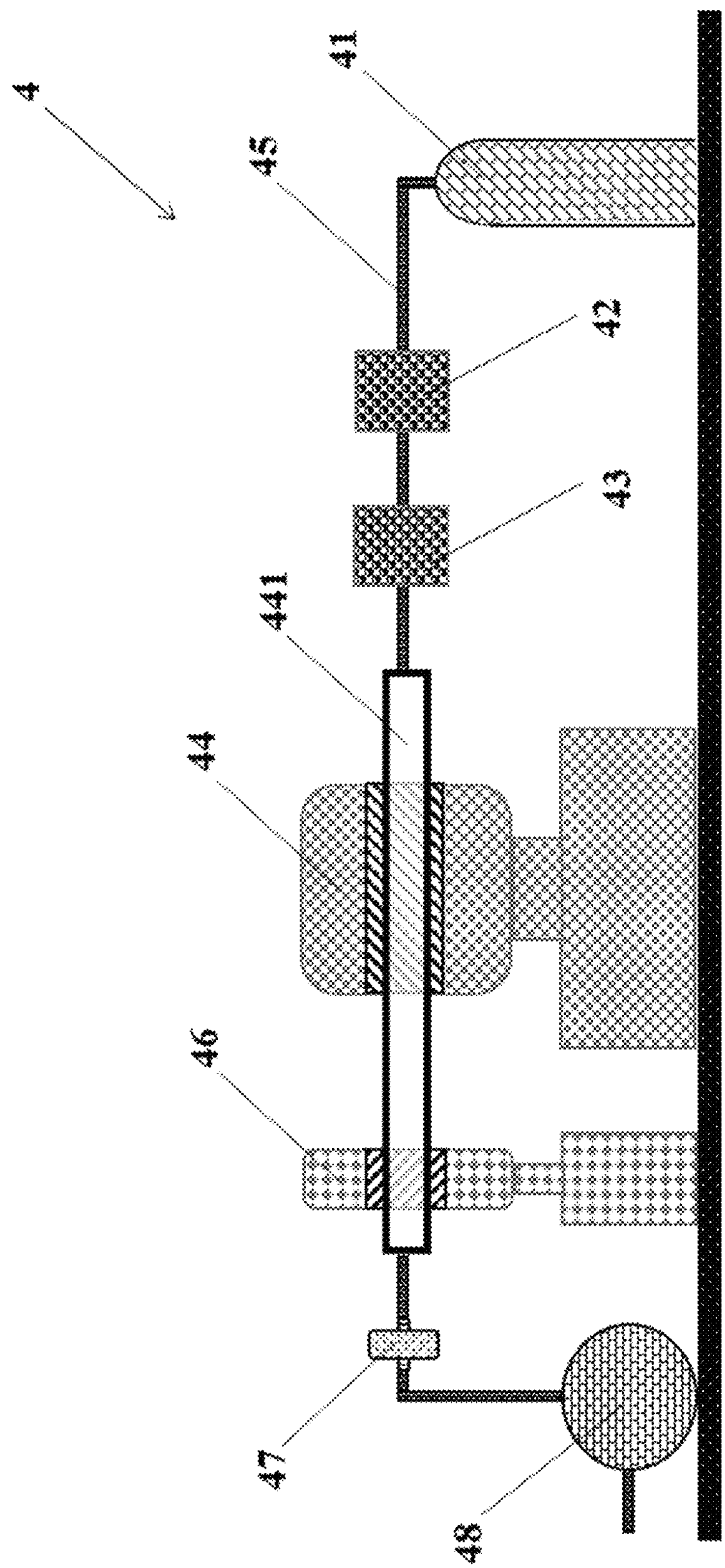
FIG. 6 illustrates a device 4 for implementing the method of the invention comprising a gas supply 41; a first means for forming droplets of a first solution 42; a second means for forming droplets of a second solution 43; a tube 441; means for heating the droplets to obtain at least one particle 44; means for cooling the at least one particle 46; means for separating and collecting the at least one particle 47; a pumping device 48; and connecting means 45.

Another object of the invention relates to a device 4 for implementing the method of the invention, said device 4, as illustrated in FIG. 6, comprising:

- at least one gas supply 41;
- a first means for forming droplets 42 of a first solution;
- a second means for forming droplets 43 of a second solution;
- an optional means for forming reactive vapors of a third solution;
- an optional means for releasing gas;
- a tube 441;
- means for heating the droplets 44 to obtain at least one particle 1;
- means for cooling 46 the at least one particle 1;
- means for separating and collecting 47 the at least one particle 1;
- a pumping device 48; and
- connecting means 45.

The connecting means 45 connects the at least one gas supply 41 to: i) the first means for forming droplets 42 of a first solution; ii) the second means for forming droplets 43 of a second solution; iii) the optional means for forming reactive vapors of a third solution; iv) the optional means for releasing gas; said at least one gas supply 41 is connected independently to each means here mentioned. The connecting means 45 can connect the means here mentioned to each other. The connecting means 45 connects the means here mentioned to the tube 441. Said tube 441 is placed inside the means for heating the droplets 44. The connecting means 45 may connect the tube 441 to the means for cooling 46 the at least one particle 1 or the tube 441 may be connected to the means for cooling 46 the at least one particle 1 without any connecting means 45. The connecting means 45 may connect the means for cooling 46 the at least one particle 1 to the means for separating and collecting 47 the at least one particle 1 or the means for cooling 46 the at least one particle 1 may be connected to the means for separating and collecting 47 the at least one particle 1 without any connecting means 45. The connecting means 45 connects the pumping device 48 to the means for separating and collecting 47 the at least one particle 1 or to other parts of the device 4.

The device 4 comprising a first and a second means for forming droplets allows the use of at least two distinct precursor solutions. This allows for a fine control of the synthesis conditions on the different precursors used, and results in complex particles that can comprise a plurality of nanoparticles.

According to one embodiment, the device further comprises at least one valve 413 controlling the gas flow provided by the at least one gas supply 41.

According to one embodiment, the at least one gas supply 41 is a gas bottle, a gas production system, a container susceptible of releasing gas or the ambient atmosphere.

According to one embodiment, the at least one gas supply 41 comprises at least one gas supply 41 such as for example gas bottle, gas production system, container susceptible of releasing gas or the ambient atmosphere.

Figure 7:
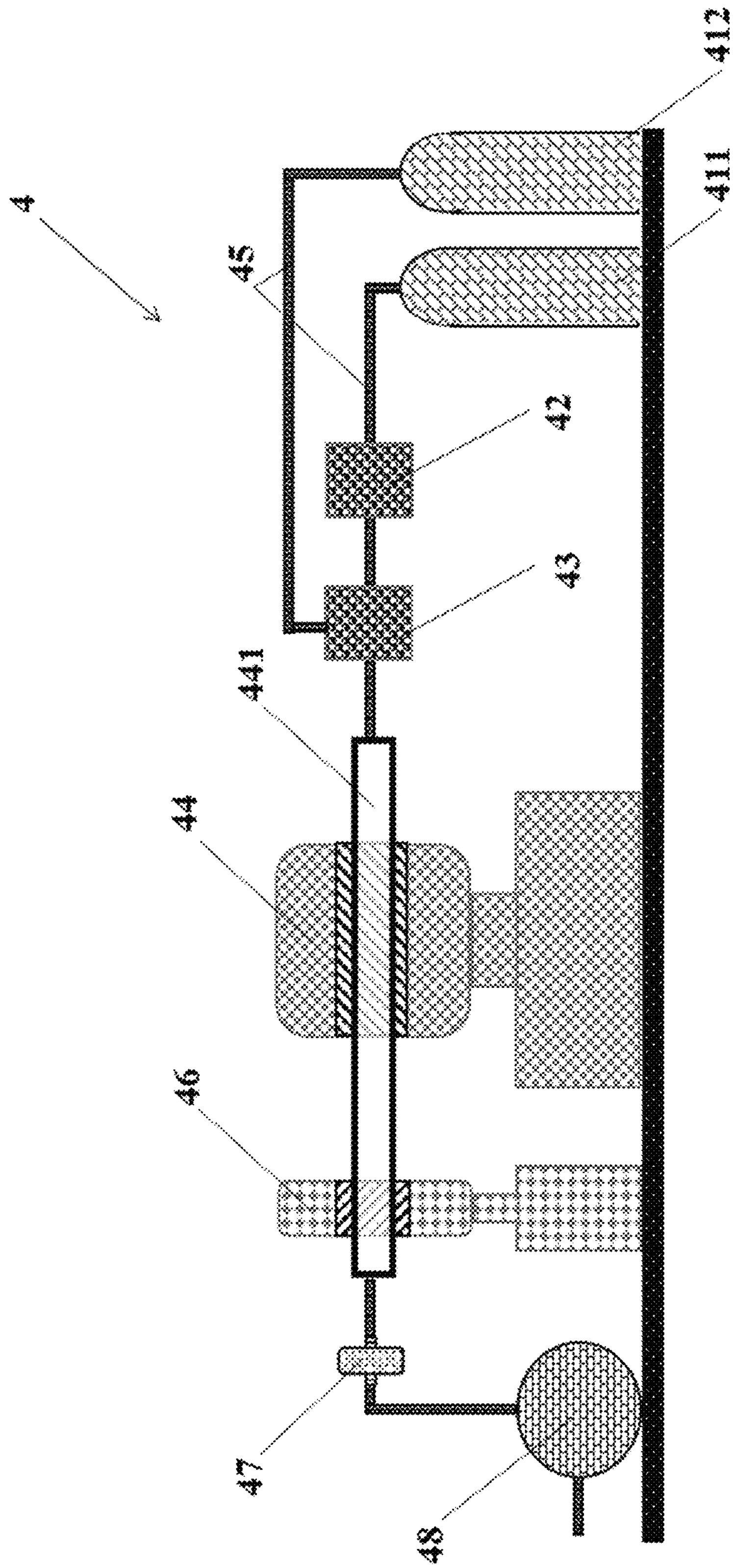
FIG. 7 illustrates a device 4 for implementing the method of the invention comprising two gas supplies (411, 412); a first means for forming droplets of a first solution 42; a second means for forming droplets of a second solution 43; a tube 441; means for heating the droplets to obtain at least one particle 44; means for cooling the at least one particle 46; means for separating and collecting the at least one particle 47; a pumping device 48; and connecting means 45.

According to one embodiment, as illustrated in FIG. 7, the gas supply 41 comprises two gas supplies (411, 412) such as for example gas bottles, a gas production system, containers susceptible of releasing gas or the ambient atmosphere. Each of the two gas supplies is connected to one means for forming droplets (42, 43), or one container 49 (not shown in FIG. 7). In this embodiment, the feed rate of solution A and solution B, i.e. the flow of solution A and solution B sprayed into the device, is controlled by independent pressures of inlet gas.

According to one embodiment, the feed rate of solution A and solution B, i.e. the flow of solution A and solution B sprayed into the device, is in the range from 1 mL/h to 10000 mL/h, from 5 mL/h to 5000 mL/h, from 10 mL/h to 2000 mL/h, from 30 mL/h to 1000 mL/h.

According to one embodiment, the feed rate of solution A is at least 1 mL/h, 1.5 mL/h, 2.5 mL/h, 3 mL/h, 3.5 mL/h, 4 mL/h, 4.5 mL/h, 5 mL/h, 5.5 mL/h, 6 mL/h, 6.5 mL/h, 7 mL/h, 7.5 mL/h, 8 mL/h, 8.5 mL/h, 9 mL/h, 9.5 mL/h, 10 mL/h, 10.5 mL/h, 11 mL/h, 11.5 mL/h, 12 mL/h, 12.5 mL/h, 13 mL/h, 13.5 mL/h, 14 mL/h, 14.5 mL/h, 15 mL/h, 15.5 mL/h, 16 mL/h, 16.5 mL/h, 17 mL/h, 17.5 mL/h, 18 mL/h, 18.5 mL/h, 19 mL/h, 19.5 mL/h, 20 mL/h, 20.5 mL/h, 21 mL/h, 21.5 mL/h, 22 mL/h, 22.5 mL/h, 23 mL/h, 23.5 mL/h, 24 mL/h, 24.5 mL/h, 25 mL/h, 25.5 mL/h, 26 mL/h, 26.5 mL/h, 27 mL/h, 27.5 mL/h, 28 mL/h, 28.5 mL/h, 29 mL/h, 29.5 mL/h, 30 mL/h, 30.5 mL/h, 31 mL/h, 31.5 mL/h, 32 mL/h, 32.5 mL/h, 33 mL/h, 33.5 mL/h, 34 mL/h, 34.5 mL/h, 35 mL/h, 35.5 mL/h, 36 mL/h, 36.5 mL/h, 37 mL/h, 37.5 mL/h, 38 mL/h, 38.5 mL/h, 39 mL/h, 39.5 mL/h, 40 mL/h, 40.5 mL/h, 41 mL/h, 41.5 mL/h, 42 mL/h, 42.5 mL/h, 43 mL/h, 43.5 mL/h, 44 mL/h, 44.5 mL/h, 45 mL/h, 45.5 mL/h, 46 mL/h, 46.5 mL/h, 47 mL/h, 47.5 mL/h, 48 mL/h, 48.5 mL/h, 49 mL/h, 49.5 mL/h, 50 mL/h, 50.5 mL/h, 51 mL/h, 51.5 mL/h, 52 mL/h, 52.5 mL/h, 53 mL/h, 53.5 mL/h, 54 mL/h, 54.5 mL/h, 55 mL/h, 55.5 mL/h, 56 mL/h, 56.5 mL/h, 57 mL/h, 57.5 mL/h, 58 mL/h, 58.5 mL/h, 59 mL/h, 59.5 mL/h, 60 mL/h, 60.5 mL/h, 61 mL/h, 61.5 mL/h, 62 mL/h, 62.5 mL/h, 63 mL/h, 63.5 mL/h, 64 mL/h, 64.5 mL/h, 65 mL/h, 65.5 mL/h, 66 mL/h, 66.5 mL/h, 67 mL/h, 67.5 mL/h, 68 mL/h, 68.5 mL/h, 69 mL/h, 69.5 mL/h, 70 mL/h, 70.5 mL/h, 71 mL/h, 71.5 mL/h, 72 mL/h, 72.5 mL/h, 73 mL/h, 73.5 mL/h, 74 mL/h, 74.5 mL/h, 75 mL/h, 75.5 mL/h, 76 mL/h, 76.5 mL/h, 77 mL/h, 77.5 mL/h, 78 mL/h, 78.5 mL/h, 79 mL/h, 79.5 mL/h, 80 mL/h, 80.5 mL/h, 81 mL/h, 81.5 mL/h, 82 mL/h, 82.5 mL/h, 83 mL/h, 83.5 mL/h, 84 mL/h, 84.5 mL/h, 85 mL/h, 85.5 mL/h, 86 mL/h, 86.5 mL/h, 87 mL/h, 87.5 mL/h, 88 mL/h, 88.5 mL/h, 89 mL/h, 89.5 mL/h, 90 mL/h, 90.5 mL/h, 91 mL/h, 91.5 mL/h, 92 mL/h, 92.5 mL/h, 93 mL/h, 93.5 mL/h, 94 mL/h, 94.5 mL/h, 95 mL/h, 95.5 mL/h, 96 mL/h, 96.5 mL/h, 97 mL/h, 97.5 mL/h, 98 mL/h, 98.5 mL/h, 99 mL/h, 99.5 mL/h, 100 mL/h, 200 mL/h, 250 mL/h, 300 mL/h, 350 mL/h, 400 mL/h, 450 mL/h, 500 mL/h, 550 mL/h, 600 mL/h, 650 mL/h, 700 mL/h, 750 mL/h, 800 mL/h, 850 mL/h, 900 mL/h, 950 mL/h, 1000 mL/h, 1500 mL/h, 2000 mL/h, 2500 mL/h, 3000 mL/h, 3500 mL/h, 4000 mL/h, 4500 mL/h, 5000 mL/h, 5500 mL/h, 6000 mL/h, 6500 mL/h, 7000 mL/h, 7500 mL/h, 8000 mL/h, 8500 mL/h, 9000 mL/h, 9500 mL/h, or 10000 mL/h.

According to one embodiment, the feed rate of solution B is at least 1 mL/h, 1.5 mL/h, 2.5 mL/h, 3 mL/h, 3.5 mL/h, 4 mL/h, 4.5 mL/h, 5 mL/h, 5.5 mL/h, 6 mL/h, 6.5 mL/h, 7 mL/h, 7.5 mL/h, 8 mL/h, 8.5 mL/h, 9 mL/h, 9.5 mL/h, 10 mL/h, 10.5 mL/h, 11 mL/h, 11.5 mL/h, 12 mL/h, 12.5 mL/h, 13 mL/h, 13.5 mL/h, 14 mL/h, 14.5 mL/h, 15 mL/h, 15.5 mL/h, 16 mL/h, 16.5 mL/h, 17 mL/h, 17.5 mL/h, 18 mL/h, 18.5 mL/h, 19 mL/h, 19.5 mL/h, 20 mL/h, 20.5 mL/h, 21 mL/h, 21.5 mL/h, 22 mL/h, 22.5 mL/h, 23 mL/h, 23.5 mL/h, 24 mL/h, 24.5 mL/h, 25 mL/h, 25.5 mL/h, 26 mL/h, 26.5 mL/h, 27 mL/h, 27.5 mL/h, 28 mL/h, 28.5 mL/h, 29 mL/h, 29.5 mL/h, 30 mL/h, 30.5 mL/h, 31 mL/h, 31.5 mL/h, 32 mL/h, 32.5 mL/h, 33 mL/h, 33.5 mL/h, 34 mL/h, 34.5 mL/h, 35 mL/h, 35.5 mL/h, 36 mL/h, 36.5 mL/h, 37 mL/h, 37.5 mL/h, 38 mL/h, 38.5 mL/h, 39 mL/h, 39.5 mL/h, 40 mL/h, 40.5 mL/h, 41 mL/h, 41.5 mL/h, 42 mL/h, 42.5 mL/h, 43 mL/h, 43.5 mL/h, 44 mL/h, 44.5 mL/h, 45 mL/h, 45.5 mL/h, 46 mL/h, 46.5 mL/h, 47 mL/h, 47.5 mL/h, 48 mL/h, 48.5 mL/h, 49 mL/h, 49.5 mL/h, 50 mL/h, 50.5 mL/h, 51 mL/h, 51.5 mL/h, 52 mL/h, 52.5 mL/h, 53 mL/h, 53.5 mL/h, 54 mL/h, 54.5 mL/h, 55 mL/h, 55.5 mL/h, 56 mL/h, 56.5 mL/h, 57 mL/h, 57.5 mL/h, 58 mL/h, 58.5 mL/h, 59 mL/h, 59.5 mL/h, 60 mL/h, 60.5 mL/h, 61 mL/h, 61.5 mL/h, 62 mL/h, 62.5 mL/h, 63 mL/h, 63.5 mL/h, 64 mL/h, 64.5 mL/h, 65 mL/h, 65.5 mL/h, 66 mL/h, 66.5 mL/h, 67 mL/h, 67.5 mL/h, 68 mL/h, 68.5 mL/h, 69 mL/h, 69.5 mL/h, 70 mL/h, 70.5 mL/h, 71 mL/h, 71.5 mL/h, 72 mL/h, 72.5 mL/h, 73 mL/h, 73.5 mL/h, 74 mL/h, 74.5 mL/h, 75 mL/h, 75.5 mL/h, 76 mL/h, 76.5 mL/h, 77 mL/h, 77.5 mL/h, 78 mL/h, 78.5 mL/h, 79 mL/h, 79.5 mL/h, 80 mL/h, 80.5 mL/h, 81 mL/h, 81.5 mL/h, 82 mL/h, 82.5 mL/h, 83 mL/h, 83.5 mL/h, 84 mL/h, 84.5 mL/h, 85 mL/h, 85.5 mL/h, 86 mL/h, 86.5 mL/h, 87 mL/h, 87.5 mL/h, 88 mL/h, 88.5 mL/h, 89 mL/h, 89.5 mL/h, 90 mL/h, 90.5 mL/h, 91 mL/h, 91.5 mL/h, 92 mL/h, 92.5 mL/h, 93 mL/h, 93.5 mL/h, 94 mL/h, 94.5 mL/h, 95 mL/h, 95.5 mL/h, 96 mL/h, 96.5 mL/h, 97 mL/h, 97.5 mL/h, 98 mL/h, 98.5 mL/h, 99 mL/h, 99.5 mL/h, 100 mL/h, 200 mL/h, 250 mL/h, 300 mL/h, 350 mL/h, 400 mL/h, 450 mL/h, 500 mL/h, 550 mL/h, 600 mL/h, 650 mL/h, 700 mL/h, 750 mL/h, 800 mL/h, 850 mL/h, 900 mL/h, 950 mL/h, 1000 mL/h, 1500 mL/h, 2000 mL/h, 2500 mL/h, 3000 mL/h, 3500 mL/h, 4000 mL/h, 4500 mL/h, 5000 mL/h, 5500 mL/h, 6000 mL/h, 6500 mL/h, 7000 mL/h, 7500 mL/h, 8000 mL/h, 8500 mL/h, 9000 mL/h, 9500 mL/h, or 10000 mL/h.

According to one embodiment, the gas supplies (411, 412) provide the same gas inlet pressure.

According to one embodiment, the gas supplies (411, 412) provide different gas inlet pressures.

According to one embodiment, the gas supplies (411, 412) provide the same gas flow rate.

According to one embodiment, the gas supplies (411, 412) provide different gas flow rates.

According to one embodiment, the device 4 further comprises valves 413 controlling the gas flow provided by each gas supplies (411, 412).

According to one embodiment, the device 4 further comprises a plurality of valves. In this embodiment, the valves may be positioned at any point of the device 4.

Figure 8:
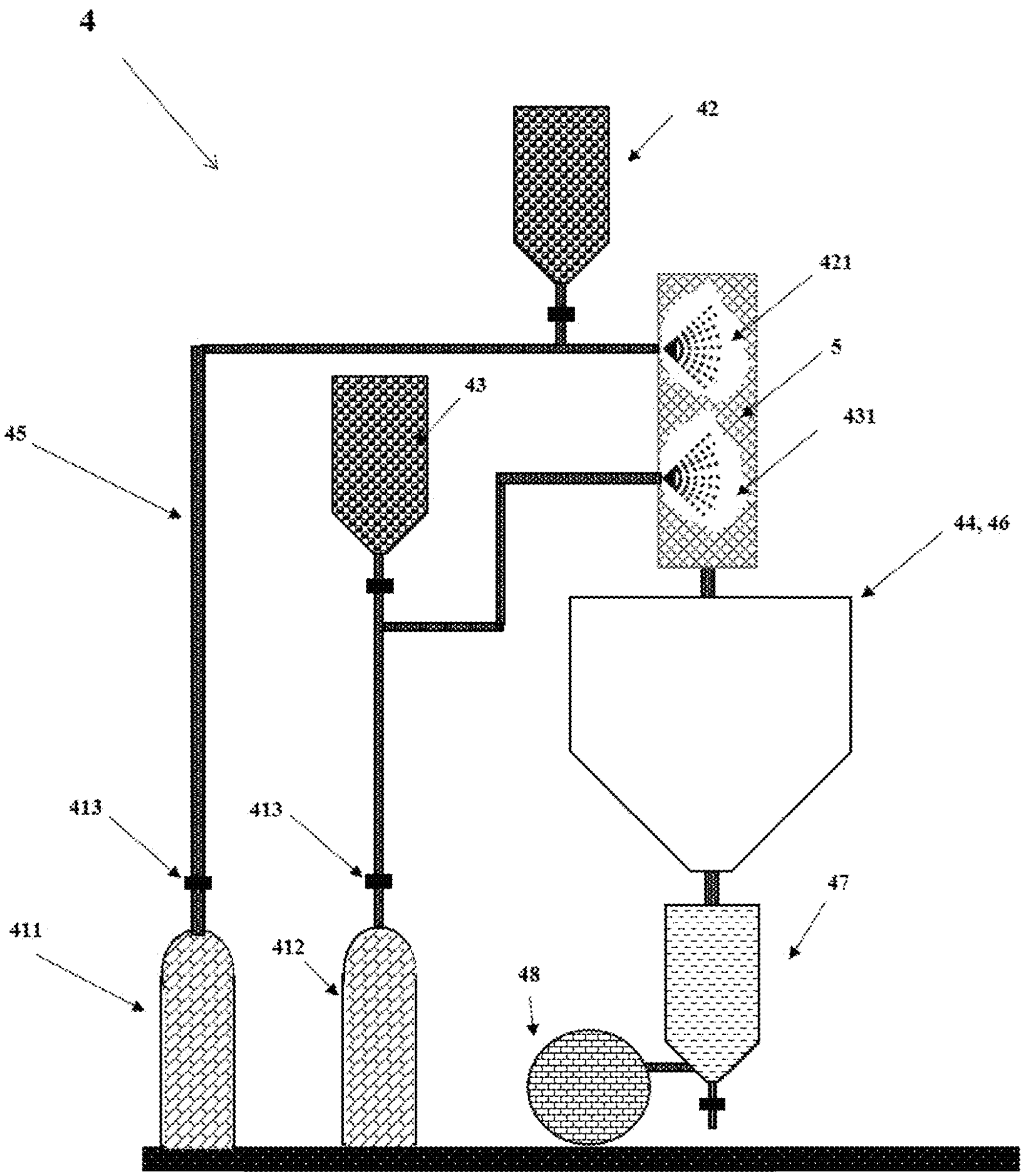
FIG. 8 illustrates an industrial device 4 for implementing the method of the invention comprising two gas supplies (411, 412); two valves 413; a first means for forming droplets of a first solution 42; a second means for forming droplets of a second solution 43; two resulting sprays of droplets (421, 431); a mixing chamber 5; means for heating the droplets to obtain at least one particle 44; means for cooling the at least one particle 46; means for separating and collecting the at least one particle 47; a pumping device 48; and connecting means 45.

According to one embodiment, as illustrated in FIG. 8, the first means for forming droplets 42 produces a first spray of droplets 421, and the second means for forming droplets 43 produces a second spray of droplets 431.

According to one embodiment, as illustrated in FIG. 8, the device 4 further comprises at least one mixing chamber 5 wherein the droplets of solution A and solution B are mixed.

According to one embodiment, the droplets of solution A and solution B are homogeneously mixed.

According to one embodiment, the droplets of solution A and solution B do not homogeneously mix, particularly if solution A and solution B are not miscible.

According to one embodiment, the droplets of solution A and solution B are mixed but the resulting sprays do not collide with each other in the at least one mixing chamber 5.

According to one embodiment, as illustrated in FIG. 9C-D, the device 4 further comprises a container 49 comprising a solution capable of producing reactive vapors.

According to one embodiment, the device 4 further comprises a container 49 comprising a solution capable of releasing gas.

According to one embodiment, the optional means for forming reactive vapors of a third solution is a container 49.

According to one embodiment, the optional means for releasing gas is a container 49.

According to one embodiment, the device 4 further comprises a container 49 comprising a solution capable of producing reactive vapors, in addition to the means for forming droplets (42, 43).

According to one embodiment, the device 4 further comprises a container 49 comprising a solution capable of releasing gas, in addition to the means for forming droplets (42, 43).

According to one embodiment, the reactive vapors react with at least one precursor comprised in solution A or solution B.

According to one embodiment, examples for the released gas include but are not limited to air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the released gas reacts with at least one precursor comprised in solution A or solution B.

According to one embodiment, one of the means for forming droplets (42, 43) comprises a container 49 comprising a solution capable of producing reactive vapors. In this embodiment, said means for forming droplets (42, 43) do not form droplets but uses the reactive vapors comprised in the container 49.

According to one embodiment, one of the means for forming droplets (42, 43) comprises a container 49 comprising a gas. In this embodiment, said means for forming droplets (42, 43) do not form droplets but releases a gas from the container 49.

According to one embodiment, the means for forming droplets (42, 43) is included in a set-up of spray-drying or spray-pyrolysis.

According to one embodiment, the means for forming droplets (42, 43) and reactive vapors 49 are included in a set-up of spray-drying or spray-pyrolysis.

According to one embodiment, the means for forming droplets (42, 43) and releasing gas are included in a set-up of spray-drying or spray-pyrolysis.

According to one embodiment, the means for forming droplets (42, 43) is a droplets former.

According to one embodiment, the means for forming droplets (42, 43) is configured to produce droplets as described hereabove.

According to one embodiment, the means for forming droplets (42, 43) comprises an atomizer.

According to one embodiment, the means for forming droplets (42, 43) is spray-drying or spray-pyrolysis.

According to one embodiment, the means for forming droplets (42, 43) comprises an ultrasound dispenser, or a drop by drop delivering system using gravity, centrifuge force or static electricity.

According to one embodiment, the means for forming droplets (42, 43) comprises a tube or a cylinder.

According to one embodiment, illustrated in FIG. 9A, the means for forming droplets (42, 43) are located and are working in a series.

According to one embodiment, illustrated in FIG. 9B, the means for forming droplets (42, 43) are located and are working in parallel.

According to one embodiment, the means for forming droplets (42, 43) do not face each other.

According to one embodiment, the means for forming droplets (42, 43) are not arranged coaxially oppositely.

According to one embodiment, the means for forming droplets (42, 43) and/or the means for forming reactive vapors 49 are arranged to form an angle $\alpha$.

According to one embodiment, the angle $\alpha$ separating the means for forming droplets (42, 43) and/or the means for forming reactive vapors 49 is at least 0°, 5°, 10°, 15°, 20°, 25°, 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145°, 150°, 155°, 160°, 165°, 170°, 175°, or 180°.

According to one embodiment, the droplets of solution A and solution B are simultaneously formed.

According to one embodiment, the droplets of solution A are formed prior to the formation of droplets of solution B.

According to one embodiment, the droplets of solution A are formed prior to or after the formation of droplets of solution B.

According to one embodiment, the droplets of solution B are formed prior to the formation of droplets of solution A.

According to one embodiment, the droplets of solution A and the droplets of solution B are dispersed in a gas flow in the same connecting means 45.

According to one embodiment, the droplets of solution A and the droplets of solution B are dispersed in a gas flow in two distinct connecting means 45.

According to one embodiment, illustrated in FIG. 9C, the first means for forming droplets 42 of a first solution and the container 49 comprising a solution capable of producing reactive vapors are working in series.

According to one embodiment, illustrated in FIG. 9D, the first means for forming droplets 42 of a first solution and the container 49 comprising a solution capable of producing reactive vapors are working in parallel.

Figure 10:
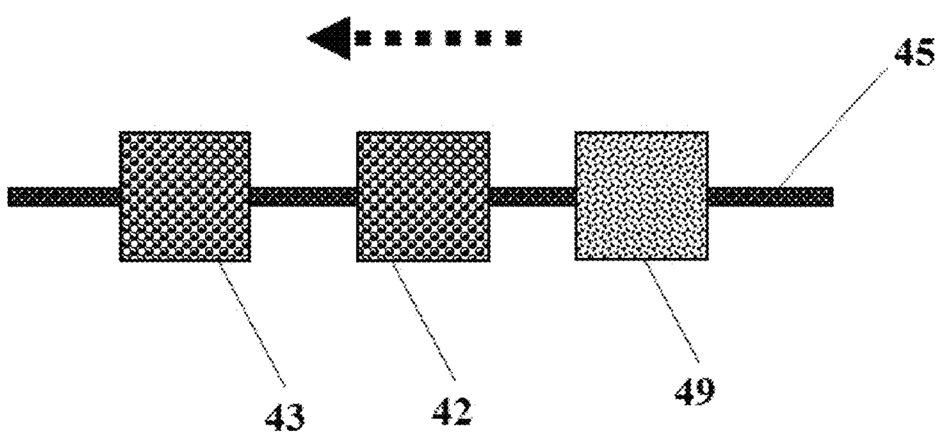
FIG. 10 illustrates a first means for forming droplets 42 of a first solution, a second means for forming droplets 43 of a second solution and a container 49 comprising a solution capable of producing reactive vapors working in serie.

According to one embodiment, illustrated in FIG. 10, the first means for forming droplets 42 of a first solution, the second means for forming droplets 43 of a second solution and the container 49 comprising a third solution capable of producing reactive vapors are working in serie.

According to one embodiment, the first means for forming droplets 42 of a first solution, the second means for forming droplets 43 of a second solution and the container 49 comprising a third solution capable of producing reactive vapors are working in parallel.

According to one embodiment, the first means for forming droplets 42 of a first solution and the container 49 comprising a solution capable of releasing gas are working in series.

According to one embodiment, the first means for forming droplets 42 of a first solution and the container 49 comprising a solution capable of releasing gas are working in parallel.

According to one embodiment, the first means for forming droplets 42 of a first solution, the container 49 comprising a third solution capable of producing reactive vapors and the container comprising a solution capable of releasing gas are working in series.

According to one embodiment, the first means for forming droplets 42 of a first solution, the container 49 comprising a third solution capable of producing reactive vapors and the container comprising a solution capable of releasing gas are working in parallel.

According to one embodiment, the means for forming droplets (42, 43) is a tube or a cylinder.

According to one embodiment, the means for forming droplets (42, 43) comprises a tube for the inlet gas, a tube for pushing up the liquid, a mixing chamber and an impacting surface where the droplets are formed.

According to one embodiment, the container 49 is screwed on the device 4.

According to one embodiment, the container 49 is clipped on the device 4.

According to one embodiment, the upper part of the container 49 is adapted to produce and/or release reactive vapors into the set-up.

According to one embodiment, the device 4 is configured to resist to acidic pH.

According to one embodiment, the device 4 is configured to resist to basic pH.

According to one embodiment, the device 4 is configured to resist to the organic solvent as described hereabove.

According to one embodiment, the gas is as described hereabove.

According to one embodiment, the gas flow rate is as described hereabove.

According to one embodiment, the gas pressure is as described hereabove.

According to one embodiment, the means for heating the droplets 44 is a heating system.

According to one embodiment, the means for heating the droplets 44 is a flame, a tubular furnace, a heat gun or any other means known by those skilled in the art.

According to one embodiment, the droplets are heated by convection as heat transfer.

According to one embodiment, the droplets are heated by infra-red radiation.

According to one embodiment, the droplets are heated by micro-waves.

According to one embodiment, the means for cooling 46 the at least one particle 1 is a cooling system.

According to one embodiment, the means for cooling 46 the at least one particle 1 has a temperature inferior to the heating temperature.

According to one embodiment, the means for cooling 46 comprises a refrigerant fluid known by the skilled artisan, said fluid circulating outside of the tube, wherein the temperature of said fluid is inferior to the heating temperature.

According to one embodiment, the means for cooling 46 comprises gas such as for example air, nitrogen, argon, dioxygen, helium, carbon dioxide, $N_2O$ or a mixture thereof, wherein the temperature of said gas is inferior to the heating temperature.

According to one embodiment, the means for separating and collecting 47 the at least one particle 1 is a separator-collector of particles.

According to one embodiment, the means for separating and collecting 47 the at least one particle 1 is using a unique membrane filter with a pore size ranging from 1 nm to 300 μm, at least two successive membrane filters with different pore sizes ranging from 1 nm to 300 μm, a sonicator, an electrostatic precipitator, a sonic or gravitational dust collector, or any other means known by those skilled in the art.

According to one embodiment, the membrane filter includes but is not limited to: hydrophobic polytetrafluoroethylene, hydrophilic polytetrafluoroethylene, polyethersulfone, nylon, cellulose, glass fibers, polycarbonate, polypropylene, polyvinyl chloride, polyvinylidene fluoride, silver, polyolefin, polypropylene prefilter, or a mixture thereof.

According to one embodiment, the droplets are separated depending on their size after the step (c), after the step (d), or after the step (e), allowing to select the mean size of the resulting particles 1.

According to one embodiment, the means for separating and collecting 47 the at least one particle 1 comprises temperature induced separation, magnetic induced separation, electrostatic induced separation or cyclonic separation.

According to one embodiment, the means for separating and collecting 47 the at least one particle 1 comprises a system to limit the temperature induced separation or the thermophoresis.

According to one embodiment, the means for separating and collecting 47 the at least one particle 1 is preceded by a system allowing to limit the temperature induced separation or the thermophoresis.

According to one embodiment, the means for separating and collecting 47 the at least one particle 1 comprises a system allowing the said particle 1 to stick on the inner wall of a curved tube.

According to one embodiment, the system allowing to limit the temperature induced separation or the thermophoresis comprises a flux of a cold gas surrounding the warmer gas comprising the at least one particle 1 at the exit of the heating means 44 in the tube 441. Said cold gas has a temperature inferior to the temperature of the heating means 44. In this embodiment, the particles 1 do not stick to the surface of said tube, allowing an enhanced collection of said particle onto the means for collecting said particles by limiting thermophoresis.

According to one embodiment, the flux of cold gas is laminar.

According to one embodiment, the flux of cold gas is turbulent.

According to one embodiment, the flux of cold gas is unsteady.

According to one embodiment, the cold gas is air, nitrogen, argon, dioxygen, helium, carbon dioxide or a mixture thereof.

According to one embodiment, the pumping device 48 is a mechanical pumping device such as for example a gear pump, a scroll pump, a rotary vane pump, a screw pump, a piston pump, a peristaltic pump, or a turbomolecular pump.

According to one embodiment, the connecting means 45 is at least one tube, cannula, pipe or conduit.

While various embodiments have been described and illustrated, the detailed description is not to be construed as being limited hereto. Various modifications can be made to the embodiments by those skilled in the art without departing from the true spirit and scope of the disclosure as defined by the claims.

EXAMPLES

The present invention is further illustrated by the following examples.

Example 1: Inorganic Nanoparticles Preparation

Nanoparticles used in the examples herein were prepared according to methods of the art (Lhuillier E. et al., Acc. Chem. Res., 2015, 48 (1), pp 22-30; Pedetti S. et al., J. Am. Chem. Soc., 2014, 136 (46), pp 16430-16438; Ithurria S. et al., J. Am. Chem. Soc., 2008, 130, 16504-16505; Nasilowski M. et al., Chem. Rev. 2016, 116, 10934-10982).

Nanoparticles used in the examples herein were selected in the group comprising CdSe/CdZnS, CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots.

Example 2: Exchange Ligands for Phase Transfer in Basic Aqueous Solution

100 μL of CdSe/CdZnS nanoplatelets suspended in heptane were mixed with 3-mercaptopropionic acid and heated at 60° C. for several hours. The nanoparticles were then precipitated by centrifugation and redispersed in dimethylformamide. Potassium tert-butoxide were added to the solution before adding ethanol and centrifugate. The final colloidal nanoparticles were redispersed in water.

Example 3: Exchange Ligands for Phase Transfer in Acidic Aqueous Solution

100 μL of CdSe/CdZnS nanoplatelets suspended in a basic aqueous solution were mixed with ethanol and centrifugated. A PEG-based polymer was solubilized in water and added to the precipitated nanoplatelets. Acetic acid was dissolved in the colloidal suspension to control the acidic pH.

Example 4: Composite Particles Preparation from a Basic Aqueous Solution —CdSe/CdZnS@$SiO_2$ 100 μL of CdSe/CdZnS nanoplatelets suspended in a basic aqueous solution were mixed with a basic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

Figure 11:
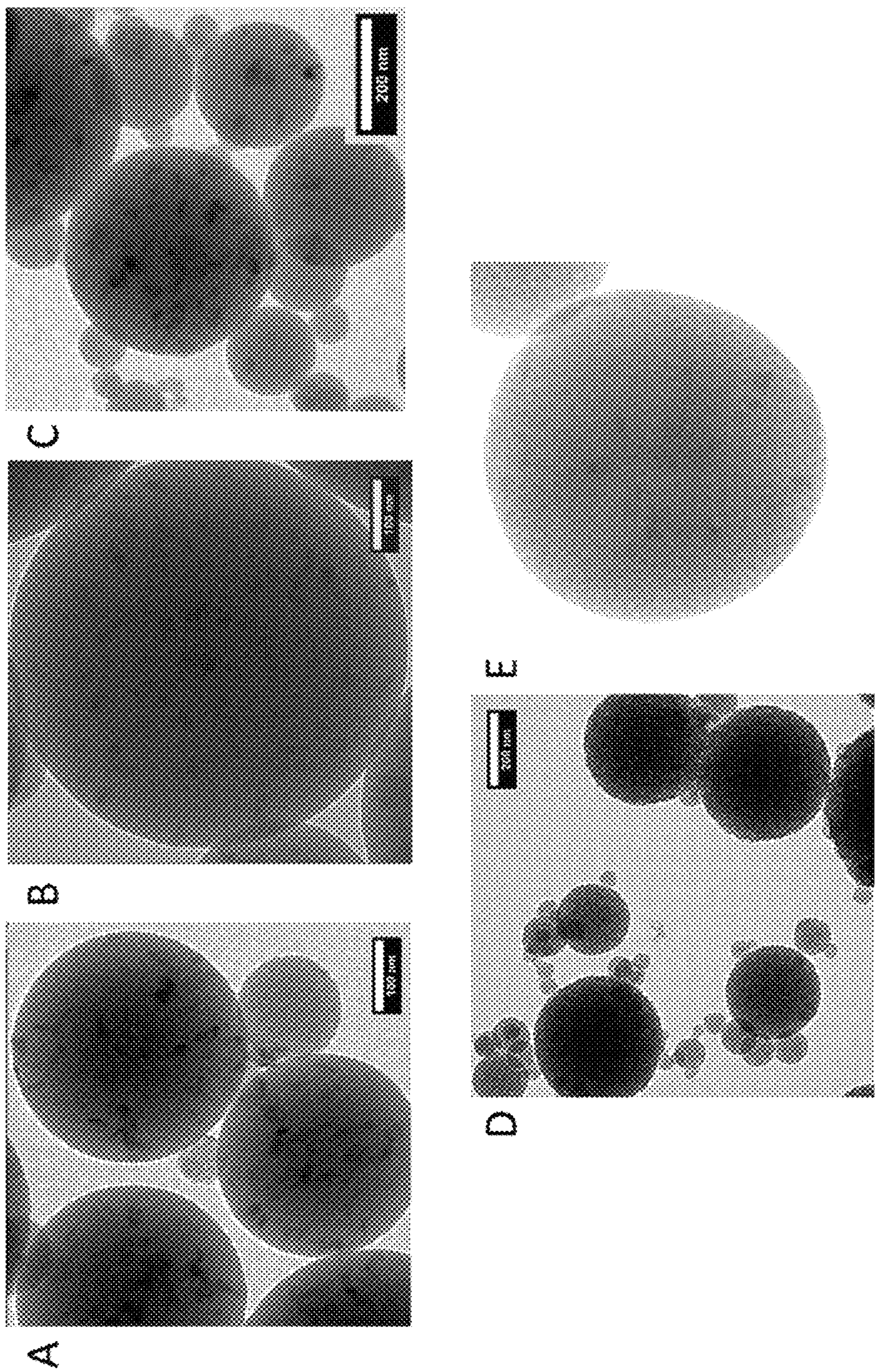
FIG. 11 is TEM images showing obtained particles 1 comprising nanoparticles (dark contrast) uniformly dispersed in an inorganic material (bright contrast).

FIG. 11 A-B show TEM images of the resulting particles.

Figure 14:
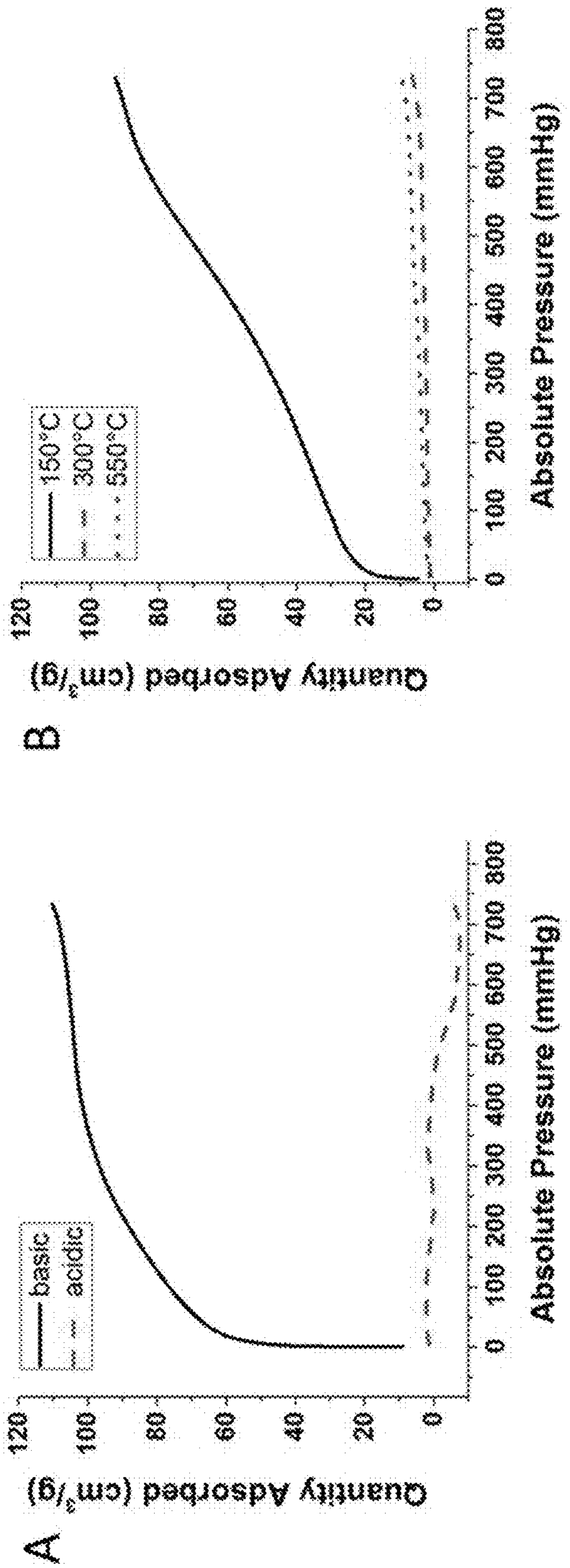
FIG. 14 shows the $N_2$ adsorption isotherm of composite particles 1.

FIG. 14 A shows the $N_2$ adsorption isotherm of the resulting particles. Said resulting particles are porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 5: Composite Particles Preparation from an Acidic Aqueous Solution —CdSe/CdZnS@$SiO_2$ 100 μL of CdSe/CdZnS nanoplatelets suspended in an acidic aqueous solution were mixed with an acidic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

FIG. 14 A shows the $N_2$ adsorption isotherm of the resulting particles. Said resulting particles are not porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 6: Composite particles preparation from a basic aqueous solution with hetero-elements —CdSe/CdZnS@$Si_xCd_yZn_zO_w$ 100 μL of CdSe/CdZnS nanoplatelets suspended in an acidic aqueous solution were mixed with an acidic aqueous solution of TEOS at 0.13M previously hydrolyzed for 24 hours in presence of cadmium acetate at 0.01 M and zinc oxide at 0.01 M, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 7: Composite Particles Preparation from an Organic Solution and an Aqueous Solution —CdSe/CdZnS@$Al_2O_3$ 100 μL of CdSe/CdZnS nanoplatelets suspended in heptane were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The composite particles were collected at the surface of a filter.

FIG. 11 C shows TEM images of the resulting particles.

FIG. 14 B show $N_2$ adsorption isotherms for particles obtained after heating the droplets at 150° C., 300° C. and 550° C. Increasing the heating temperature results in a loss of the porosity. Thus particles obtained by heating at 150° C. are porous, whereas the particles obtained by heating at 300° C. and 550° C. are not porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnTe, $SiO_2$, $TiO_2$, $HfO_2$, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 8: Composite Particles Preparation from an Organic Solution and an Aqueous Solution —InP/ZnS@$Al_2O_3$ 4 mL of InP/ZnS nanoparticles suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

The same procedure was carried out by replacing InP/ZnS nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

Reaction temperature of the above procedure is adapted according to the inorganic material chosen.

Example 9: Composite Particles Preparation from an Organic Solution and an Aqueous Solution —$CH_5N_2$—$PbBr_3$@$Al_2O_3$ 100 μL of $CH_5N_2$—$PbBr_3$ nanoparticles suspended in hexane were mixed with aluminium tri-sec butoxide and 5 mL of hexane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

Reaction temperature of the above procedure is adapted according to the inorganic material chosen.

Example 10: Composite Particles Preparation from an Organic Solution and an Aqueous Solution —CdSe/CdZnS—Au@$SiO_2$ On one side, 100 μL of gold nanoparticles and 100 μL of CdSe/CdZnS nanoplatelets suspended in an acidic aqueous solution were mixed with an acidic aqueous solution of TEOS at 0.13M previously hydrolyzed for 24 hours, then loaded in a spray-drying set-up. The suspension was sprayed towards a tube furnace heated at a temperature ranging from the boiling point of the solvent to 1000° C. with a nitrogen flow. The composite particles were collected at the surface of a GaN substrate. The GaN substrate with the deposited composite particles was then cut into pieces of 1 mm×1 mm and electrically connected to get a LED emitting a mixture of the blue light and the light emitted by the fluorescent nanoparticles.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ with $Al_2O_3$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 11: Composite Particles Preparation from an Organic Solution and an Aqueous Solution —$Fe_3O_4$@$Al_2O_3$—CdSe/CdZnS@$SiO_2$ On one side, 100 μL of $Fe_3O_4$ nanoparticles suspended in an acidic aqueous solution were mixed with an acidic aqueous solution of TEOS at 0.13M previously hydrolyzed for 24 hours. On another side, 100 μL of CdSe/CdZnS nanoplatelets suspended in heptane were mixed with aluminium tri-sec butoxide and 5 mL of heptane, then loaded on the same spray-drying set-up, but at a different location than the first aqueous solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter. The composite particles comprise a core of silica containing $Fe_3O_4$ nanoparticles and a shell of alumina containing CdSe/CdZnS nanoplatelets.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with $TiO_2$, $SiO_2$, $Al_2O_3$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 12: Composite Particles Preparation from an Organic Solution and an Aqueous Solution —CdS/ZnS Nanoplatelets@$Al_2O_3$ 4 mL of CdS/ZnS nanoplatelets suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

The same procedure was carried out by replacing CdS/ZnS nanoplatelets with CdSe, CdS, CdTe, CdSe/CdS, CdSe/ZnS, CdSe/CdZnS, CdS/CdZnS, CdTe/ZnS, CdSe/CdZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 13: Composite Particles Preparation from an Organic Solution and an Aqueous Solution —InP/ZnS@$SiO_2$ 4 mL of InP/ZnS nanoparticles suspended in an acidic aqueous solution were mixed with an acidic aqueous solution of TEOS at 0.13M previously hydrolyzed for 24 hours, then loaded in a spray-drying set-up. The suspension was sprayed for forming droplets towards a tube furnace heated a temperature ranging from the boiling point of the solvent to 1000° C. with a nitrogen flow. The composite particles were collected at the surface of a filter.

The same procedure was carried out by replacing InP/ZnS nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, CdSe/CdZnS, InP/CdS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ with $Al_2O_3$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 14: Particles Preparation from an Organic Solution and an Aqueous Solution, Followed by a Treatment of Ammonia Vapors —CdSe/CdZnS@ZnO 100 µL of CdSe/CdZnS nanoplatelets suspended in heptane were mixed with zinc methoxyethoxide and 5 mL of pentane, then loaded on a spray-drying set-up as described in the invention. On another side, a basic aqueous solution was prepared and loaded on the same spray-drying set-up, but at a different location than the first heptane solution. On another side, an ammonium hydroxide solution was loaded on the same spray-drying system, between the tube furnace and the filter. The two first liquids were sprayed while the third one was heated at 35° C. by an external heating system to produce ammonia vapors, simultaneously towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnO with $SiO_2$, $TiO_2$, $HfO_2$, $Al_2O_3$, ZnTe, ZnSe, ZnS or MgO, or a mixture thereof. Reaction temperature of the above procedure is adapted according to the inorganic material chosen.

The same procedure was carried out by replacing ZnO with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

Reaction temperature of the above procedure is adapted according to the inorganic material chosen.

Example 15: Particles Preparation from an Organic Solution and an Aqueous Solution, Followed by an Extra Shell Coating —CdSe/CdZnS@$Al_2O_3$@MgO 100 μL of CdSe/CdZnS nanoplatelets suspended in heptane were mixed with zinc methoxyethoxide and 5 mL of pentane, then loaded on a spray-drying set-up as described in the invention. On another side, a basic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were directed towards a tube where an extra MgO shell was coated at the surface of the particles by an ALD process, said particles being suspended in the gas. The particles were finally collected on the inner wall of the tube where the ALD was performed.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 16: Particles Preparation from an Organic Solution and an Aqueous Solution —CdSe/CdZnS—$Fe_3O_4$@$SiO_2$ On one side, 100 μL of $Fe_3O_4$ nanoparticles and 100 μL of CdSe/CdZnS nanoplatelets suspended in an acidic aqueous solution were mixed with an acidic aqueous solution of TEOS at 0.13M previously hydrolyzed for 24 hours, then loaded in a spray-drying set-up as described in the invention. On another side, an acidic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 17: Core/Shell Particles Preparation from an Organic Solution and an Aqueous Solution —Au@$Al_2O_3$ in the Core and CdSe/CdZnS@$SiO_2$ in the Shell On one side, 100 μL of CdSe/CdZnS nanoplatelets suspended in an acidic aqueous solution were mixed with an acidic aqueous solution of TEOS at 0.13M previously hydrolyzed for 24 hours, then loaded on a spray-drying set-up as described in the invention. On another side, 100 μL of Au nanoparticles suspended in heptane were mixed with aluminium tri-sec butoxide and 5 mL of heptane, then loaded on the same spray-drying set-up, but at a different location than the first aqueous solution. The two liquids were sprayed simultaneously towards a tube furnace heated at a temperature ranging from the boiling point of the solvent to 1000° C. with a nitrogen flow. The particles were collected at the surface of a filter. The particles comprise a core of alumina containing gold nanoparticles and a shell of silica containing CdSe/CdZnS nanoplatelets.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/

CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 18: Composite Particles Preparation—Phosphor Nanoparticles@$SiO_2$

Phosphor nanoparticles were suspended in a basic aqueous solution were mixed with a basic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, ($(Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 19: Composite Particles Preparation—Phosphor Nanoparticles@$Al_2O_3$

Phosphor nanoparticles were suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, ($(Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 20: Composite Particles Preparation—CdSe/CdZnS@$HfO_2$

100 μL of CdSe/CdZnS nanoplatelets suspended in heptane (10 mg/mL) were mixed with Hafnium n-butoxide and 5 mL of pentane, then loaded on a spray-drying set-up. On another side, a basic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. Composite particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 21: Composite Particles Preparation—Phosphor Nanoparticles@$HfO_2$

1 μm of phosphor nanoparticles (cf. list below) suspended in heptane (10 mg/mL) were mixed with hafnium n-butoxide and 5 mL of pentane, then loaded on a spray-drying set-up. On another side, an aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles@$HfO_2$ were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, ($(Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 22: Composite Particles Preparation from an Organometallic Precursor

100 μL of CdSe/CdZnS nanoplatelets suspended in heptane were mixed with an organometallic precursor selected in the group below in pentane under controlled atmosphere, then loaded on a spray-drying set-up. On another side, an aqueous solution was prepared and loaded on the same spray-drying set-up, but at a different location than the first heptane solution. The two liquids were sprayed simultaneously towards a tube furnace heated from room temperature to 300° C. with a nitrogen flow. The composite particles were collected at the surface of a filter.

The procedure was carried out with an organometallic precursor selected in the group comprising: $Al[N(SiMe_3)_2]_3$, trimethyl aluminium, triisobutylaluminum, trioctylaluminum, triphenylaluminum, dimethyl aluminium, trimethyl zinc, dimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), $Hf[C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[(CH_2CH_3)_2N]_4Hf$, $[(CH_3)_2N]_4Hf$, $[(CH_3)_2N]_4Hf$, $[(CH_3)$ $(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_8H_{15}O_2)_4$, $Zr(OCC(CH_3)_3CHCOC(CH_3)_3)_4$, $Mg(C_5H_5)_2$, or $C_{20}H_{30}Mg$. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnO, $TiO_2$, MgO, $HfO_2$ or $ZrO_2$, or a mixture thereof.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 23: Composite Particles Preparation from an Organometallic Precursor —CdSe/CdZnS@ZnTe 100 μL of CdSe/CdZnS nanoplatelets suspended in heptane were mixed with two organometallic precursors selected in the group below in pentane under inert atmosphere then loaded on a spray-drying set-up. The suspension was sprayed towards a tube furnace heated from RT to 300° C. with a nitrogen flow. The composite particles were collected at the surface of a filter.

The procedure was carried out by with a first organometallic precursor selected in the group comprising: dimethyl telluride, diethyl telluride, diisopropyl telluride, di-t-butyl telluride, diallyl telluride, methyl allyl telluride, dimethyl selenide, or dimethyl sulfur. Reaction temperature of the above procedure is adapted according to the organometallic precursor chosen.

The procedure was carried out by with a second organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, or $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnTe with ZnS or ZnSe, or a mixture thereof.

The same procedure was carried out by replacing ZnTe with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

Example 24: Composite Particles Preparation from an Organometallic Precursor —CdSe/CdZnS@ZnS 100 μL of CdSe/CdZnS nanoplatelets suspended in heptane were mixed with an organometallic precursor selected in the group below in pentane under inert atmosphere, then loaded on a spray-drying set-up. On another side, a vapor source of $H_2S$ was inserted in the same spray-drying set-up. The suspension was sprayed towards a tube furnace heated from RT to 300° C. with a nitrogen flow. The composite particles were collected at the surface of a filter.

The procedure was carried out with an organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate). Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/

GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnS with ZnSe or ZnTe, or a mixture thereof.

The same procedure was carried out by replacing ZnS with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing $H_2S$ with $H_2Se$, $H_2Te$ or other gas.

Example 25: InP/ZnS@$SiO_2$ Prepared by Reverse Microemulsion Method Vs InP/ZnS@$SiO_2$ Prepared by the Method of the Invention InP/ZnS@$SiO_2$ prepared by reverse microemulsion: InP/ZnS core/shell quantum dots (70 mg) were mixed with 0.1 mL of (3-(trimethoxysilyl)propyl methacrylate (TMOPMA), followed by 0.5 mL of triethylorthosilicate (TEOS) to form a clear solution, which was kept for incubation under $N_2$ overnight. The mixture was then injected into 10 mL of a reverse microemulsion (cyclohexane/CO-520, 18 ml/1.35 g) in 50 mL flask, under stirring at 600 rpm. The mixture was stirred for 15 mins and then 0.1 mL of 4% $NH_4OH$ was injected to start the bead forming reaction. The reaction was stopped the next day and the reaction solution was centrifuged to collect the solid phase. The obtained particles were washed twice with 20 mL cyclohexane and then dried under vacuum.

Figure 13:
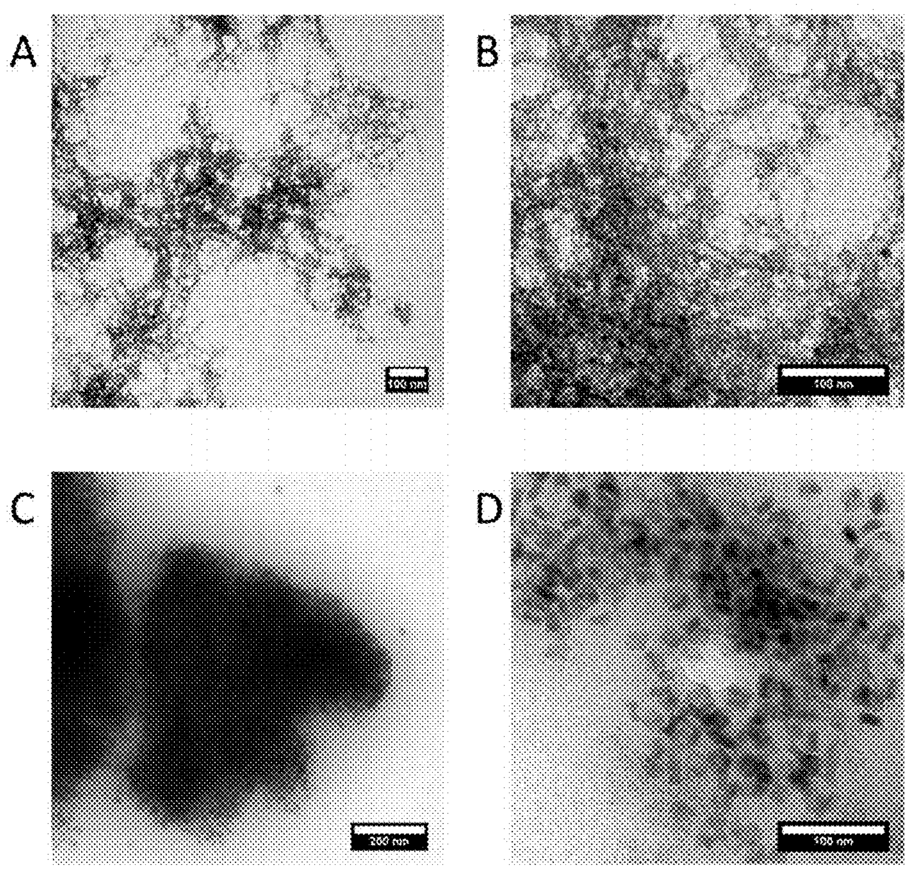
FIG. 13 is a set of 4 transmission electron microscopy (TEM) images.

FIG. 13A-B show TEM picture of InP/ZnS@$SiO_2$ prepared by reverse microemulsion. It is clear from the TEM pictures that nanoparticles encapsulated in an inorganic material via reverse microemulsion method cannot be and are not uniformly dispersed in said inorganic material.

FIG. 13A-B also show that the reverse microemulsion method does not lead to discrete particles but to a matrix of inorganic material.

Example 26: CdSe/CdS/ZnS@$SiO_2$ Prepared by Method of Prior Art Vs CdSe/CdS/ZnS @$SiO_2$ Prepared by the Method of the Invention 0.6 mL of a suspension comprising CdSe/CdS/ZnS nanoplatelets having an emission wavelength at 694 nm and 6.2 mL of a perhydropolysilazane solution (solution of 18.6% by weight of dibutylether) were mixed in a beaker to prepare a mixed solution. Thereafter, the mixed solution was poured into a Teflon-coated container and naturally dried at room temperature for 24 hours while light was blocked out. The dried cured product was gathered, pulverized into a powder using a mortar and a pestle, and then dried at 60° C. for 7 hours and 30 minutes in an oven.

FIG. 13C-D show TEM picture of CdSe/CdS/ZnS@$SiO_2$ prepared the method hereabove. It is clear from the TEM pictures that nanoparticles encapsulated in an inorganic material via said method cannot be and are not uniformly dispersed in said inorganic material.

FIG. 13C-D also show that said method does not lead to discrete particles but to a matrix of inorganic material.

The invention claimed is:

1. A method for obtaining at least one particle comprising the following steps:

(a) preparing a solution A comprising at least one precursor of at least one element selected from the group constituted by silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, or chlorine, the at least one precursor of at least one element being the precursor of an inorganic material;

(b) preparing an aqueous solution B;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain the at least one particle;

(h) cooling of said at least one particle; and (i) separating and collecting said at least one particle;

wherein the aqueous solution may be acidic, neutral, or basic;

wherein at least one colloidal suspension comprising a plurality of nanoparticles is mixed with the solution A at step (a) and/or with the solution B at step (b); and wherein the nanoparticles are inorganic nanoparticles.

2. The method for obtaining at least one particle according to claim 1, wherein at least one precursor of at least one heteroelement selected from the group constituted by cadmium, sulfur, selenium, indium, tellurium, mercury, tin, copper, nitrogen, gallium, antimony, thallium, molybdenum, palladium, cerium, tungsten, cobalt, manganese, silicon, boron, phosphorus, germanium, arsenic, aluminium, iron, titanium, zirconium, nickel, zinc, calcium, sodium, barium, potassium, magnesium, lead, vanadium, silver, beryllium, iridium, scandium, niobium or tantalum is added to solution A at step (a) and/or to solution B at step (b).

3. The method according to claim 1, wherein the droplets are formed by spray-drying or spray-pyrolysis.

4. The method according to claim 1, wherein the droplets of solution A and solution B are simultaneously formed.

5. The method according to claim 1, wherein the droplets of solution A are formed prior to or after the formation of droplets of solution B.

6. The method according to claim 1, wherein the nanoparticles are semiconductor nanocrystals comprising a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

7. The method according to claim 6, wherein the semiconductor nanocrystals comprise at least one shell comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

8. The method according to claim 6, wherein the semiconductor nanocrystals comprise at least one crown comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

9. The method according to claim 6, wherein the semiconductor nanocrystals are semiconductor nanoplatelets.

* * * * *